(12) United States Patent
Nishio et al.

(10) Patent No.: US 9,785,733 B2
(45) Date of Patent: Oct. 10, 2017

(54) NON-TRANSITORY COMPUTER-READABLE RECORDING MEDIUM HAVING STORED THEREIN DESIGN PROGRAM, INFORMATION PROCESSING APPARATUS, AND COMPUTER-IMPLEMENTED METHOD FOR DESIGNING

(71) Applicant: FUJITSU LIMITED, Kawasaki-shi, Kanagawa (JP)

(72) Inventors: Yoshitaka Nishio, Yokosuka (JP); Kazunori Kumagai, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 114 days.

(21) Appl. No.: 14/918,641

(22) Filed: Oct. 21, 2015

(65) Prior Publication Data
US 2016/0154919 A1  Jun. 2, 2016

(30) Foreign Application Priority Data

Dec. 1, 2014 (JP) .................. 2014-242746

(51) Int. Cl.
*G06F 17/50* (2006.01)

(52) U.S. Cl.
CPC .............. *G06F 17/5068* (2013.01)

(58) Field of Classification Search
CPC ........................................ G06F 17/50
USPC ........................................ 716/137
See application file for complete search history.

(56) References Cited

U.S. PATENT DOCUMENTS

2011/0272395 A1* 11/2011 Moe .............. B23K 13/015
219/601

FOREIGN PATENT DOCUMENTS

| JP | H04-330569 | 11/1992 |
| JP | H09-259175 | 10/1997 |
| JP | H10-124544 | 5/1998 |
| JP | 2005-322946 | 11/2005 |

* cited by examiner

*Primary Examiner* — Thuan Do
(74) *Attorney, Agent, or Firm* — Fujitsu Patent Center

(57) ABSTRACT

A fillet at the connection between a round land and a connecting line by calculating a first point of contact (POC) between the connecting line and a first circle and a second POC between the round land and the first circle, the first circle being in contact with the round land and the connecting line; calculating a third POC between the round land and a second circle and a fourth POC between the connecting line and the second circle, the second circle being in contact with the round land and the connecting line at the opposite side of the first circle; and calculating the arc fillet defined as a region surrounded by a first arc between the first and second POCs, a second arc between the third and fourth POCs, a third arc between the fourth and first POCs, and a line segment between the second and third POCs.

18 Claims, 51 Drawing Sheets

NON-TRANSITORY COMPUTER-READABLE RECORDING MEDIUM HAVING STORED THEREIN DESIGN PROGRAM, INFORMATION PROCESSING APPARATUS, AND COMPUTER-IMPLEMENTED METHOD FOR DESIGNING

CROSS-REFERENCE TO RELATED APPLICATION

This application is based upon and claims the benefit of priority of the prior Japanese Application No. 2014-242746 filed on Dec. 1, 2014 in Japan, the entire contents of which are hereby incorporated by reference.

FIELD

The embodiment discussed herein is related to a recording medium having stored therein a design program, an information processing apparatus, and a method for designing.

BACKGROUND

The design of a commercial electronic device uses, for example, a Computer Aided Design system for designing the layout on a printed wiring board. For this purpose, arranging parts on the printed wiring board and wiring between the parts arranged on the printed wiring board are designed.

In cases where a through-hole via is used for arranging parts on the printed wiring board and for connecting layers, a line (wiring pattern) having a predetermined line width is formed between lands of through-holes. Here, a land is a round-shaped pattern formed around a via to place a lead of a part to be arranged or around a hole that connects layers.

In designing the wiring on the printed wiring board, a fillet process that forms a fillet 4 at the connection between a straight line 2 and a round land 3 on the print wiring board 1 is sometimes carried out to inhibit a via connecting conductor that enhances the reliability of connection from peeling off as illustrated in FIGS. 46-49. A fillet is also called a "teardrop". One of the known shapes of a fillet 4 is a sector shape having straight lines on the both sides and widening from the straight line 2 to the round land 3 (see Patent Literatures 1-4 below). The reference number 3a in FIGS. 46 and 47 represents a through-hole via (also simply referred to as "via").

In executing the above fillet process during designing the wiring on the print wiring board 1, the designer assigns various shape parameters of a fillet 4 for each part to be designed as illustrated in, for example, FIGS. 46-49, so that a fillet 4 determined in terms of the shape parameter is formed for the part.

In the first example of FIG. 46, the length L of the fillet 4 is assigned to the shape parameter. The length L represents the distance between an intersection at which the both side lines of the fillet 4 cross the straight line 2 and the outer circumference of the land 3. The both sides of the fillet 4 are in contact with the outer circumference of the land 3. A region surrounded by the both sides of the fillet 4, the outer circumference of the land 3, and the straight line 2 is defined as the fillet 4.

In the second example of FIG. 47, the ratio R (length/width) of the length to the width of the fillet 4 is assigned to the shape parameter. In this case, the value of the width W of the fillet 4 is provided previously and the length L of the fillet 4 is calculated by multiplying the width W and the assigned ratio R (L=W×R). Accordingly, the length L becomes larger in proportional to increase in the width W.

Then, the fillet 4 is generated on the basis of the calculated length L in the same manner as the first example of FIG. 46. Here, an example of the width W is a value obtained by subtracting the predetermined line width of the line 2 from the diameter of the land 3.

In the third example of FIG. 48, the angle θ formed by both sides of the fillet 4 and the offset L are assigned to the shape parameters. The offset L corresponds to the length of the fillet 4 in the above first and second examples. In this example, a fillet having an offset L between the line 2 and the land 3 and having both sides forming the angle θ is generated.

In the fourth example of FIG. 49, a length rate r is assigned to the shape parameter. The length rate r represents the distance between the end point of the straight line 2 (starting point of the fillet 4) and the center of the land 3. In this example, the radius of the land 3 is provided previously and the position of the starting point of the fillet 4 with respect to the land 3 is determined by multiplying the radius and the assigned length rate r. Two tangents passing through the starting point and being in contact with the outer circumference of the land 3 are calculated as the both sides of the fillet 4.

PRIOR ART LITERATURE

Patent Literature

[Patent Literature 1] Japanese Laid-open Patent Publication No. 2005-322946
[Patent Literature 2] Japanese Laid-open Patent Publication No. 09-259175
[Patent Literature 3] Japanese Laid-open Patent Publication No. 10-124544
[Patent Literature 4] Japanese Laid-open Patent Publication No. 04-330569

In accordance with recent progress in a high-speed signal and a high-frequency circuit, arc wiring has been known for inhibiting fluctuation of the impedance. In this case, the connection to a via (round land 3) is accomplished by an arc line 2A as illustrated in FIG. 50. A fillet has not been hitherto formed for arc wiring. If a fillet 4 is easily made at the connection between the arc line 2A and the round land 3 as illustrated in FIG. 51, the wiring length comes to be shorter than needed, which is not preferable because of the resultant rapid signal transmission.

If a straight line 2 is connected to a via 3a (round land 3), an arc fillet can be generated by using the shape parameters for a straight line fillet 4 described with reference to FIGS. 46-49. Here, a straight line fillet has straight lines on the both sides while an arc fillet has arc lines on the both sides.

However, the examples of FIGS. 46-49 describe a manner of generating bilateral symmetrical fillet 4. When, in contrast, an arc line 2A (see FIG. 50) is connected to a via 3a (round land 3), neither a straight line fillet nor an arc fillet can be generated.

SUMMARY

According to an aspect of the embodiment, the design program causes a computer that generates an arc fillet at a connection between a round land and a connecting line connected to the round land to execute the following processes (1)-(3):

(1) a process of calculating a first point of contact between the connecting line and a first circle and a second point of contact between the round land and the first circle, the first circle having a first radius and being in contact with the round land and the connecting line;

(2) a process of calculating a third point of contact between the round land and a second circle and a fourth point of contact between the connecting line and the second circle, the second circle having a second radius and being in contact with the round land and the connecting line at the opposite side of the first circle; and (3) a process of calculating the arc fillet defined as a region surrounded by a first arc between the first point of contact and the second point of contact on the first circle, a second arc between the third point of contact and the fourth point of contact on the second circle, a third arc between the fourth point of contact and the first point of contact on the connecting line, and a line segment between the second point of contact and the third point of contact.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF THE PREFERRED EMBODIMENTS

Figure 1:
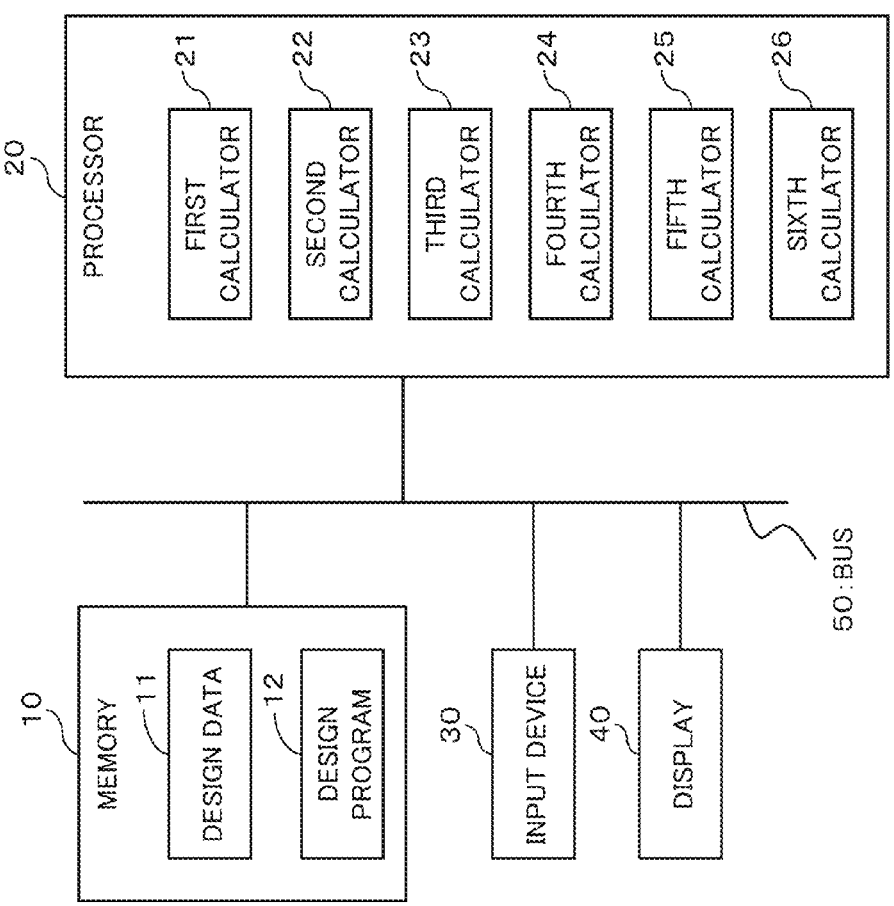
FIG. 1 is a block diagram schematically illustrating the hardware and functional configurations of an information processing apparatus having a design aiding function according to a first embodiment of the present invention.

Hereinafter, detailed description will now be made in relation to a design program, an information processing apparatus, and a method for designing of this patent application by referring to the accompanying drawings. However, the embodiment to be detailed below is merely an example and does not intend to exclude another modification and application of techniques that are not referred in this description. In other words, various changes and modification can be suggested without departing from the gist of the embodiment. The accompanying drawings may include other elements and functions in addition to those in the drawings. Besides, the embodiment and the modification can be combined without contradiction in process to each other.

[1] Hardware Configuration of Information Processing Apparatus Having a Design Aid Function of a First Embodiment:

FIG. 1 is a block diagram schematically illustrating the hardware and functional configurations of the information processing apparatus 100 having an design aid function according to the first embodiment of the present invention. The information processing apparatus 100 of FIG. 1 achieves the function for aiding design of arranging parts on a print wiring board 1 (see FIG. 3) and design of wiring the parts arranged on the print wiring board 1.

The information processing apparatus 100 consists of a calculator such as a versatile personal computer, and includes a memory 10, a processor 20, an input device 30, and a display 40, which are communicably connected to one another via a bus 50.

The memory 10 may be an internal memory device such as a RAM (Random Access Memory), a HDD (Hard Disk Drive), an SSD (Solid State Drive), or an external memory device. The memory 10 stores therein design data 11 including various pieces of data related to the print wiring board 1 being the target of design aid and various piece of data related to a fillet that a processor 20 generates through the following process using the following functions. The memory 10 may further store therein a design program 12 that causes the processor 20 to achieve the design aid function according to the first embodiment.

As described above with reference to FIGS. 46-51, wiring between parts on the print wiring board 1 of the first embodiment is also accomplished by forming a wiring pattern of a straight line (connecting line) 2 or an arc line (connecting line) 2A having a predetermined line width between round lands 3 of the respective through-hole vias 3a. Also as described above, a round land 3 is a circle pattern formed around a via 3a to receive the lead of a part to be mounted or around a via 3a that connects the layers on the print wiring board 1.

Figure 3:
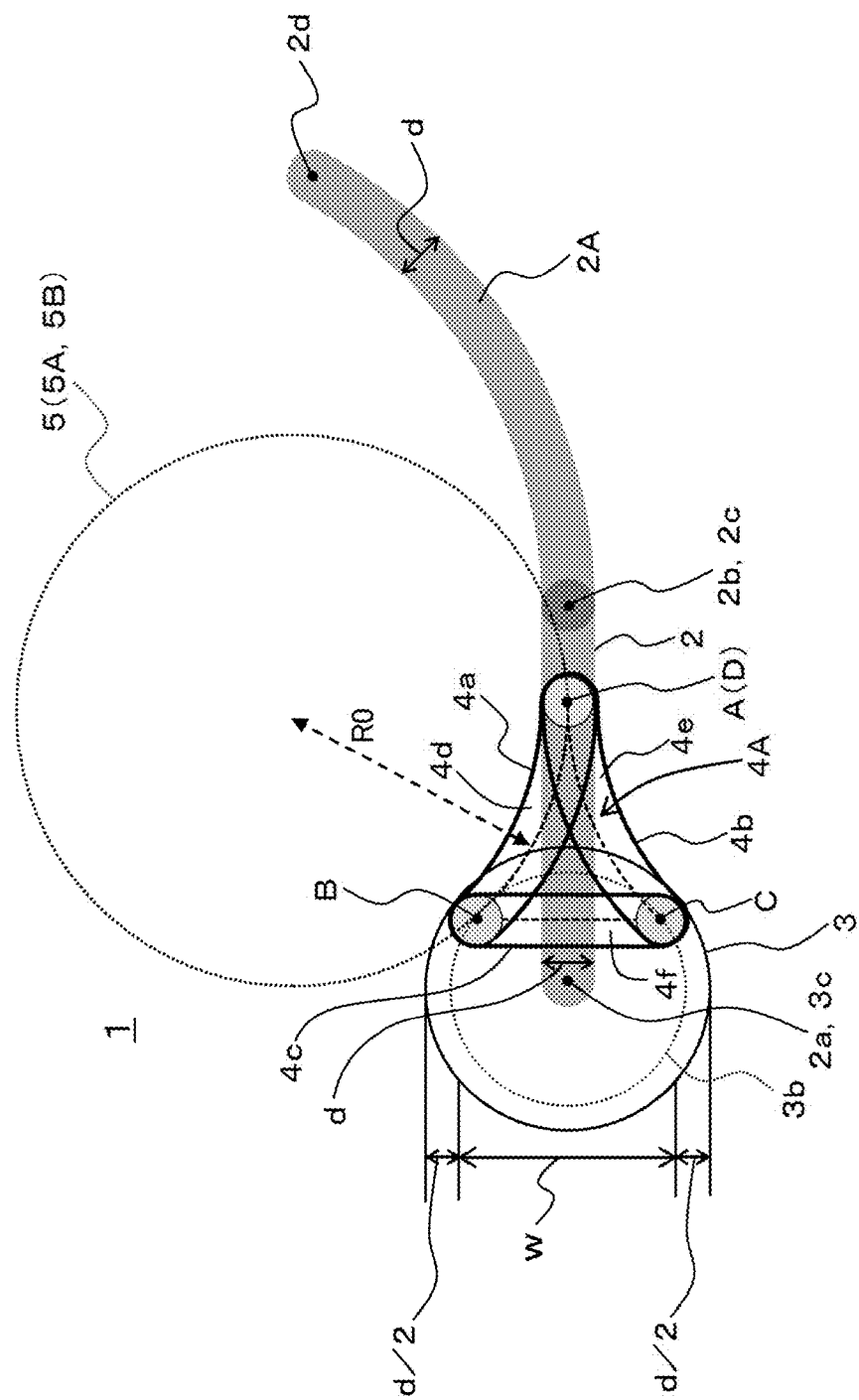
FIG. 3 is a diagram denoting an arc fillet shape generated in the first embodiment and a value and a setting value related to the arc fillet shape.

In particular, the design aiding system of the information processing apparatus 100 of the first embodiment carries out, as wiring design of the print wiring board 1, a fillet process that forms an arc fillet 4A (see FIG. 3) at the connection between a round land and the straight line 2 or an arc line 2A on the print wiring board 1. A fillet process is carried out to prevent a via connecting conductor from peeling off. For example, as illustrated in FIG. 3, an arc fillet 4A has a sector shape widening from the straight line 2 or 2A towards the round land 3, and the both sides 4a and 4b of the arc fillet 4A take a shape of an arc. As described above, an arc line 2A is adopted to suppress the impedance fluctuation accompanied by recent remarkable growth in high-speed signal and a high-frequency circuit. The design aiding system of the information processing apparatus 100 of the first embodiment makes it possible to calculate a pattern region of an arc fillet 4A at the connection between the round land 3 and the arc line 2A.

An example of the processor 20 is a Central Processing Unit (CPU). The processor 20 executes a design program 12 stored in, for example, the memory 10 and thereby exerts the function as a first calculator 21, a second calculator 22, a third calculator 23, a fourth calculator 24, a fifth calculator 25, and a sixth calculator 26 that are to be detailed below.

The input device 30 is a man-machine interface that is operated by the designer (user) inputting various pieces of information into the information processing apparatus 100, and is exemplified by a mouse and/or a keyboard. In particular, the input device 30 is used by the designer inputting the radius value of a fillet circle (see FIGS. 3 and 5) that defines the shape of an arc of an arc fillet 4A or a setting value to set the radius value. In addition, the input device 30 is further used by the designer inputting information related to "whether or not the radius is automatically adjusted considering a proximal obstacle".

Figure 2:
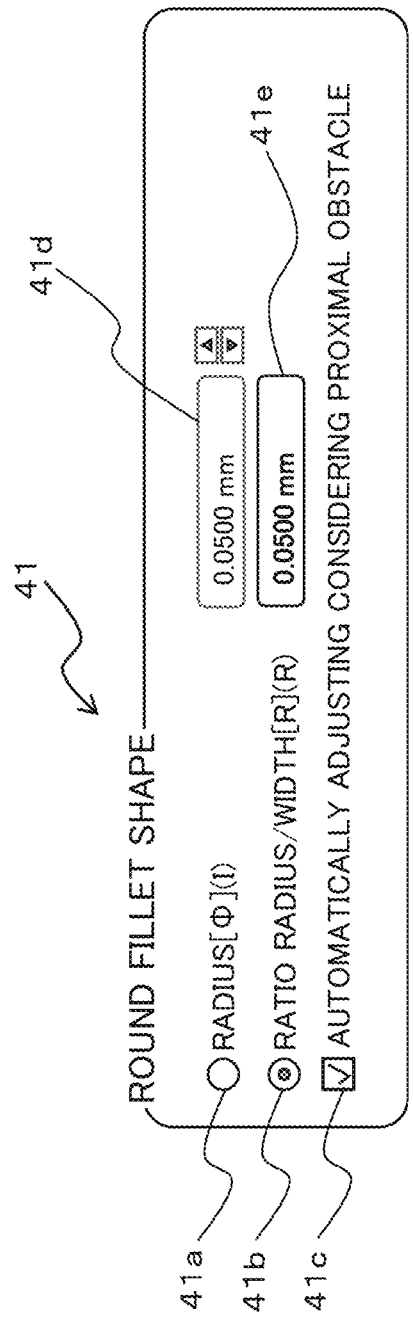
FIG. 2 is a diagram illustrating an example of a setting window for an arc fillet shape of the first embodiment.

The display 40 displays thereon various pieces of information generated by the processor 20, such as a setting window 41 of FIG. 2 and a process of generating a fillet depicted in FIGS. 3-5, 7-16, and 18-43. Examples of the display 40 are a Cathode Ray Tube (CRT) and a Liquid Crystal Display (LCD).

[2] Setting Shape of an Arc Fillet:

At the start of aiding the design, the information processing apparatus 100 of the first embodiment displays the setting window 41 of FIG. 2 related to "an arc fillet shape" on the display 40. The designer (user) refers to the setting window 41 and then sets (assigns) the following information via the input device 30. FIG. 2 is an example of the setting window 41 to set the shape of an arc fillet according to the first embodiment.

The setting window 41 of FIG. 2 includes two radio buttons 41a and 41b, a check box 41c, a radius value inputting field 41d, and a radius/width ratio inputting field 41e.

If checking the radio button 41a, the designer inputs a value (parameter) of the radius R0 of circles 5, 5A, and 5B (see FIGS. 3 and 5) that define the arc shape of the arc fillet 4A by directly inputting the value or selecting the value from a pull down menu into the radius value inputting field 41d using the input device 30. Hereinafter, the circles 5, 5A, and 5B that define the arc fillet 4A are referred to as fillet circles.

If checking the radio button 41b, the designer directly inputs, as a value (parameter) of the radius R0 of circles 5, 5A, and 5B (see FIGS. 3 and 5) that define the arc shape of the arc fillet 4A, the radius/width ratio R into the radius/width ratio inputting field 41e using the input device 30. The relationship between the radius/width ratio R and the radius value R0 will be detailed below with reference to FIG. 3.

The designer checks the check box 41c via the input device 30 when "automatic radius adjusting considering a proximal obstacle" is carried out. On the other hand, if "automatic radius adjusting considering a proximal obstacle" is not carried out, the check box 41c is not checked. When the check box 41c is not checked, the information processing apparatus 100 carries out only the process of generating an arc fillet according to a procedure (basic case) that is to be detailed below with reference to FIGS. 4-8 without considering a proximal obstacle. When the check box 41c is checked, the information processing apparatus 100 carries out the process of generating an arc fillet according to the basic case (default size) and then carries out another process (automatic adjusting) of generating an arc fillet, considering a proximal obstacle, as to be detailed below with reference to FIGS. 9-23.

The example of FIG. 2 checks the radio button 41b and the check box 41c and sets "0.0500 mm" and "0.500" in the radius value inputting field 41d and the radius/width ratio inputting field 41e, respectively.

Next, description will now be made in relation to the shape of the arc fillet 4A on the print wiring board 1 and a value and/or a setting value related to the shape of the first embodiment with reference to FIG. 3.

In FIG. 3, a straight line (connecting line) 2 having a line width d is connected to a round land 3, and is also connected to an arc line 2A. The position of one end point 2a of the straight line 2 coincides with the position of the center 3c of the round land 3. The position of the other end point 2b of the straight line 2 coincides with the end point 2c of the arc line 2A having a line width d. The end points 2a-2c and the other end point 2d of the arc line 2A are positioned on the center line of the straight line 2 or the first calculator arc line 2A

In FIG. 3, an offset circle 3b, which is a concentric circle of the round land 3, is obtained by offsetting the diameter of the round land 3 by the width d of the lines 2, 2A. The diameter of the offset circle 3b is previously provided to be the width w in the design data 11. As described above with reference to FIG. 2, if the radio button 41b of the setting window 41 is checked and the value of the radius/width ratio R is set, the radius R0 of the circle 5 (or circles 5A, 5B, see FIG. 5) that defines the shape of the arc fillet 4A is calculated to be R0=R×w.

Here, description will now be made in relation to the shape of arc fillet 4A of the first embodiment illustrated in FIG. 3. FIG. 3 illustrates an example of the shape of an arc fillet 4A generated at the contact between the round land 3 and the straight line 2, but omits illustration of a through-hole via 3a (see FIGS. 46-48).

The arc fillet 4A of FIG. 3 is calculated to be a region surrounded by two arc lines 4d and 4e and a straight line 4f. In other words, the arc fillet 4A is calculated to be a region surrounded by an arc side 4a being outer side of the arc line 4d, an arc side 4b being outer side of an arc line 4e, and a straight line 4c being outer side of the straight line 4f.

The wiring positions of the arc liens 4d and 4e and the straight line 4f are determined in terms of the positions of three points A, B, and C, which are determined in terms of the circle 5 having a predetermined radius R0. The circle 5 (first circle 5A) is in contact with both the offset circle 3b of the round land 3 and the center line of the straight line 2. The point A is the point of contact between the center line of the straight line 2 and the circle 5; and the point B is the point of contact between the offset circle 3b and the circle 5.

Although not appearing in FIG. 3, another circle (second circle 5B) having a predetermined radius R0 is arranged so as to come into contact with both the offset circle 3b of the round land 3 and the center line of the straight line 2 at the opposite side of the circle 5 with respect to the straight line 2. The circle (second circle 5B) arranged at this position has a point C serving as the point of contact between the offset circle 3b of the round land 3 and the circle (second circle 5B) and a point D serving as the point of contact between the center line of the straight line 2 and the circle 5. Since the example of FIG. 3 deals with the straight line 2, the arc fillet 4A is symmetrical with respect to the straight line 2 and therefore the point A coincides with the point D.

The arc line 4d is wired to have a center line coinciding with the arc between the point A to the point B on the circle 5 (first circle 5A). Likewise, the arc line 4e is wired to have a center line coinciding with the arc between the point A (point D) and the point C on the circle (second circle 5B). The straight line 4f is wired to have a center line coinciding with the line that connects the point B and the point C. The arc shape of the arc fillet 4A is determined in terms of the arc lines 4d and 4e and the straight line 4f arranged as the above.

[3] Functional Configuration and Specific Process of the Information Processing Apparatus Having a Design Aiding Function of the First Embodiment:

Next, description will now be made in relation to various functions of the processor 20 in generating the arc fillet 4A at the contact between a round land 3 (via 3a) and a connecting line 2A or 2 connected to the round land 3 by referring to FIGS. 4-45. In the information processing apparatus 100 (processor 20) of the first embodiment, the first calculator 21, the second calculator 22, the third calculator 23, the fourth calculator 24, the fifth calculator 25, and the sixth calculator 26 have the following functions (1)-(6), respectively.

The function (1) calculates and generates the region (shape) of an arc fillet 4A of the default size based on, for example, the design data 11 without considering a proximal element (obstacle) to the connection. The function (1) is used when a proximal element (obstacle) to the connection is absent (basic case) or when the region of an arc fillet 4A to be the target of the function (2) to be detailed below is calculated or generated (basic case). The function (1) is achieved by the first calculator 21 and will be detailed below by referring to FIGS. 4-8. An example of a proximal element (obstacle) to the connection is other round lands (round obstacles) 6A and 6B arranged on the print wiring board 1 (see FIGS. 9-16 and 18-23). The default size is based on the parameter (i.e., radius R0 or the radius/width ratio R) set in the manner described above with reference to FIG. 2.

The function (2) calculates and generates the arc fillet 4A by automatically adjusting the region (shape) of the arc fillet 4A of the default size generated by means of the above function (1) such that the region and a proximal element to the connection satisfies the predetermined gap space condition. Here, an example of the predetermined gap space condition is that the gap space is equal to or larger than a predetermined threshold corresponding to the insulation distance of the print wiring board 1 (which means the minimum allowable space that can ensure the insulation state). The function (2) is achieved by the second calculator 22, and will be detailed below by referring to FIGS. 9-23.

The function (3) deals with cases where the above function (1) fails to calculate and generate the region of the arc fillet 4A of the default size because the radius of the arc line (connecting line) 2A connected to the round land 3 is smaller than the radius of the fillet circle 5 (5A, 5B). To obtain the arc fillet 4A, the function (3) modifies the radius of the fillet circle 5 (5A, 5B), and calculates and generates the region (shape) of the arc fillet 4A on the basis of the fillet circle having the modified radius. The function (3) is achieved by the third calculator 23, and will be detailed below by referring to FIGS. 24-28.

The function (4) deals with cases where the above function (1) fails to calculate and generate the region of the arc fillet 4A of the default size because the connecting line 2 or 2A connected to the round land 3 is short. To obtain the arc fillet 4A, the function (4) searches for a line connected to the line 2 or 2A that has failed to generate the arc fillet 4A, and calculate and generate the region (shape) of the arc fillet 4A based on the searched line. The function (4) is achieved by the fourth calculator 24, and will be detailed below by referring to FIGS. 29-32.

The function (5) calculates and generates the region (shape) of the arc fillet 4A of the default size for each connection on the basis of the design data 11. Examples of the connection are a connection between a rectangular land (part pin) and a connecting line 2 or 2A connected to the rectangular land, a T-shape connection between arc lines 2A and 2A, and a T-shape connection between straight lines 2 and 2. The function (5) is achieved by the fifth calculator 25, and will be detailed below by referring to FIGS. 33-38.

The function (6) selects, when multiple round lands serving as obstacles are present in the vicinity of the connection in the automatic adjusting by the function (2), a target obstacle from the multiple obstacles. The function (6) is achieved by the sixth calculator 26, and will be detailed below by referring to FIGS. 39-44.

[3-1] Function and Specific Process of the First Calculator (Process for a Basic Case)

Figure 4:
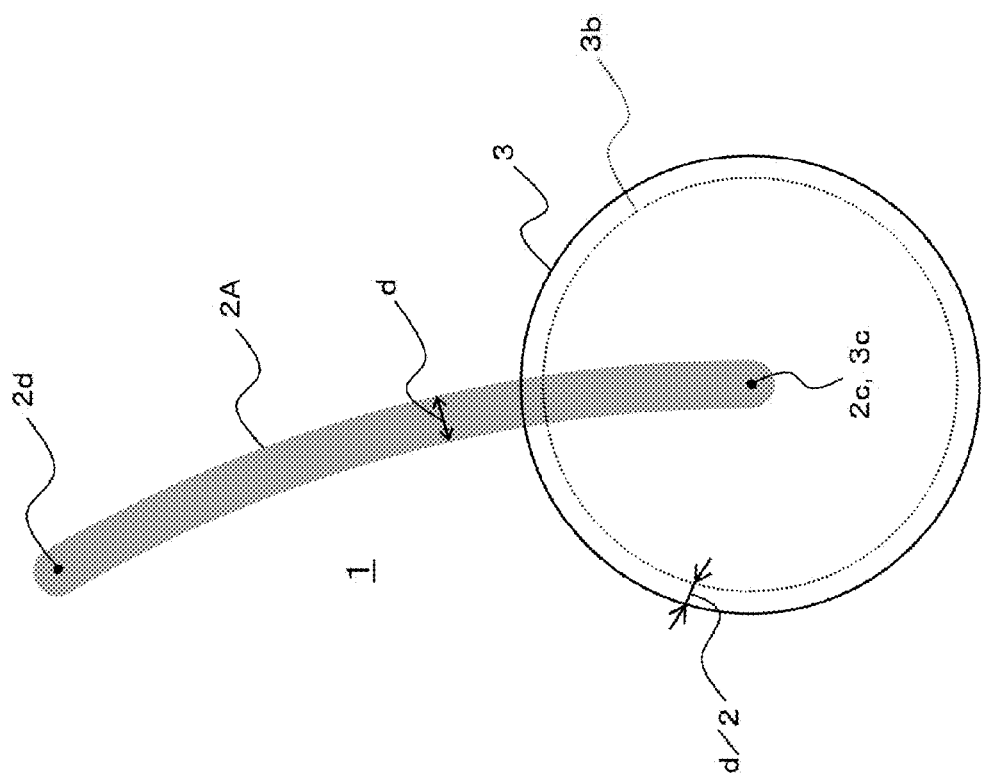
FIGS. 4 and 5 are diagrams illustrating a function for generating an arc fillet for an arc line by a first calculator of the first embodiment.
Figure 5:
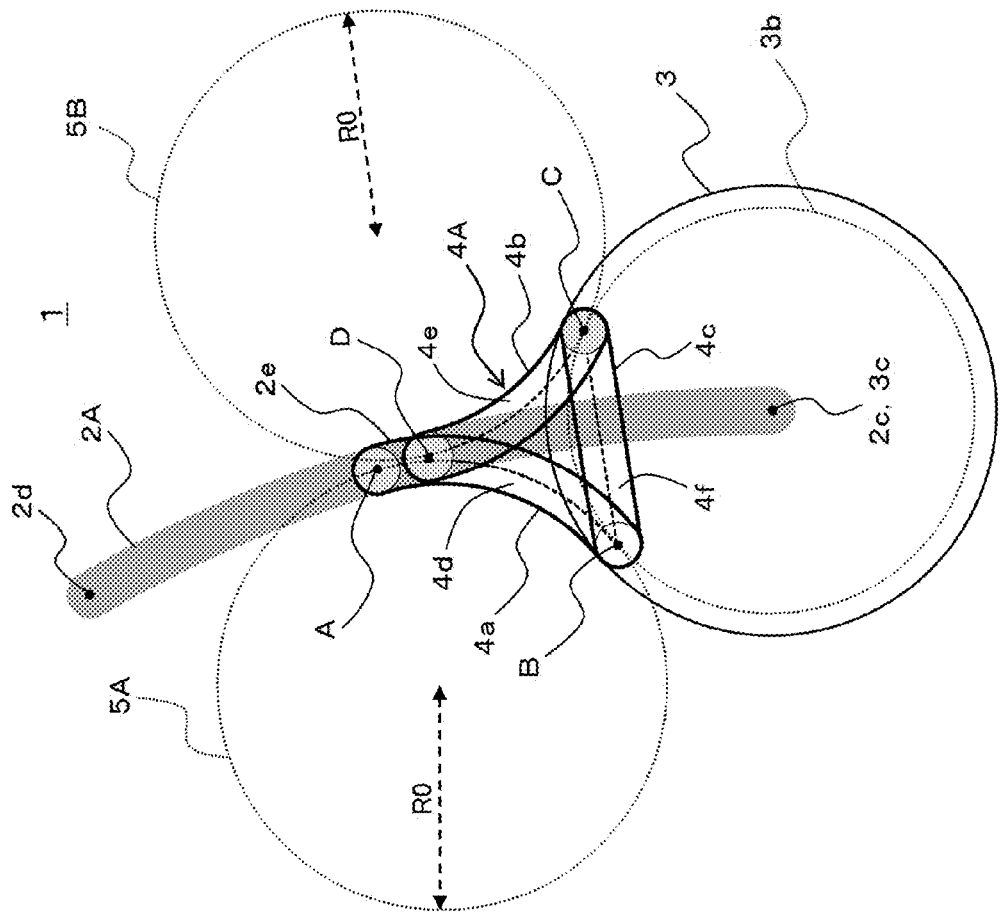
Figure 6:
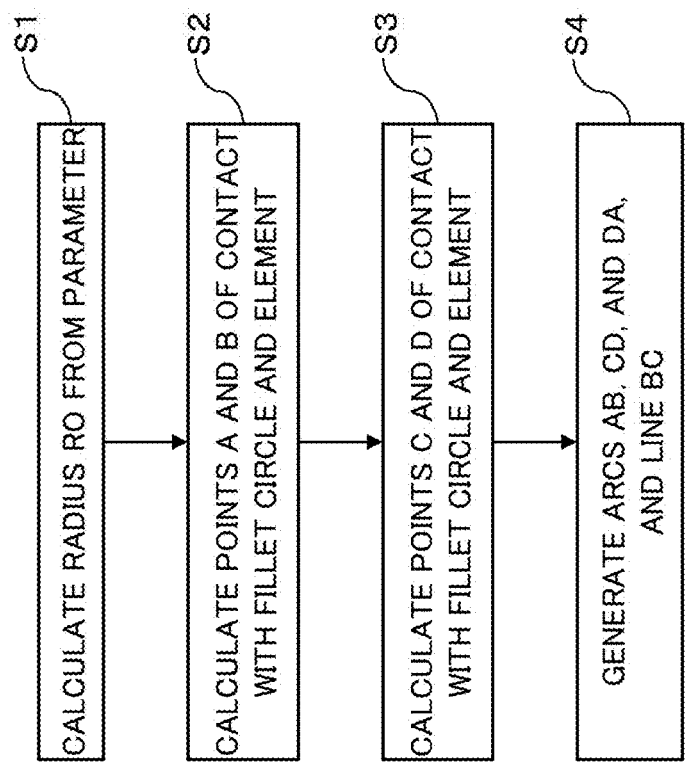
FIG. 6 is a flow diagram denoting a succession of procedural steps of generating an arc fillet for an arc line by a first calculator of the first embodiment.

Description will now be made in relation to the above function (1) exerted by the first calculator 21 and the process (for a basic case) performed by the first calculator 21 with reference to FIGS. 4-8. FIGS. 4 and 5 denote a function of generating an arc fillet 4A for an arc line (connecting line) 2A; FIG. 6 is a flow diagram illustrating a succession of procedural steps (steps S1-S4) of generating an arc fillet 4A for an arc line (connecting line) 2A; and FIGS. 7 and 8 denote a function of generating an arc fillet 4A for a straight line (line-segment line) 2. FIGS. 4, 5, 7, and 8 omit illustration of a through-hole via 3a (see FIGS. 46-48).

Here, description will now be made in relation to a function and a procedure of generating an arc fillet 4A at a connection between a round land 3 and the arc line 2A connected to the round land 3 illustrated in FIG. 4 by referring to FIGS. 5 and 6. In this procedure, the first calculator 21 calculates and generates the region of the arc fillet 4A of the default size based on, for example, the design data 11 without considering a proximal element (obstacle) to the connection.

At the connection between the round land 3 and the arc line 2A of FIG. 4, the round land 3 is connected to the arc line 2A having a line width d. The position of one end point 2c of the arc line 2A coincides with the position of the center 3c of the round land 3. The end point 2c and the other end point 2d of the arc line 2A are arranged on the center line of the arc line 2A. As described above, the offset circle 3b concentric with the round land 3 is obtained by offsetting the diameter of the round land 3 by the line width d of the arc line 2A. In the first embodiment, the offset circle 3b is treated as the substantial outer circumference of the round land 3.

The first calculator 21 calculates and generates the region of the arc fillet 4A at the connection of FIG. 4 along the manner of FIGS. 5 and 6. First of all, the first calculator 21 calculates the radius R0 of the fillet circles 5A and 5B on the basis of the parameter set on the setting window 41 (see step S1 of FIG. 6). The first embodiment assumes that the predetermined first radius of the fillet circle 5A serving as the first circle is the same as the predetermined second radius of the fillet circle 5B serving as the second circle. If the radio button 41a on the setting window 41 is checked to set the value R0 of the radius, the value R0 of the radius is calculated to be the radii of the fillet circles 5A and 5B. The radio button 41b on the setting window 41 is checked to set the value of the radius/width ratio R, the value R0 of the radius is calculated to be R0=R×w. The value of the width w corresponds to the diameter of the offset circle 3b and is contained in the design data 11.

After that, the first calculator 21 calculates a first point A of contact and a second point B of contact on a fillet circle (first circle) 5A having a radius R0 and being in contact with both the round land (element) 3 and the arc line (element) 2A, as illustrated in FIG. 5 (see step S2 of FIG. 6). Here, the first point A of contact is the point of contact between the center line of the arc line 2A and the fillet circle 5A while the second point B of contact is the point of contact between the offset circle 3b of the round land 3 and the fillet circle 5A.

Likewise, the first calculator 21 calculates a third point C of contact and a fourth point D of contact on a fillet circle (second circle) 5B having a radius R0 and being in contact with both the round land 3 and the arc line 2A at the opposite side of the fillet circle 5A, as illustrated in FIG. 5 (see step S3 of FIG. 6). Here, the third point C of contact is the point of contact between the offset circle 3b of the round land 3 and the fillet circle 5B while the fourth point D of contact is the point of contact between the center line of the arc line 2A and the fillet circle 5B.

As illustrated in FIG. 5, the first calculator 21 then calculates a region surrounded by a first arc AB, a second arc CD, a third arc DA, and a line segment BC as the arc fillet 4A (see step S4 of FIG. 6), so that the arc fillet 4A is generated at the connection between the round land 3 and the arc line 2A, as illustrated in FIG. 5.

Here, the first arc AB is an arc on the fillet circle 5A between the first point A of contact and the second point B of contact and corresponds to an arc line 4d having a center line coinciding with the arc AB and having a line width d. The second arc CD is an arc on the fillet circle 5B between the third point C of contact and the fourth point D of contact and corresponds to an arc line 4e having a center line coinciding with the arc CD and having a line width d. The third arc DA is an arc on the arc line 2A between the fourth point D of contact and the first point A of contact and corresponds to the arc line 2A having a center line coinciding with the arc DA and having a line width d. The line segment BC is a line (line segment) between the second point B of contact and the third point C of contact and corresponds to the straight line 4f having a center line coinciding with the line segment BC.

The arc fillet 4A of FIG. 5 is actually calculated to be the region surrounded by three arc lines 4d, 4e, and 2A and the straight line 4f. In other words, the arc fillet 4A of FIG. 5 is calculated as a region surrounded by the arc line 4a being outer side of the arc line 4d, the arc line 4b being outer side of the arc line 4e, the arc line 2e being outer side of the arc line 2A, and the straight line 4c being outer side of the straight line 4f.

Next, description will now be made in relation to a function and a procedure of generating an arc fillet 4A at the connection between the round land 3 and the straight line (connecting line) 2 connected to the round land 3 of FIG. 7 with reference to FIG. 8. Also in this case, the first calculator 21 calculates and generates the region of the arc fillet 4A of the default size based on, for example, the design data 11 without considering a proximal element (obstacle) to the connection.

Figure 7:
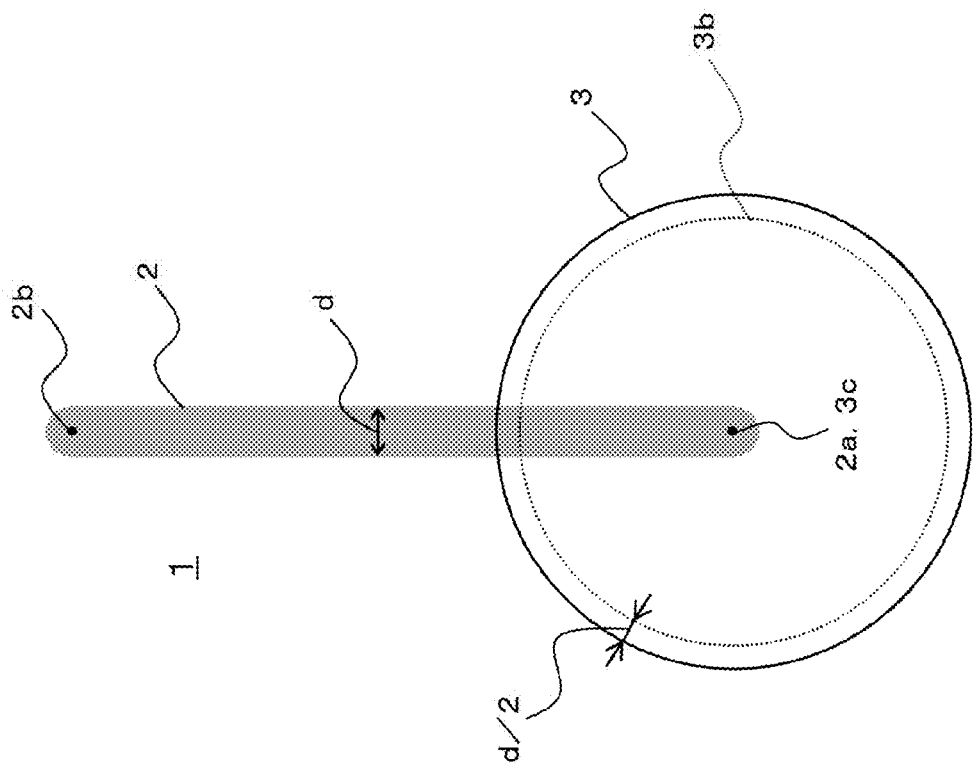
FIGS. 7 and 8 are diagrams illustrating a function of generating an arc fillet for an arc line by a first calculator of the first embodiment.

Likewise the example of FIG. 3, at the connection between the round land 3 and the straight line 2 of FIG. 7, the round land 3 is connected to the straight line 2 having a line width d. The position of one end point 2a of the straight line 2 coincides with that of the center 3c of the round land 3. The end point 2a and the other end point 2b of the straight line 2 are positioned on the center line of the straight line 2. As described above, the offset circle 3b concentric with the round land 3 is obtained by offsetting the diameter of the round land 3 by the line width d of the straight line 2. In the first embodiment, the offset circle 3b is regarded as the substantial outer circumference of the round land 3.

Then the first calculator 21 calculates the radius R0 of the fillet circles 5A and 5B likewise step S1 of FIG. 6. In succession, as illustrated in FIG. 8, the first calculator 21 calculates a first point A of contact and a second point B of contact on a fillet circle (first circle) 5A having a radius R0 and being in contact with both the round land 3 and the straight line 2. The first point A of contact is the point of contact between the center line of the straight line 2 and the fillet circle 5A while the second point B of contact is the point of contact between the offset circle 3b of the round land 3 and the fillet circle 5A.

Figure 8:
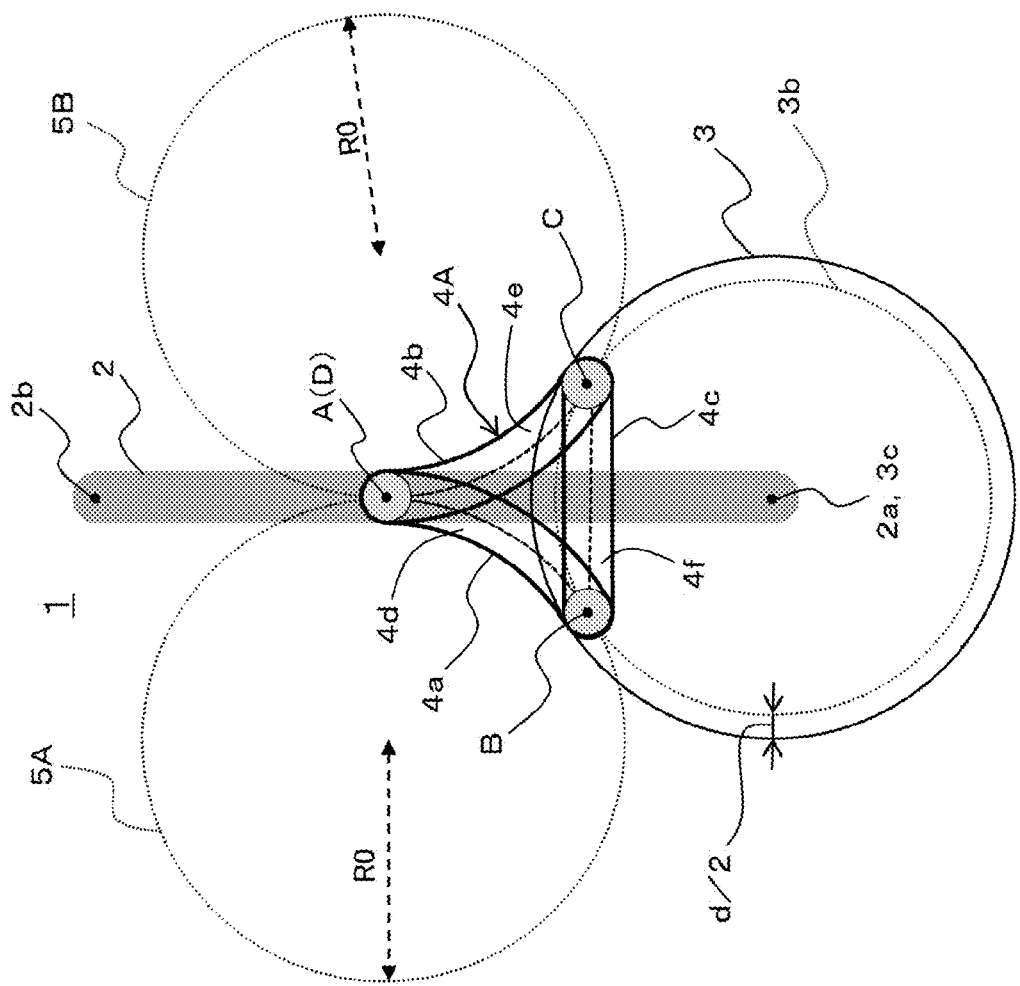

In the same manner, the first calculator 21 calculates a third point C of contact and a fourth point D of contact on a fillet circle (second circle) 5B having a radius R0 and being in contact with both the round land 3 and the straight line 2 at the opposite side of the fillet circle 5A, as illustrated in FIG. 8. The third point C of contact is the point of contact between the offset circle 3b of the round land 3 and the fillet circle 5B while the fourth point D of contact is the point of contact between the center line of the straight line 2 and the fillet circle 5B. In particular in this case, the shape of the fillet 4A is symmetrical with respect to the straight line 2 and therefore the point A coincides with the point D. Accordingly, FIG. 8 treats the fourth point D of contact as the first point A of contact.

As illustrated in FIG. 8, the first calculator 21 then calculates the region surrounded by a first arc AB, a second arc CA, and a line segment BC as the arc fillet 4A, so that the arc fillet 4A is generated at the connection between the round land 3 and the straight line 2.

Here, the first arc AB is an arc on the fillet circle 5A between the first point A of contact and the second point B of contact and corresponds to an arc line 4d having the center line coinciding with the arc AB and having a line width d. The second arc CA is an arc on the fillet circle 5B between the third point C of contact and the first point A (D) of contact and corresponds to an arc line 4e having the center line coinciding with the arc CA and having a line width d. The line segment BC is a line (line segment) between the second point B of contact and the third point C of contact and corresponds to the straight line 4f having the center line coinciding with the line segment BC.

The arc fillet 4A of FIG. 8 is actually calculated to be the region surrounded by two arc lines 4d and 4e and the straight line 4f. In other words, the arc fillet 4A of FIG. 8 is calculated as a region surrounded by the arc line 4a being outer side of the arc line 4d, the arc line 4b being outer side of the arc line 4e, and the straight line 4c being outer side of the straight line 4f.

[3-2] Function and Specific Process of the Second Calculator (Process for an Automatically Adjusting Case)

Figure 16:
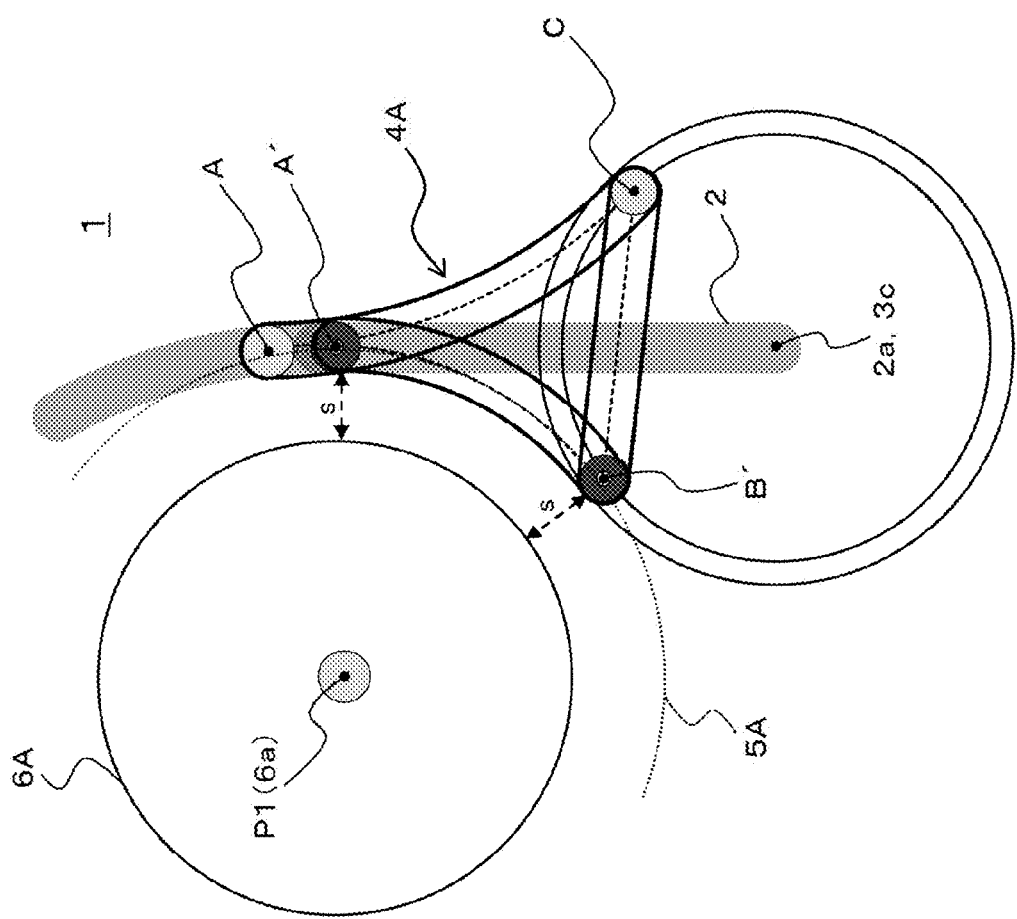
Figure 17:
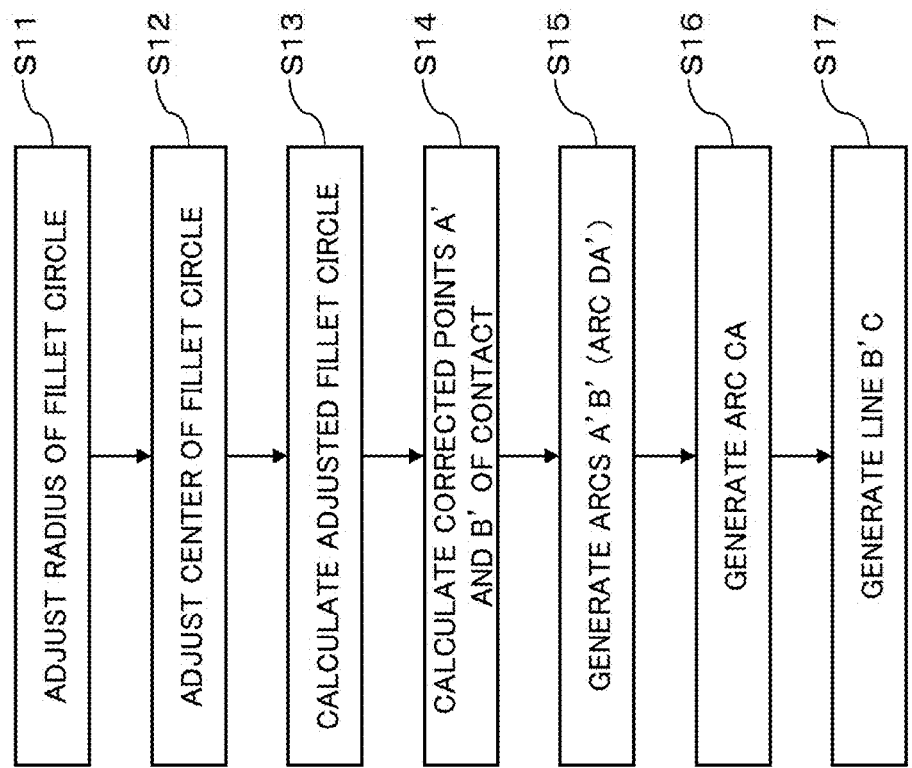
FIG. 17 is a flow diagram denoting a succession of procedural steps of automatically adjusting an arc fillet by a second calculator according to the first embodiment.

Next, description will now be made in relation to the above function (2) exerted by the second calculator 22 and the process performed by the second calculator 22 (for an automatically adjusting case) with reference to FIGS. 9-23. FIGS. 9-16 and 18-23 denote a function of automatically adjusting an arc fillet 4A by the second calculator 22 according to the first embodiment. FIG. 17 is a flow diagram denoting a succession of procedural steps of automatically adjusting an arc fillet 4A (steps S11-S17). Hereinafter, like reference numbers designate the same or the substantially same elements and parts detailed above, so repetitious description is omitted here. FIGS. 9-16 and 18-23 omit illustration of a through-hole via 3a (see FIGS. 46-48).

Figure 9:
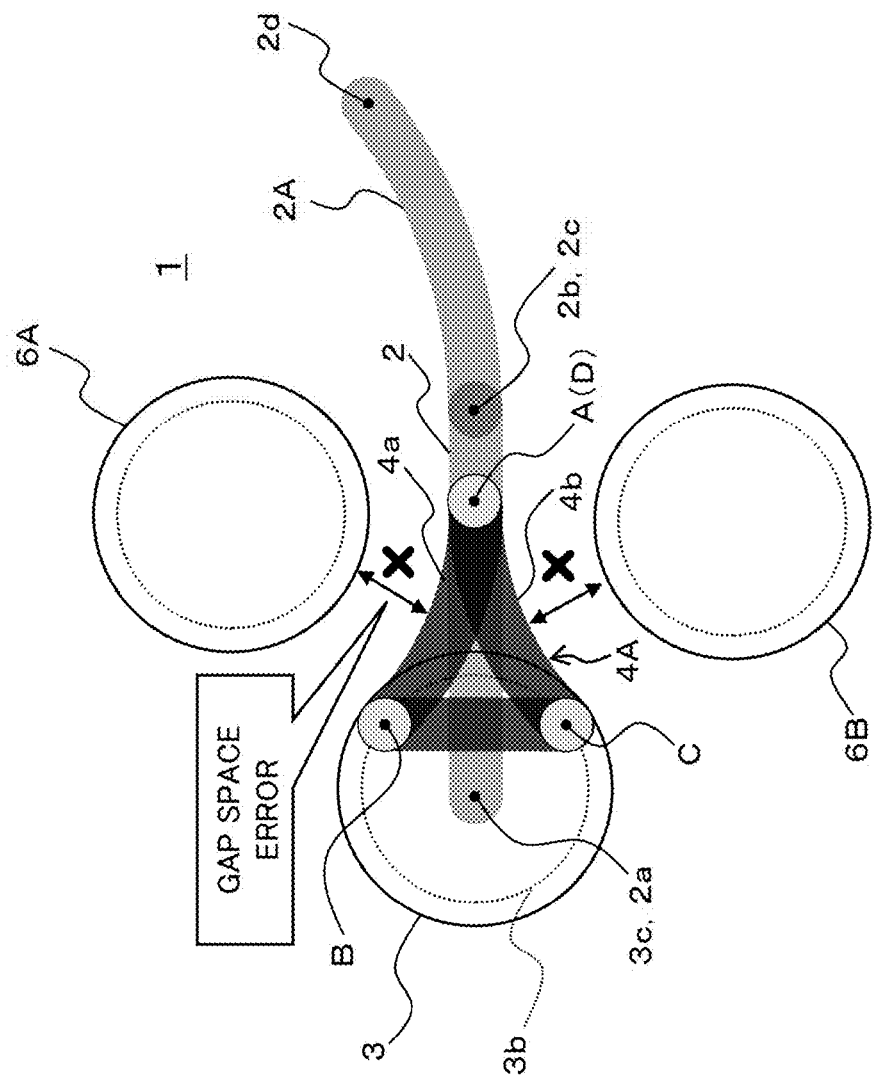
FIGS. 9-16 are diagrams illustrating a function of automatically adjusting an arc fillet by a second calculator of the first embodiment.
Figure 10:
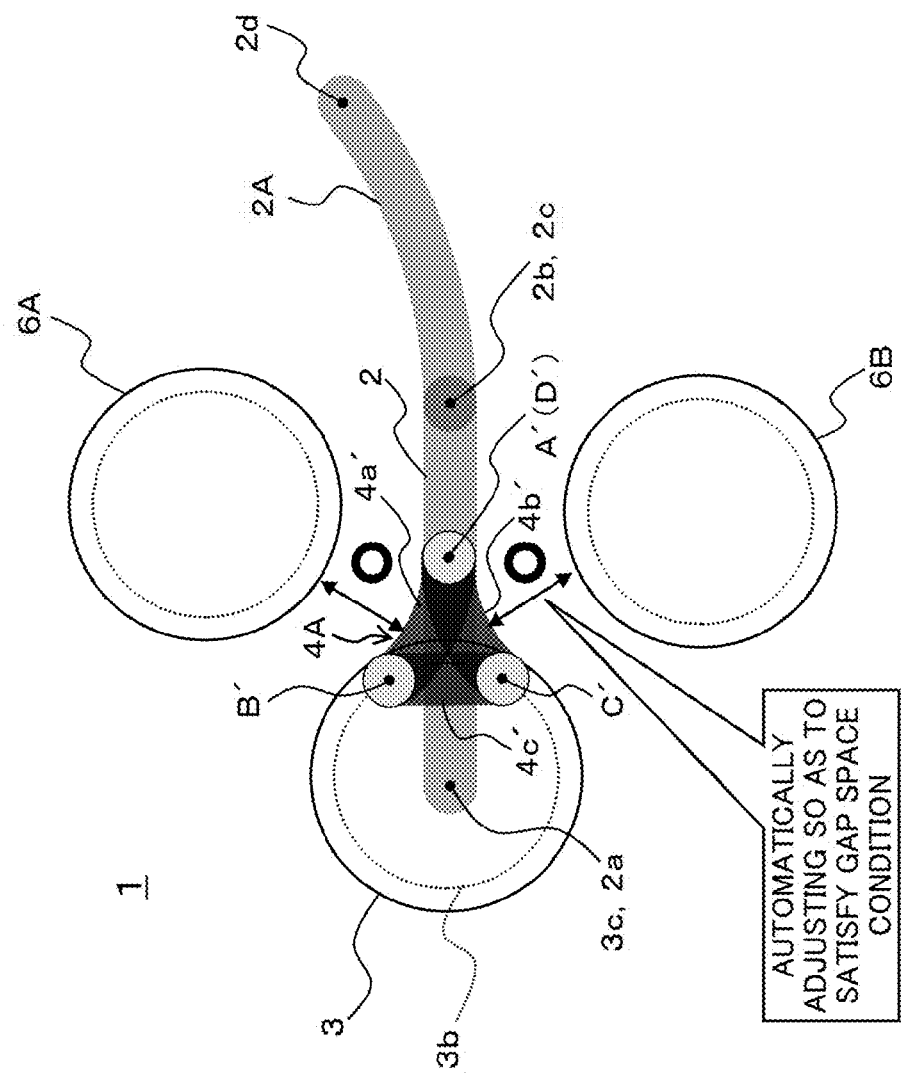

When the check box 41c on the setting window 41 is checked, the second calculator 22 automatically adjusts an arc fillet 4A as illustrated in, for example, FIGS. 9 and 10.

In the example of FIG. 9, the gap space between the first arc AB (arc side 4a) of the arc fillet 4A of the default size calculated by the first calculator 21 and a round obstacle 6A does not satisfy the predetermined gap space condition. Likewise, the gap space between the second arc CA (or CD; arc side 4b) of the arc fillet 4A of the default size calculated by the first calculator 21 and a round obstacle 6B in the example of FIG. 9 does not satisfy the predetermined gap space condition. Here, the state of "not satisfying the predetermined gap space condition" represents a state where the gap space between the first arc AB (arc side 4a) and the round obstacle 6A or the gap space between the second arc CA (arc side 4b) and the round obstacle 6B is less than a predetermined threshold (allowable gap space) corresponding to the insulation distance (i.e., the state of gap space error). The round obstacles 6A and 6B are round pattern formed around a via (not illustrated) to receive a part lead to be mounted or a via (not illustrated) that connects the layers on the print wiring board 1 likewise the round land 3.

When the arc fillet 4A generated by the first calculator 21 does not satisfy the predetermined gap space condition likewise the example of FIG. 9, the second calculator 22 automatically adjusts the arc fillet 4A such that the predetermined gap space condition is satisfied as illustrated in FIG. 10. In other words, the second calculator 22 calculates and generates the arc fillet 4A that satisfies the predetermined gap space condition as illustrated in FIG. 10 through automatic adjusting to be detailed below. The arc fillet 4A illustrated in FIG. 10, which has undergone the automatic adjusting, is calculated and generated to be the region surrounded by a first arc A'B' (arc side 4a'), a second arc C'A' (arc side 4b'), a line segment B'C' (straight line side 4c').

Hereinafter, description will now be made in relation to the function of automatically adjusting an arc fillet 4A by the second calculator 22 (Cases 1-3) with reference to FIGS. 11-23.

Figure 11:
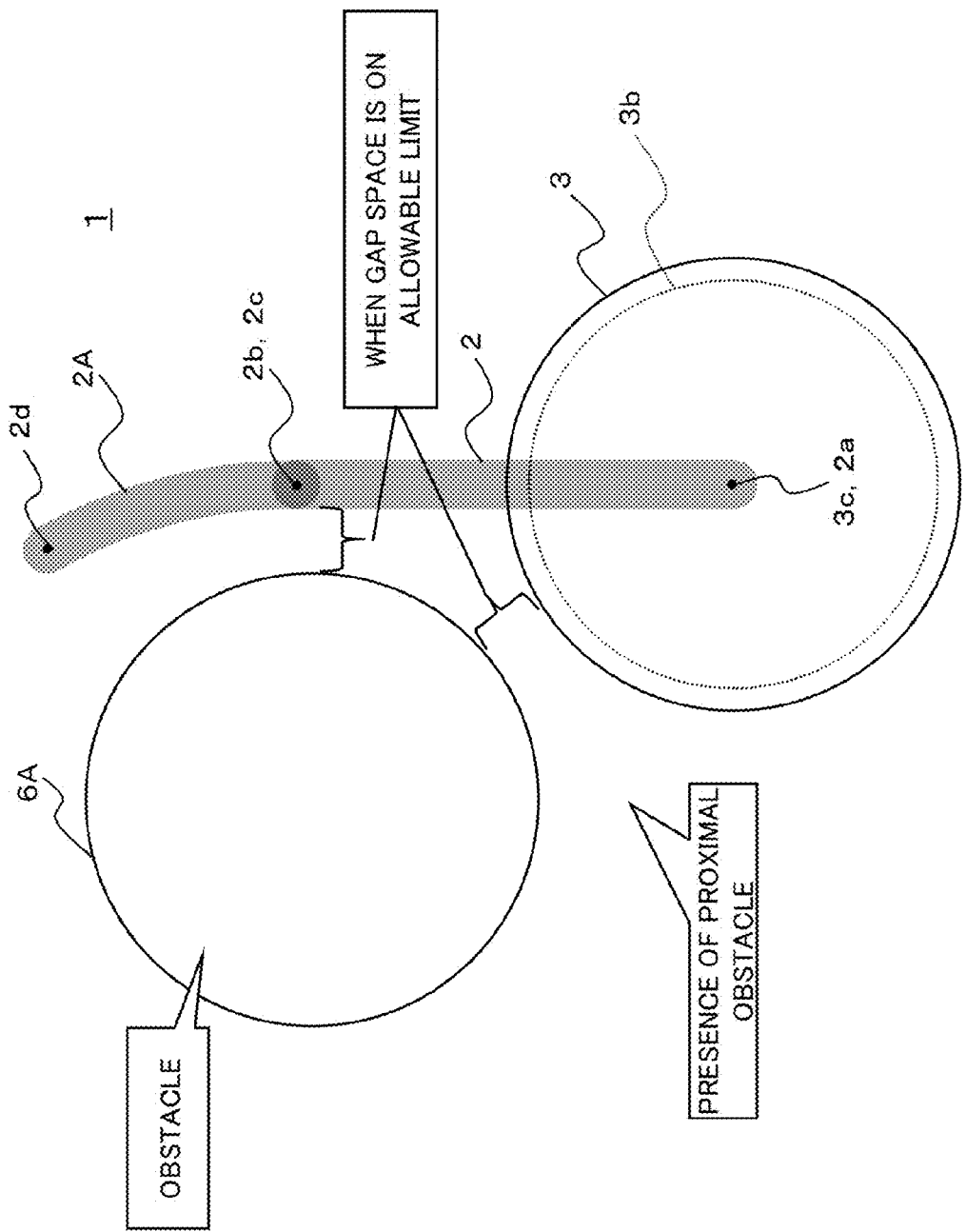

[3-2-1] Case 1:

First of all, description will now be made in relation to the function and the procedure of automatic adjusting when a round obstacle 6A is arranged in the vicinity of the round land 3 and the straight line (connecting line) 2 for which an arc fillet 4A is to be generated with reference to FIGS. 11-17. In particular, Case 1 assumes that the distance (space, gap space) between the round obstacle 6A and the round land 3 is the same as that between the round obstacle 6A and the straight line 2. In the example of FIG. 11, the distances are slightly exceeding the allowable gap space (predetermined threshold) s.

Figure 12:
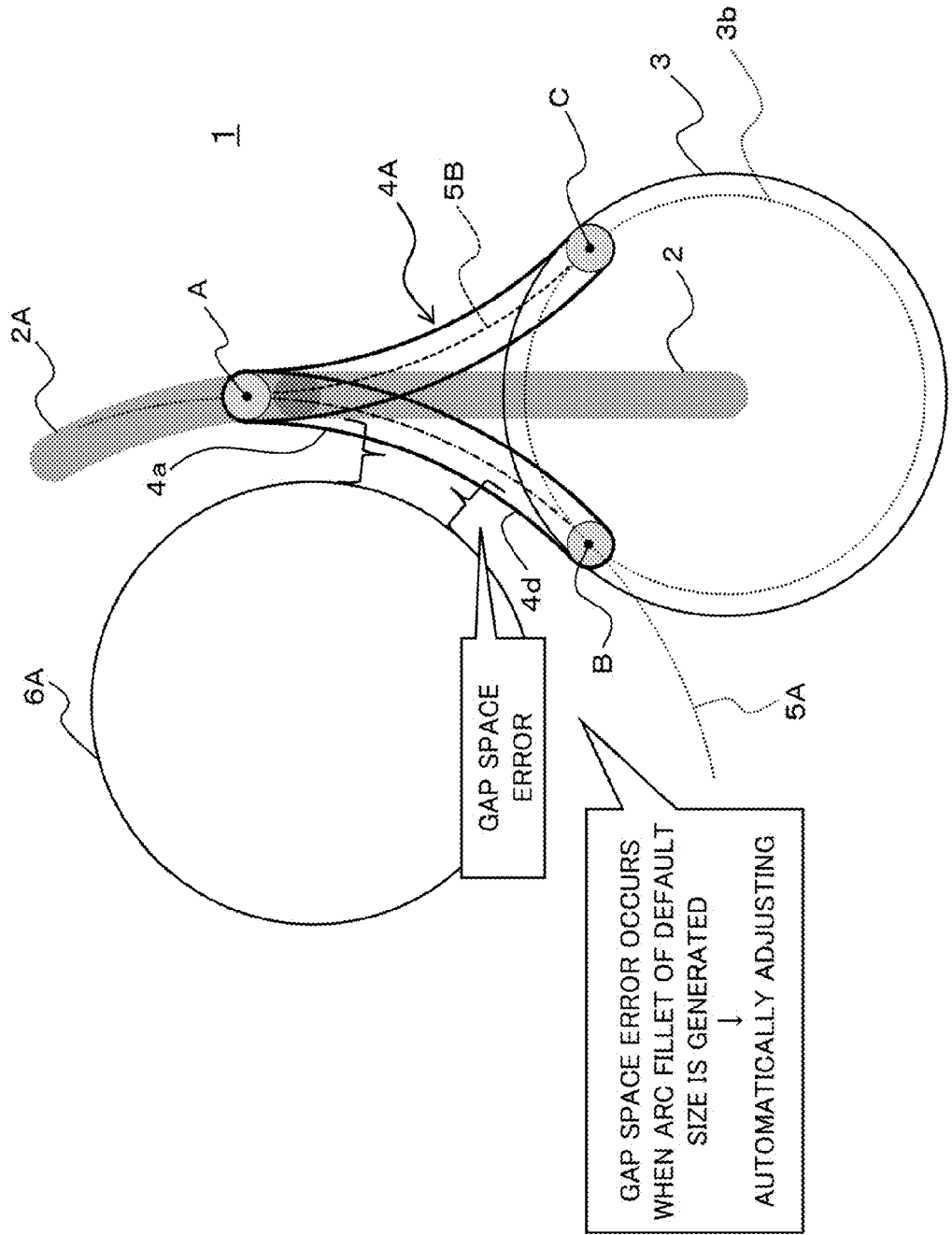

Under this state, when the first calculator 21 generates an arc fillet 4A of the default size, a gap space error occurs between the first arc AB (arc side 4a) of the arc fillet 4A and the round obstacle 6A as illustrated in FIG. 12. In the event of occurrence of a gap space error, the processor 20 starts a process using the function (2) of automatic adjusting performed by the second calculator 22.

As illustrated in FIGS. 13-16, the second calculator 22 adjusts the radius and the center position P1 of the fillet circle 5A such that an arc fillet 4A that satisfies the predetermined gap space condition (i.e., the gap space being equal to or more than the allowable gap space s) is generated.

Figure 13:
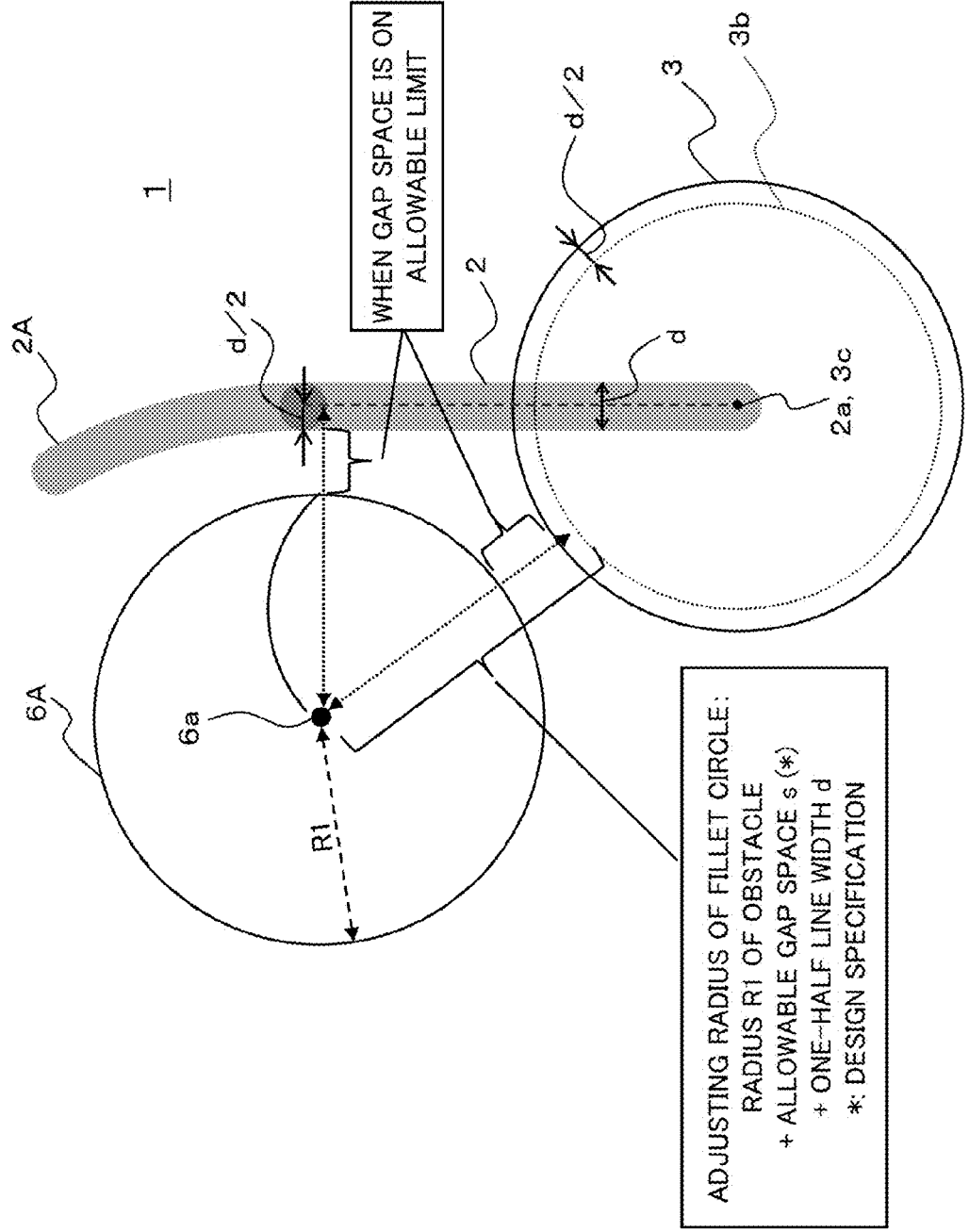

Specifically, as illustrated in FIG. 13, the second calculator 22 calculates, for the radius of the fillet circle 5A, the sum of the radius R1 of the round obstacle 6A, the allowable gap space s serving as the predetermined gap space condition, and the d/2, half the line width d of the straight line 2 (arc line 2A) (see step S11 of FIG. 17). The allowable gap space s is part of the design specification included in the design data 11.

Figure 14:
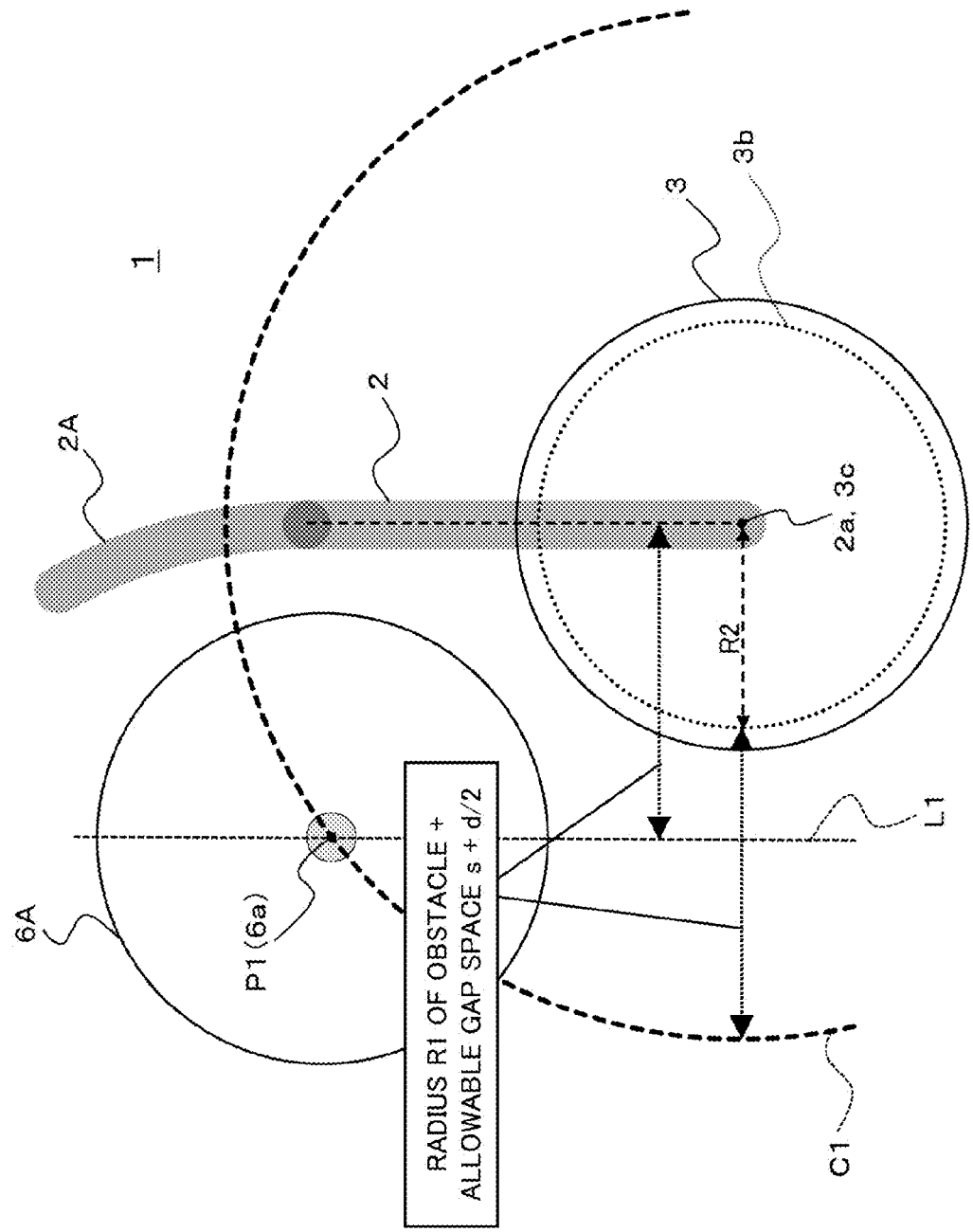

As illustrated in FIG. 14, the second calculator 22 calculates a straight line (second straight line) L1 by translating the center line of the straight line 2 by the sum value R1+s+d/2 towards the round obstacle 6A. The second calculator 22 further calculates a circle C1 having a radius of a total value R2+(R1+s+d/2), that is, the sum of the radius R2 of the round land 3 (offset circle 3b) and the above sum R1+s+d/2, and having a center the same as the center 3c of the round land 3. Then the second calculator 22 obtains the intersection P1 between the straight line L1 and the circle C1 as the center of the adjusted fillet circle 5A (see step S12 of FIG. 17). In the example of FIG. 14, the intersection P1 coincides with the center 6a of the round obstacle 6A. Hereinafter, the wording of "adjusted" is sometimes referred to as the wording "corrected".

Figure 15:
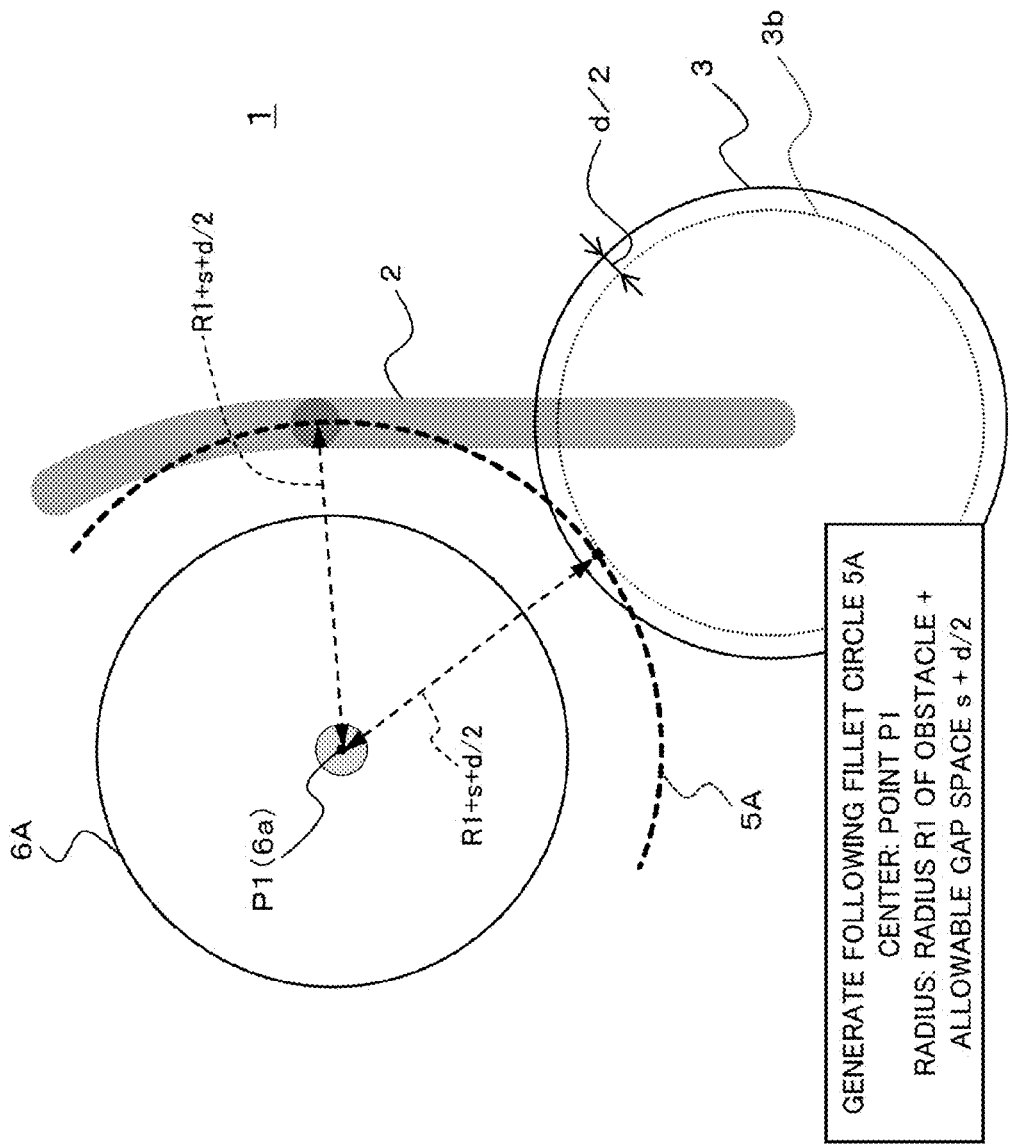

After that, the second calculator 22 calculates a fillet circle (third circle) 5A having a center being the intersection P1 and having a radius of the above sum R1+s+d/2 as illustrated in FIG. 15 (see step S13 of FIG. 17). This means that the fillet circle 5A is modified to have a radius of the sum R1+s+d/2 in place of the value R0. Then, as illustrated in FIG. 16, the second calculator 22 calculates the point of contact between the adjusted fillet circle 5A and the center line of the straight line 2 as a corrected first point A' of contact, and calculates the point of contact between the offset circle 3b of the round land 3 and the corrected fillet circle 5A as the corrected second point B' of contact (step S14 of FIG. 17).

The second calculator 22 calculates and defines the shape of the arc fillet 4A on the side of the round obstacle 6A using the corrected first point A' of contact and the corrected second point B' of contact in place of the first point A of contact and the second point B of contact illustrated in FIG. 12. In other words, the second calculator 22 generates an arc A'B' on the fillet circle 5A from the first point A' of contact and the second point B' of contact as the first arc and defines the shape of the arc fillet 4A on the side of the round obstacle 6A in terms of the generated first arc A'B' (step S15 of FIG. 17).

The second calculator 22 generates, for the side where a round obstacle is absent, an arc CA on the fillet circle 5B between the third point C of contact and the first point A of contact as the second arc likewise the example of FIG. 12 (see step S16 of FIG. 17). The second arc CA defines the shape of the arc fillet 4A on the side where a round obstacle is absent. Further, the second calculator 22 generates a line segment B'C that connects the second point B' of contact and the third point C of contact (see step S17 of FIG. 17). The line segment B'C defines the shape of the arc fillet 4A on the side of the center 3c of the round land 3.

When the round obstacle 6A is present in the vicinity of the round land 3 and the straight line 2 and also when the arc fillet 4A does not satisfy the predetermined gap space condition, the radius and the center of the fillet circle 5A are adjusted by the function (2) of the second calculator 22, so that the shape of the arc fillet 4A is automatically adjusted. This ensures the allowable gap space s, in other words the insulation distance, of the round obstacle 6A with respect to the round land 3 and the straight line 2, as illustrated in FIG. 16.

Figure 18:
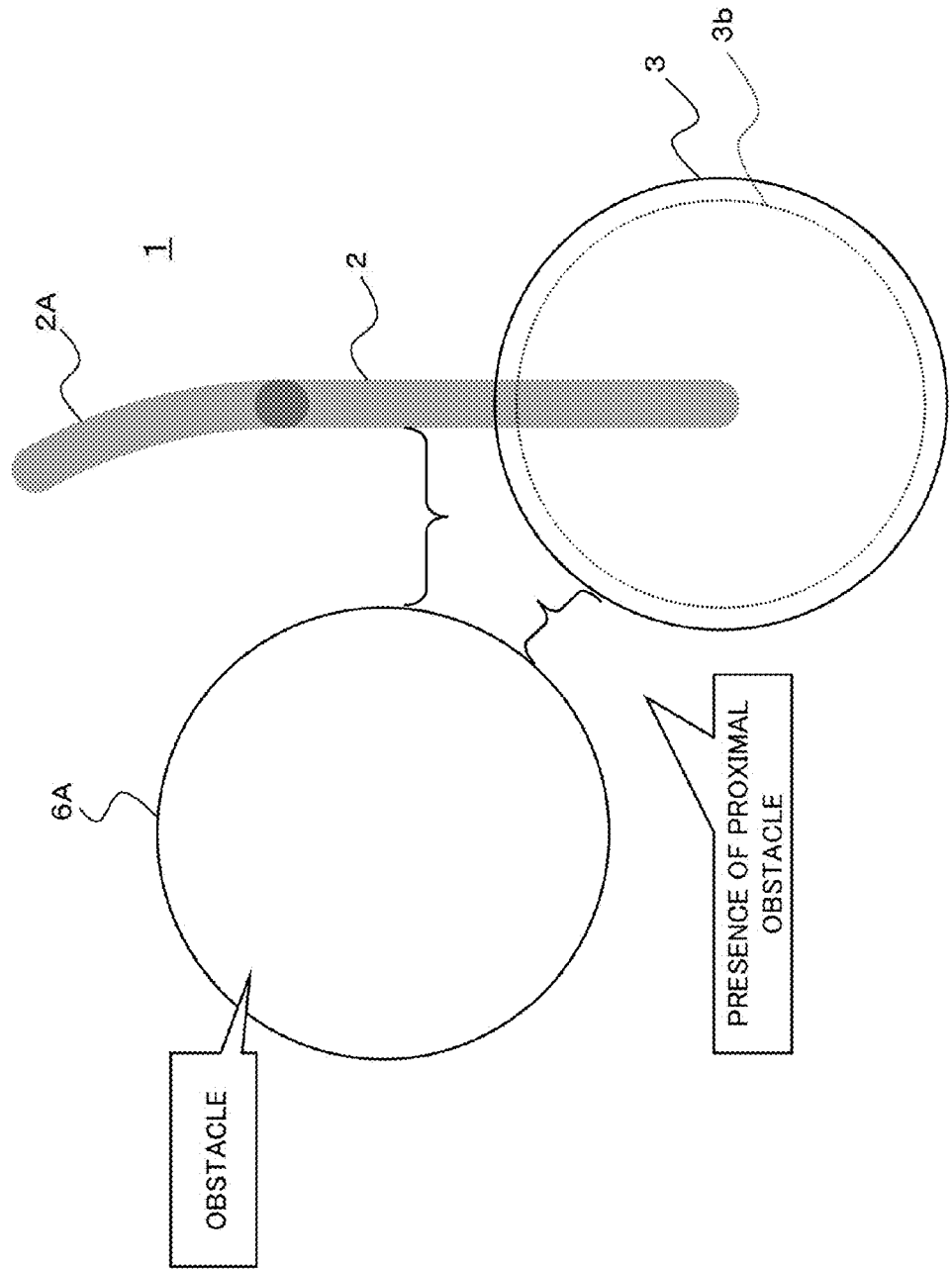
FIGS. 18-23 are diagrams denoting a function of automatically adjusting an arc fillet by a second calculator of the first embodiment.

[3-2-2] Case 2:

Next, as illustrated in FIG. 18, description will now be made in relation to the function and the procedure of automatic adjusting when a round obstacle 6A is arranged in the vicinity of the round land 3 and the straight line (connecting line) 2 for which an arc fillet is to be generated with reference to FIGS. 17 and 18-20. In particular, Case 2 assumes that the distance between the round obstacle 6A and the round land 3 is different from that between the round obstacle 6A and the straight line 2, as illustrated in FIG. 18. In the example of FIG. 18, the distance between the round obstacle 6A and the round land 3 is slightly exceeding the allowable gap space (predetermined threshold) s.

Under this state, when the first calculator 21 generates an arc fillet 4A of the default size, there is a high possibility of the occurrence of a gap space error (not illustrated) between the first arc AB of the arc fillet 4A and the round obstacle 6A. In the event of the gap space error, the processor 20 starts a process using the function (2) of automatic adjusting by the second calculator 22.

Namely, likewise Case 1, the second calculator 22 calculates, as the radius of the fillet circle 5A, the sum of the radius R1 of the round obstacle 6A, the allowable gap space s serving as the predetermined gap space condition, and the d/2, half the line width d of the straight line 2 (arc line 2A) (see step S11 of FIG. 17).

Figure 19:
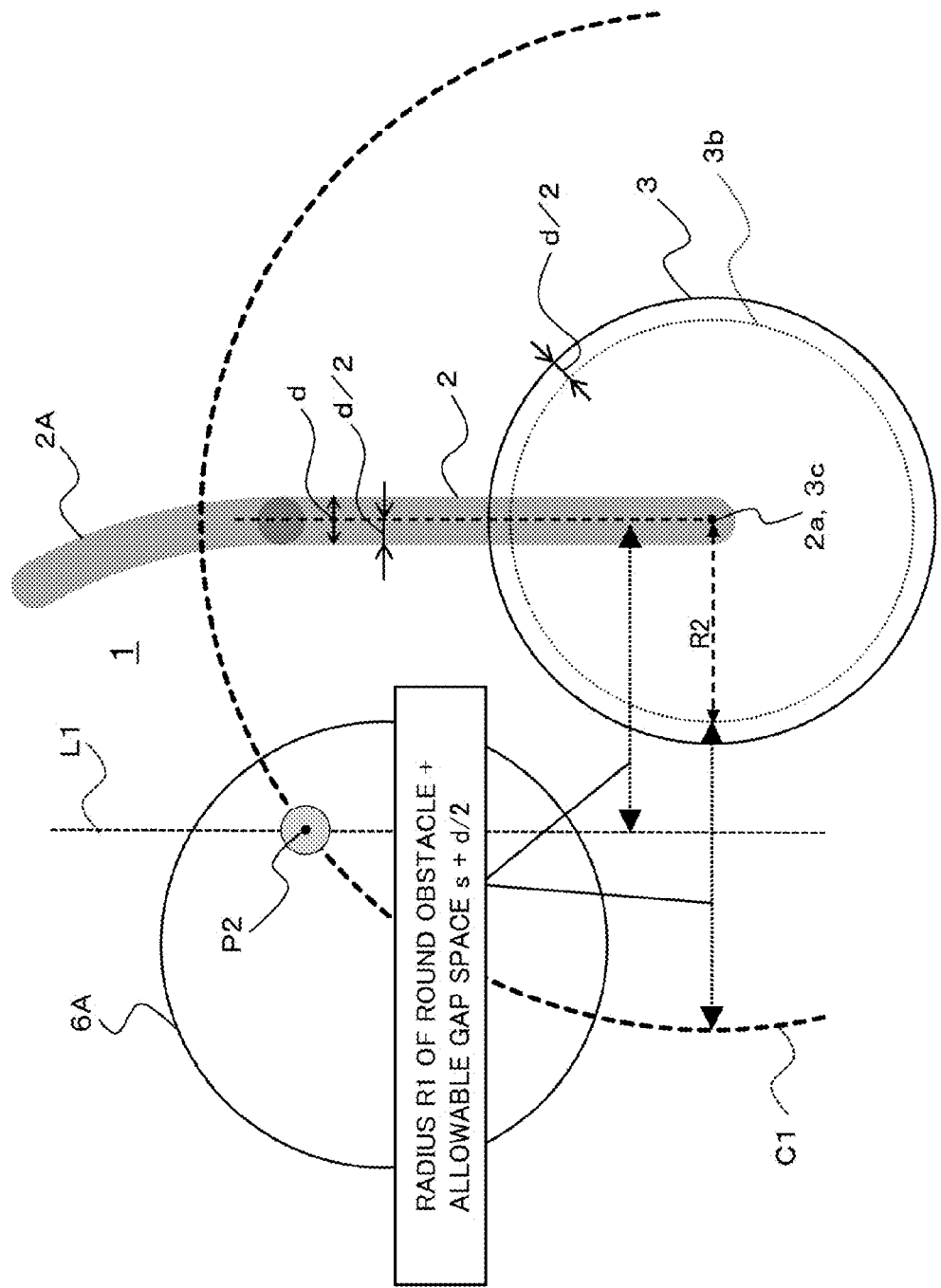

As illustrated in FIG. 19, the second calculator 22 calculates a straight line L1 by translating the center line of the straight line 2 by the sum value R1+s+d/2 towards the round obstacle 6A. The second calculator 22 further calculates a circle C1 having a radius of a total value R2+(R1+s+d/2), that is, the sum of the radius R2 of the round land 3 (offset circle 3b) and the above sum R1+s+d/2, and having a center the same as the center 3c of the round land 3. Then the second calculator 22 obtains the intersection P2 between the straight line L1 and the circle C1 as the center of the adjusted fillet circle 5A (step S12 of FIG. 17).

Figure 20:
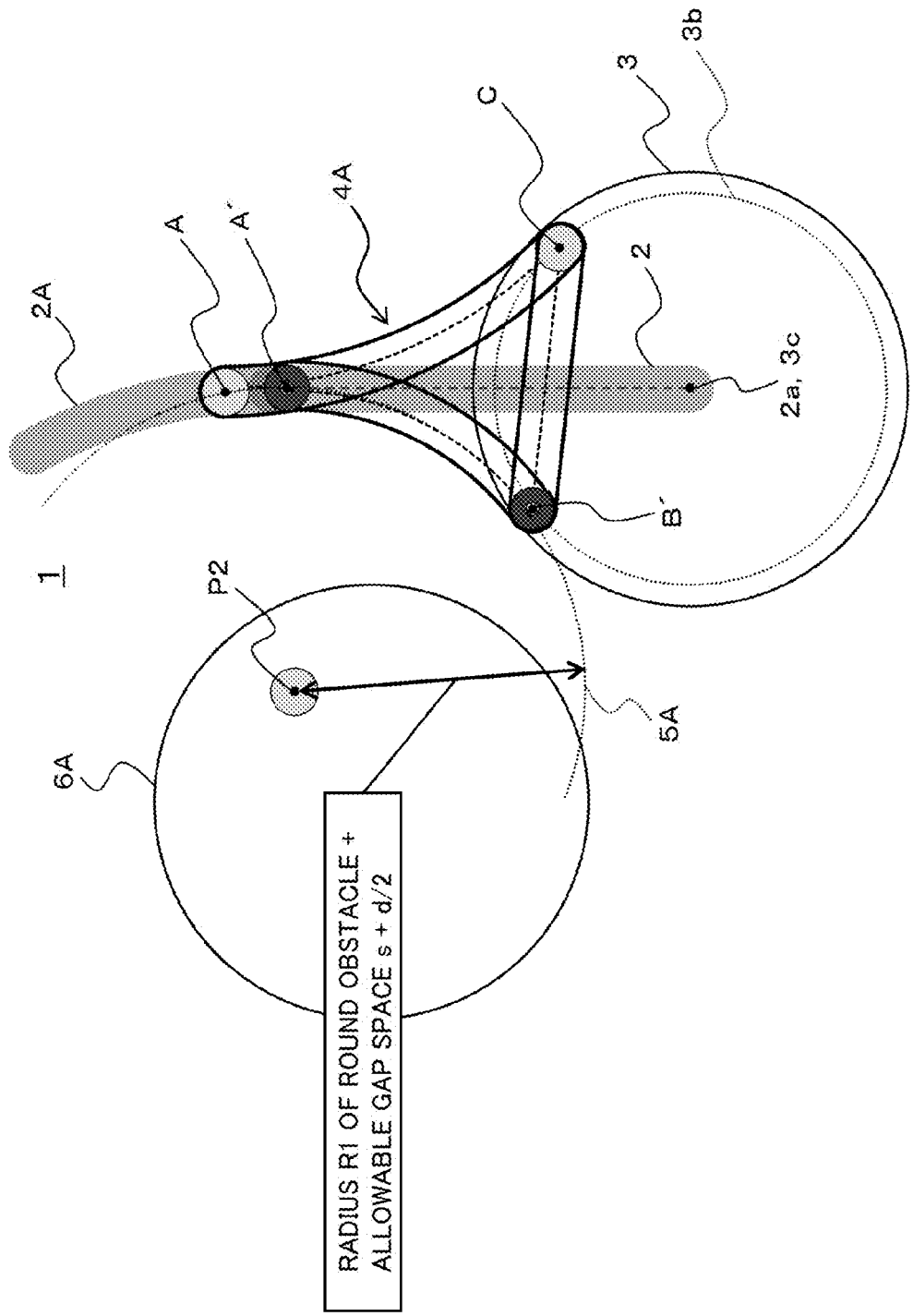

After that, the second calculator 22 calculates a fillet circle (third circle) 5A having a center being the intersection P2 and having a radius of the above sum R1+s+d/2 as illustrated in FIG. 20 (see step S13 of FIG. 17). This means that the fillet circle 5A is modified to have a radius of the sum R1+s+d/2 in place of the value R0. Then, as illustrated in FIG. 20, the second calculator 22 calculates the point of contact between the adjusted fillet circle 5A and the center line of the straight line 2 as a corrected first point A' of contact, and calculates the point of contact between the offset circle 3b of the round land 3 and the corrected fillet circle 5A as the corrected second point B' of contact (step S14 of FIG. 17).

Likewise Case 1 described with reference to FIG. 16, the second calculator 22 adjusts and defines the shape of the arc fillet 4A as illustrated in FIG. 20 (see steps S15-S17 of FIG. 17). As described above, when the round obstacle 6A is present in the vicinity of the round land 3 and the straight line 2 and also when the arc fillet 4A has a high possibility of not satisfying the predetermined gap space condition, the radius and the center of the fillet circle 5A are adjusted by the function (2) exerted by the second calculator 22, so that the shape of the arc fillet 4A is automatically adjusted. This ensures the insulation distance of the round obstacle 6A with respect to the round land 3 and the straight line 2, as illustrated in FIG. 20.

Figure 21:
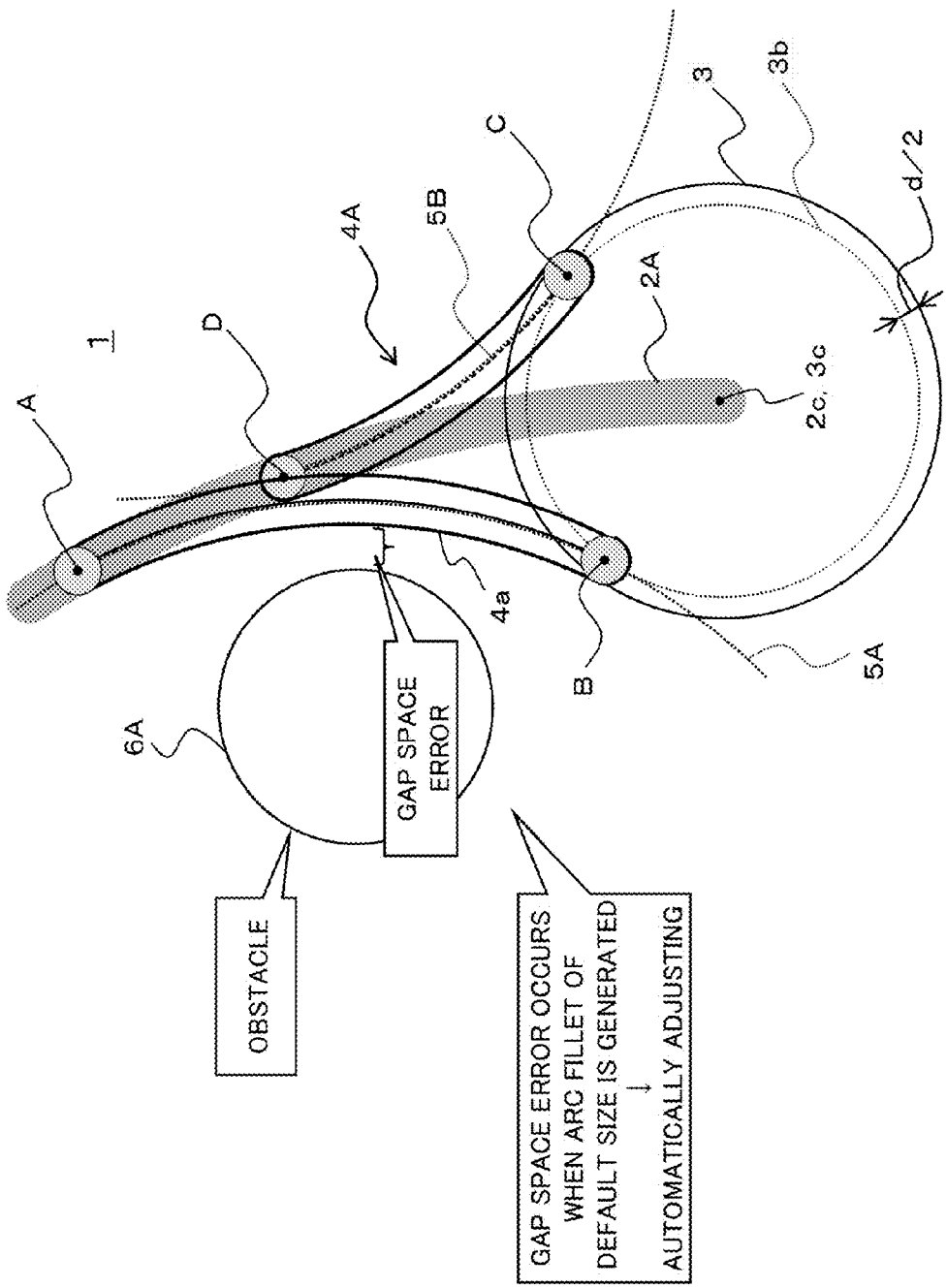

[3-2-3] Case 3:

Next, as illustrated in FIG. 21, description will now be made in relation to the function and the procedure of automatic adjusting when a round obstacle 6A is arranged in the vicinity of the round land 3 and the arc line (connecting line) 2A for which an arc fillet 4A is to be generated with reference to FIGS. 17 and 21-23. In particular, Case 3 assumes that a gap space error occurs between the first arc AB (arc line 4a) of the arc fillet 4A and the round obstacle 6A as illustrated in FIG. 21 when the first calculator 21 generates the arc fillet 4A of the default size in the same manner as that of FIG. 5. In the event of occurrence of a gap space error, the processor 20 starts the process of the function (2) of automatic adjusting by the second calculator 22.

Figure 22:
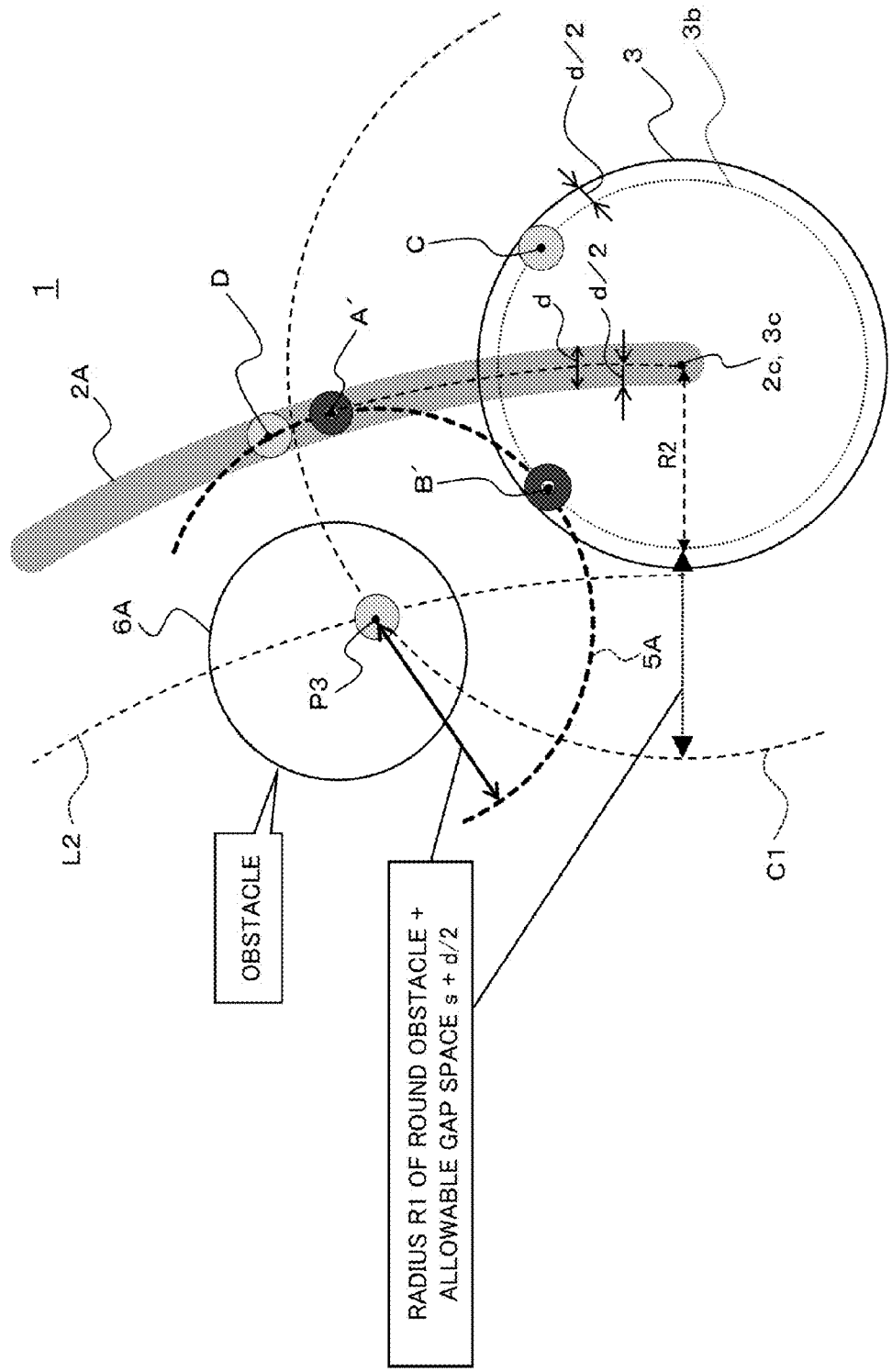
Figure 23:
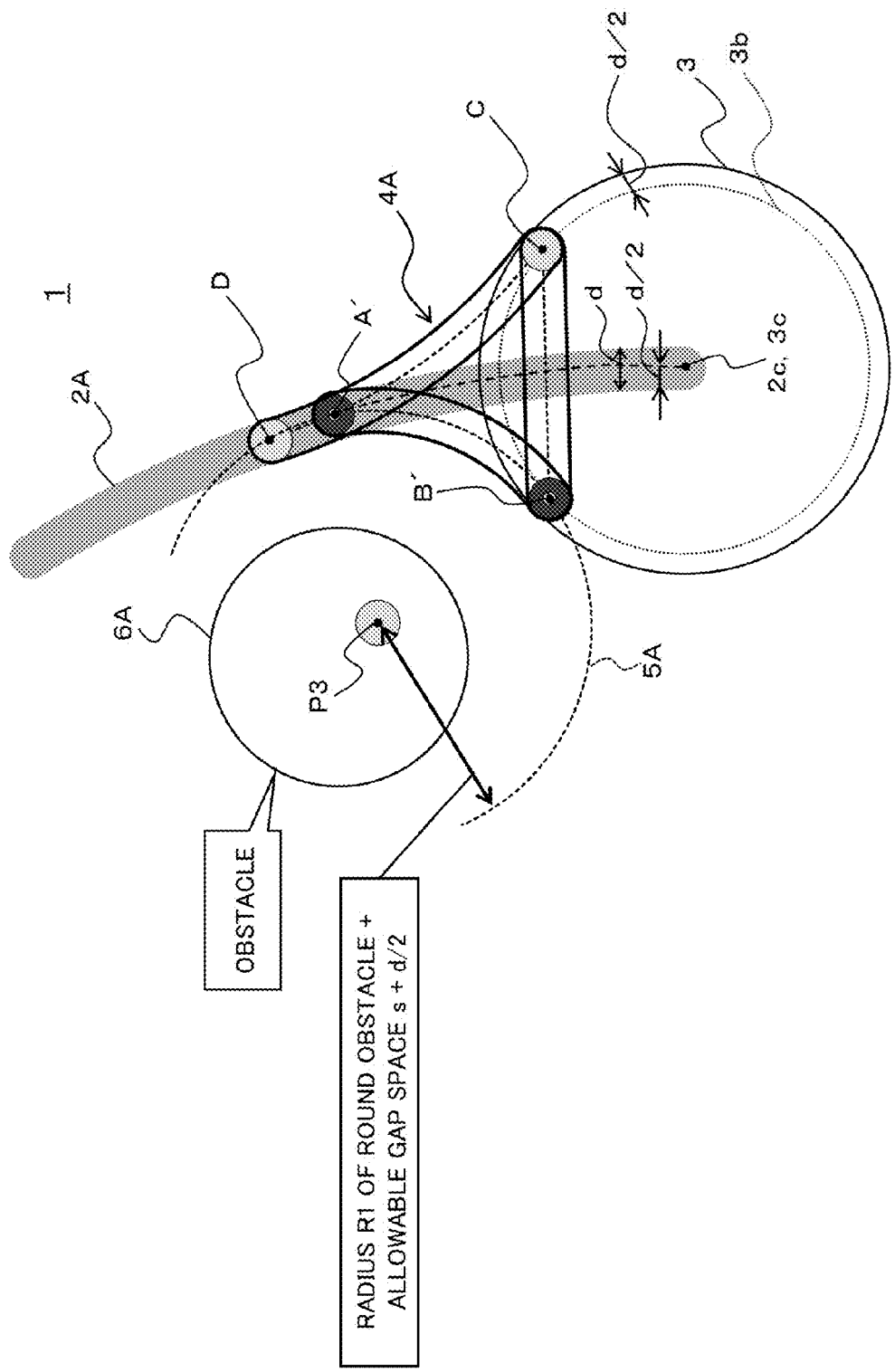

As illustrated in FIGS. 22 and 23, the second calculator 22 adjusts the radius and the center position P3 of the fillet circle 5A such that an arc fillet 4A that satisfies the predetermined gap space condition (i.e., the gap space being equal to or more than the allowable gap space s) is generated.

Specifically, as illustrated in FIG. 22, the second calculator 22 calculates, as the radius of the fillet circle 5A, the sum of the radius R1 of the round obstacle 6A, the allowable gap space s serving as the predetermined gap space condition, and the d/2, half the line width d of the arc line 2A (see step S11 of FIG. 17).

As illustrated in FIG. 22, the second calculator 22 calculates a line (arc) L2 by translating the center line of the arc line 2A by the sum value R1+s+d/2 towards the round obstacle 6A. The second calculator 22 further calculates a circle C1 having a radius of a total value R2+(R1+s+d/2), that is, the sum of the radius R2 of the round land 3 (offset circle 3b) and the above sum R1+s+d/2, and having a center the same as the center 3c of the round land 3. Then the second calculator 22 obtains the intersection P3 between the line L2 and the circle C1 as the center of the adjusted fillet circle 5A (step S12 of FIG. 17).

After that, the second calculator 22 calculates a fillet circle (third circle) 5A having a center being the intersection P3 and having a radius of the above sum R1+s+d/2 as illustrated in FIG. 22 (see step S13 of FIG. 17). This means that the fillet circle 5A is modified to have a radius of the sum R1+s+d/2 in place of the value R0. Then, as illustrated in FIG. 22, the second calculator 22 calculates the point of contact between the adjusted fillet circle 5A and the center line of the straight line 2 as a corrected first point A' of contact, and calculates the point of contact between the offset circle 3b of the round land 3 and the corrected fillet circle 5A as the corrected second point B' of contact (step S14 of FIG. 17).

The second calculator 22 calculates and defines the shape of the arc fillet 4A on the side of the round obstacle 6A using the corrected first point A' of contact and the corrected second point B' of contact in place of the first point A of contact and the second point B of contact illustrated in FIG. 21. In other words, the second calculator 22 generates, as illustrated in FIG. 23, an arc A'B' on the fillet circle 5A between the first point A' of contact and the second point B' of contact as a first arc, and generates an arc DA' that connects the first point A' of contact on the fillet circle 5A and the fourth point D of contact on the arc line 2A as the third arc. Then the second calculator 22 defines the shape of the arc fillet 4A on the side of the round obstacle 6A in terms of the first arc A'B' and the third arc DA' (step S15 of FIG. 17).

The second calculator 22 generates, for the side where a round obstacle is absent, an arc CA on the fillet circle 5B between the third point C of contact and the first point A of contact as the second arc in the same manner as that of FIG. 5 (see step S16 of FIG. 17). The second arc CA defines the shape of the arc fillet 4A on the side where a round obstacle is absent. Further, the second calculator 22 generates a line segment B'C that connects the second point B' of contact and the third point C of contact (see step S17 of FIG. 17). The line segment B'C defines the shape of the arc fillet 4A on the side of the center 3c of the round land 3.

When the round obstacle 6A is present in the vicinity of the round land 3 and the arc line 2A and also when the arc fillet 4A does not satisfy the predetermined gap space condition, the radius and the center of the fillet circle 5A are adjusted by the function (2) exerted by the second calculator 22, so that the shape of the arc fillet 4A is automatically adjusted. This ensures the insulation distance s of the round obstacle 6A with respect to the round land 3 and the arc line 2A, as illustrated in FIG. 23.

[3-3] Function and Specific Process of the Third Calculator:

Description will now be made in relation to the above function (3) exerted by the third calculator 23 and the process performed by the third calculator 23 with reference to FIGS. 24-28. FIGS. 24-28 denote a function (3) of generating an arc fillet 4A by the third calculator 23 according to the first embodiment. Hereinafter, like reference numbers designate the same or the substantially same elements and parts detailed above, so repetitious description is omitted here.

Figure 24:
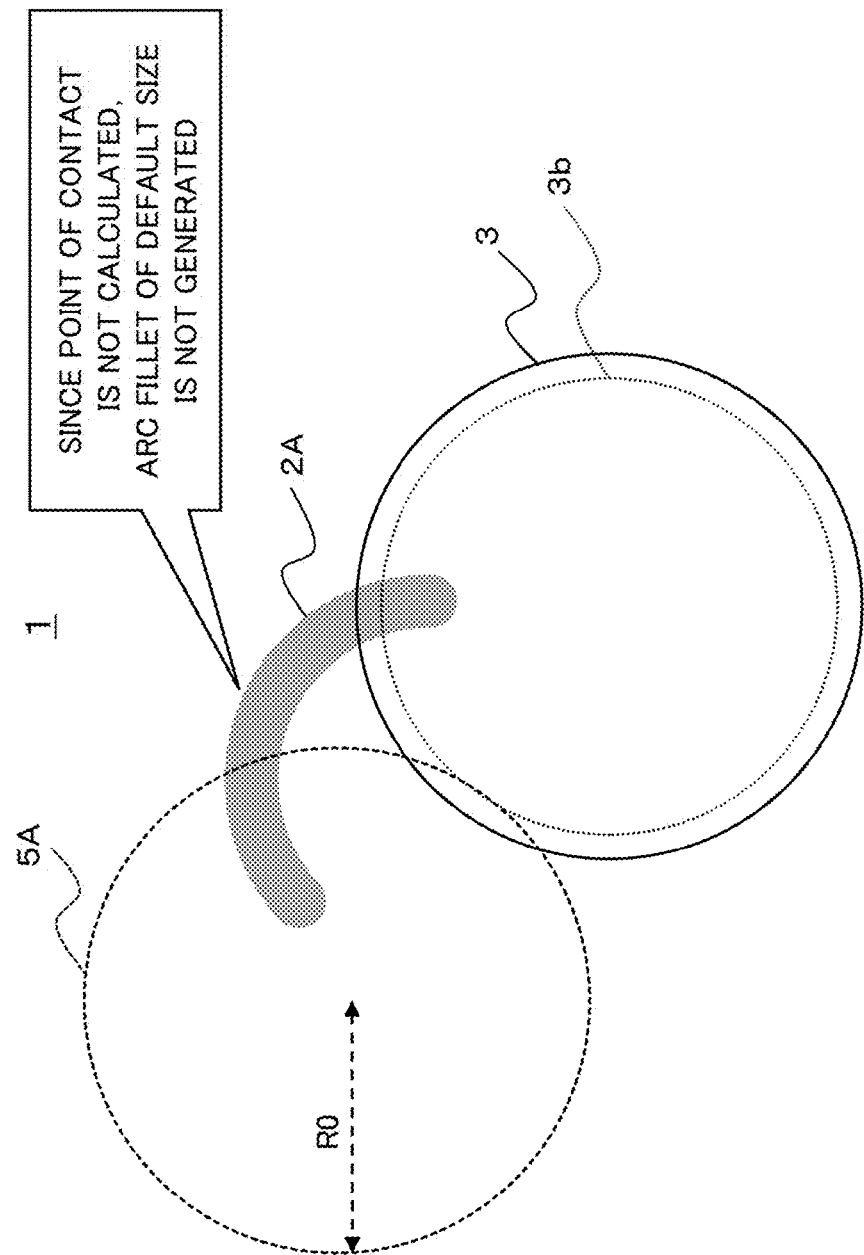
FIGS. 24-28 are diagrams denoting a function of generating an arc fillet by a third calculator of the first embodiment.
Figure 25:
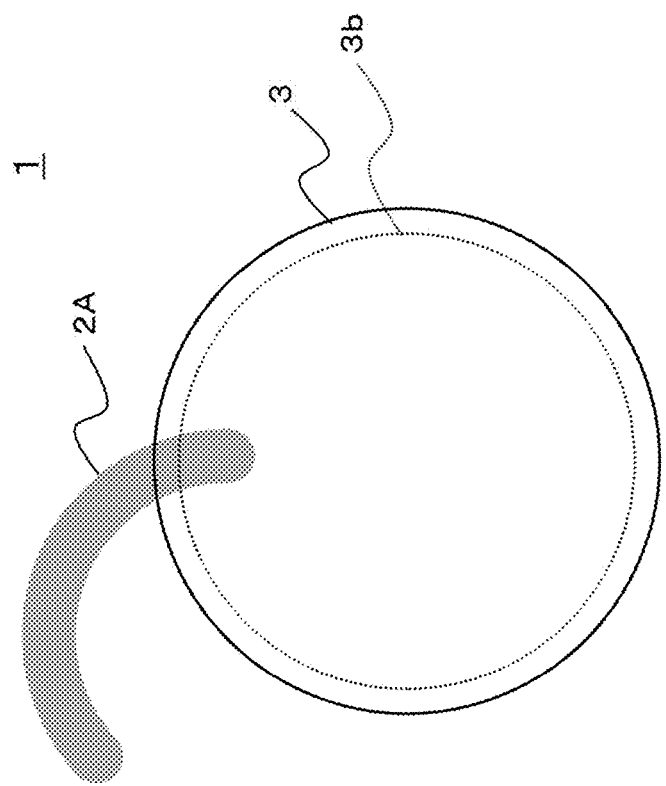

The function (3) of the third calculator 23 deals with cases where, as illustrated in FIGS. 24 and 25, the radius of an arc line (connecting line) 2A connected to the round land 3 is smaller than the radius R0 of the fillet circle 5A, so that the function (1) fails to generate the first to fourth points A-D of contact and generate an arc fillet 4A of the default size.

In this case, the third calculator 23 uses an allowable gap space s1 in the same net in place of the radius R0 (i.e., the first and second radii) of the fillet circles 5A and 5B to calculate the first to fourth points A-D of contact and calculate and generate the region (shape) of the arc fillet 4A.

Here, the allowable gap space s1 of the same net is a value previously set for the net to which the round land 3 and the arc line 2A pertain, and is included, as the design specification, in the design data 11.

Figure 26:
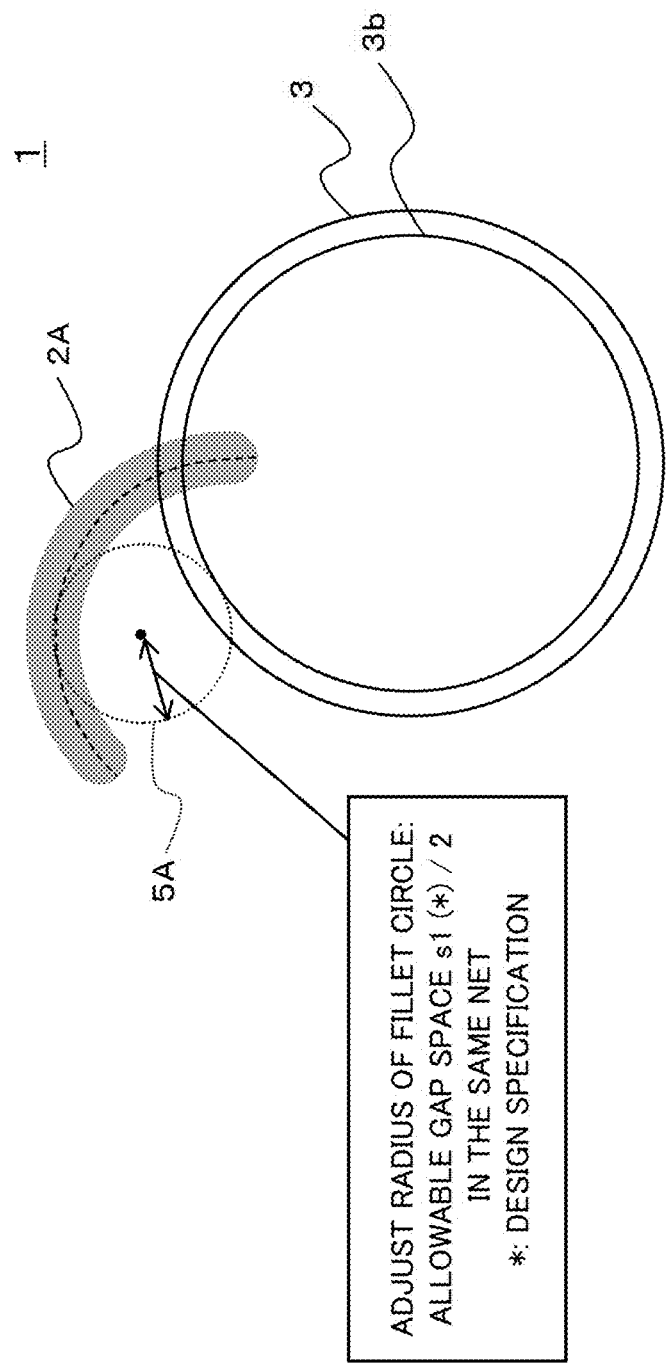

In other words, the third calculator 23 modifies (adjusts), as illustrated in FIG. 26, the radius R0 of the fillet circles 5A and 5B to s1/2, half the allowable gap space S1 in the same net. Then, the third calculator 23 calculates and generates the region (shape) of the arc fillet 4A based on the fillet circles 5A and 5B having the modified radius using the same function as the function (1) of the first calculator 21 described with reference to FIGS. 4-6.

Figure 27:
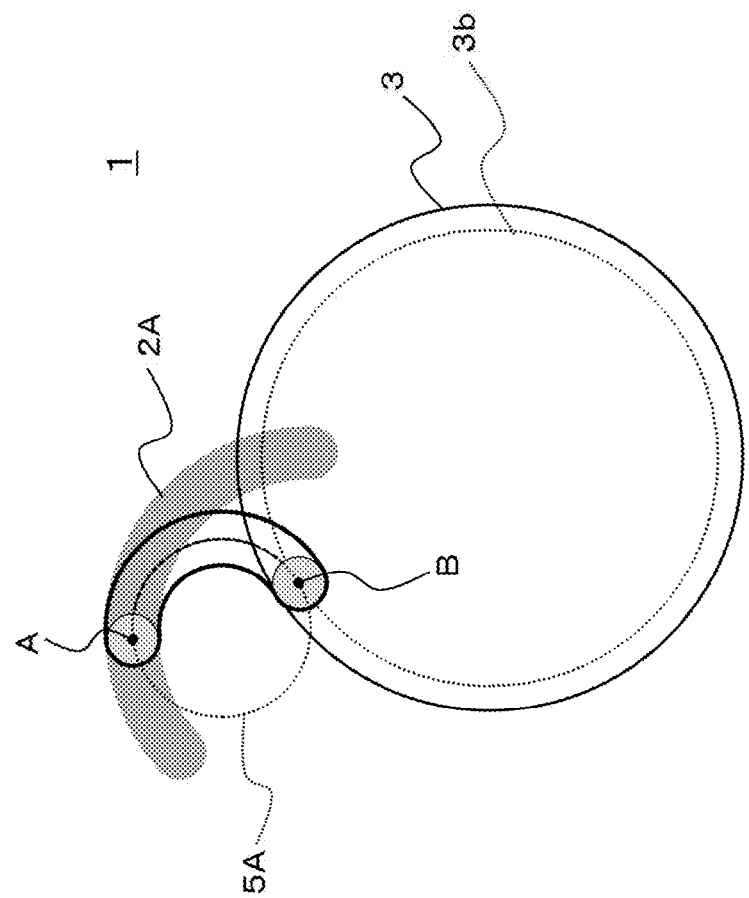

Specifically, as illustrated in FIG. 27, the third calculator 23 calculates the first point A of contact and the second point B of contact on the fillet circle 5A having the radius s1/2 and being in contact with both the round land 3 and the arc line 2A and generates the first arc AB. The first point A of contact is a point of contact between the center line of the arc line 2A and the fillet circle 5A while the second point B of contact is a point of contact between the offset circle 3b of the round land 3 and the fillet circle 5A.

Figure 28:
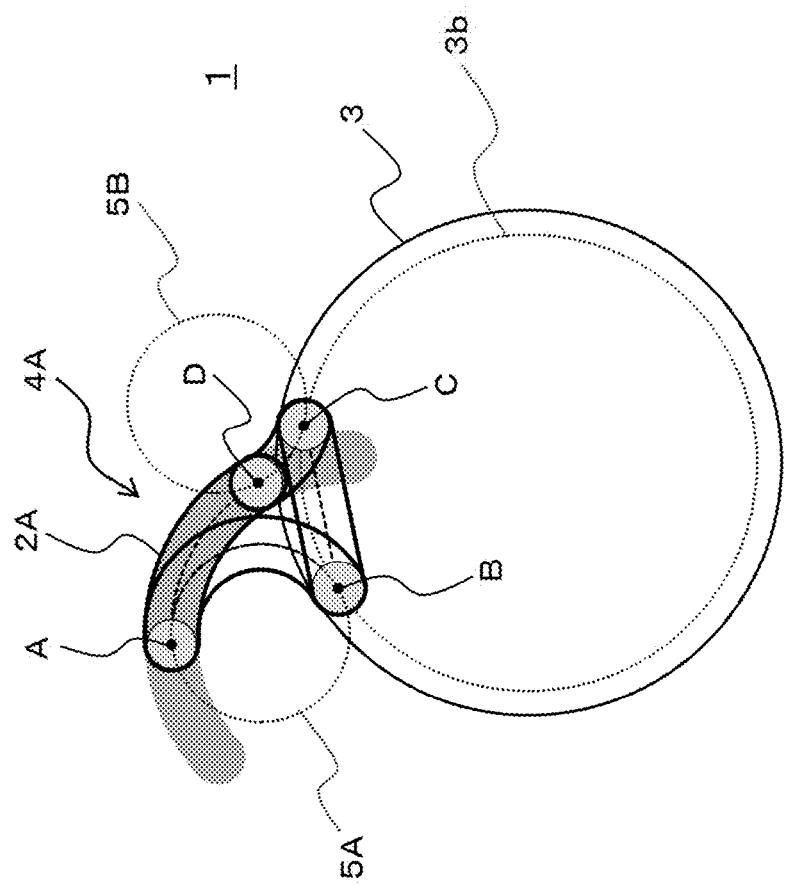

After that, in the same manner as that of the example of FIG. 5, the third calculator 23 calculates the third point C of contact and the fourth point D of contact using the fillet circle 5B having the radius s1/2, as illustrated in FIG. 28 and generates the second arc CD, the third arc DA, and the line segment BC. In this manner, as illustrated in FIG. 28, an arc fillet 4A is generated for the connection between the round land 3 and the arc line 2A having a smaller radius than the radius R0.

Thereby, even when the radius of the arc line 2A connected to the round land 3 is smaller than the radius R0 of the fillet circle 5A to make it impossible to generate an arc fillet 4A of the default size, an arc fillet 4A can be generated, maintaining the allowable gap space s1 in the same net.

[3-4] Function and Specific Process of the Fourth Calculator:

Next, description will now be made in relation to the above function (4) of the fourth calculator 24 and a specific process performed by the fourth calculator 24 by referring to FIGS. 29-32, which describe the function (4) of generating an arc fillet 4A by the fourth calculator 24 of the first embodiment. Hereinafter, like reference numbers designate the same or the substantially same elements and parts detailed above, so repetitious description is omitted here.

Figure 29:
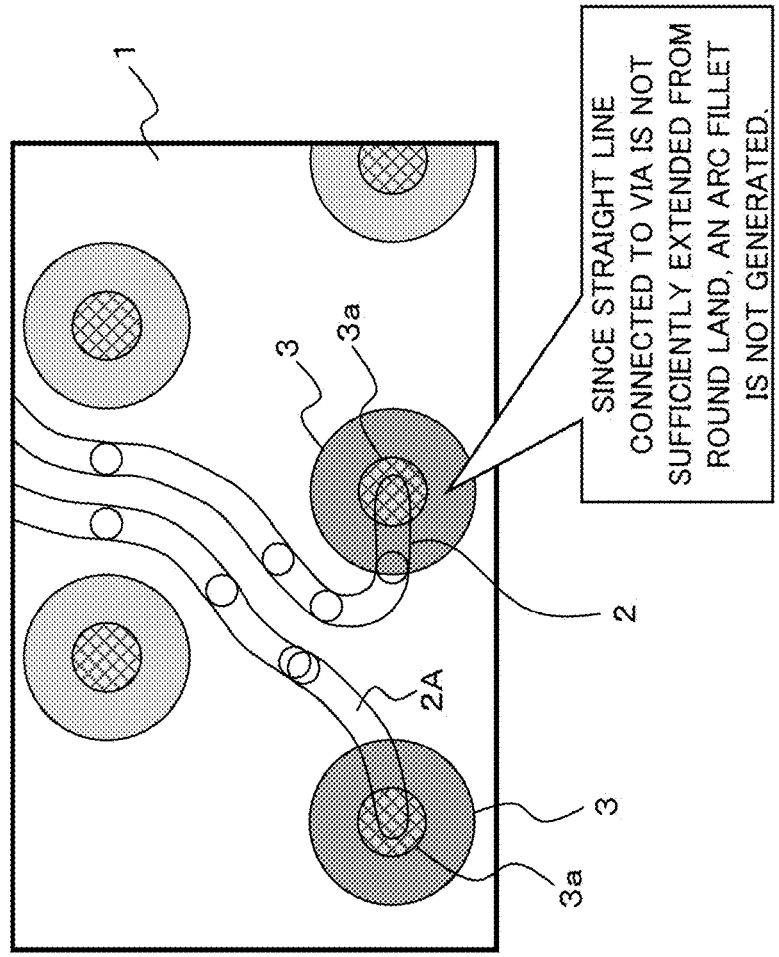
FIGS. 29-32 are diagrams denoting a function of generating an arc fillet by a fourth calculator of the first embodiment.

The function (4) of the fourth calculator 24 deals with cases where, as illustrated in FIG. 29, the straight line 2 or the arc line 2A connected to the round land 3 (via 3a) is too short to calculate and generate the region of the arc fillet 4A by the first calculator 21. In this case, the fourth calculator 24 searches for a line connected to the straight line 2 or the arc line 2A that has failed in generating an arc fillet 4A, and calculates and generates the region of the arc fillet 4A for the searched line.

Figure 30:
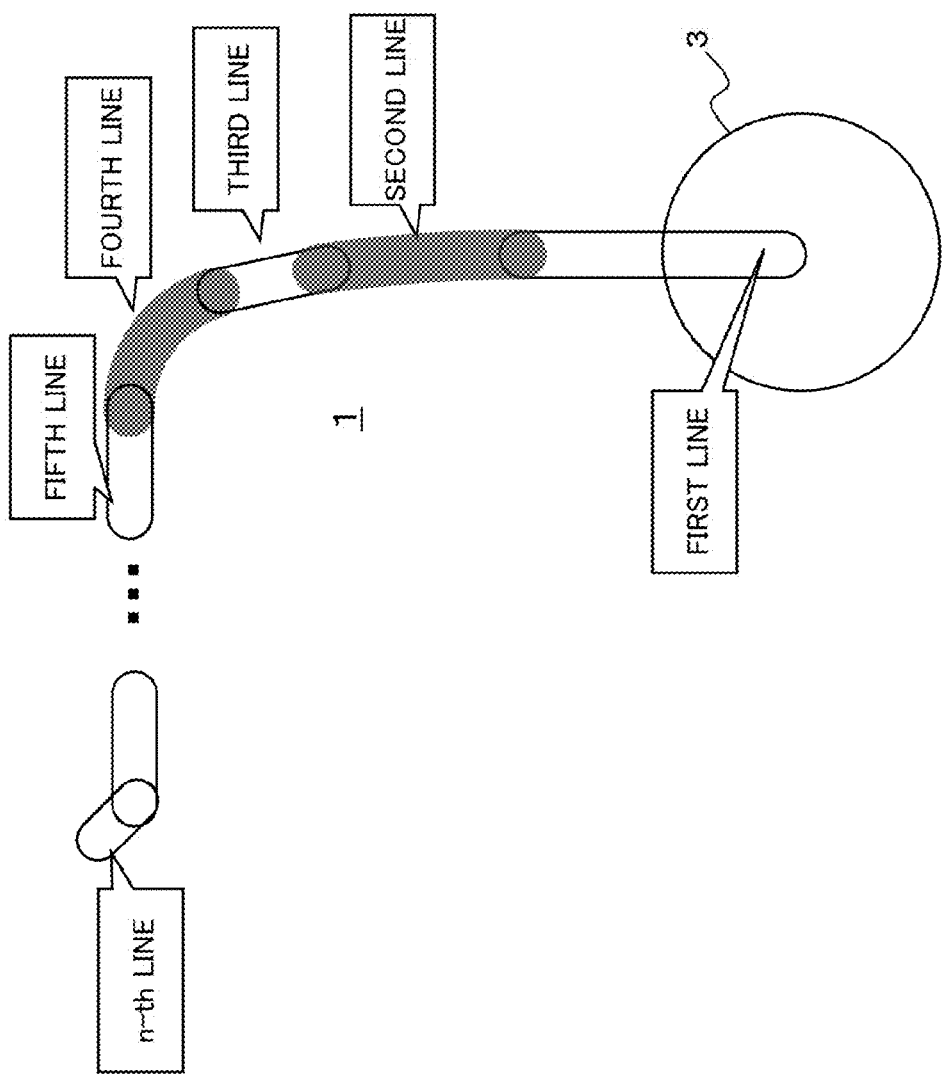

The design data 11 includes information about a line connected to a straight line 2 or an arc line 2A connected to a round land 3. As illustrated in FIG. 30, the first line is connected to the round land 3, which is an element to be provided with an arc fillet. The subsequent lines connected to the first line are divided in a unit of a line segment or an arc, and are called the second line, the third line, . . . , the n-th line (where, n is an integer). The design data 11 includes information related to a round land 3 and to the first through n-th lines that are directly or indirectly connected to the round land 3. The fourth calculator 24 can read subsequent lines connected to the first line in a unit of one segment (segment by segment) by referring to the information of the lines included in the design data 11.

In cases where the first line (connecting line) 2 or 2A connected to a round land 3 is too short to calculate the first point A through the fourth point D of connection on the fillet circles 5A and 5B, the fourth calculator 24 reads the line connected in series to the first line one by one from the design data 11. The fourth calculator 24 calculates the first point A through the fourth point D of connection and an arc fillet 4A using each read line subsequent to the first line.

Figure 31:
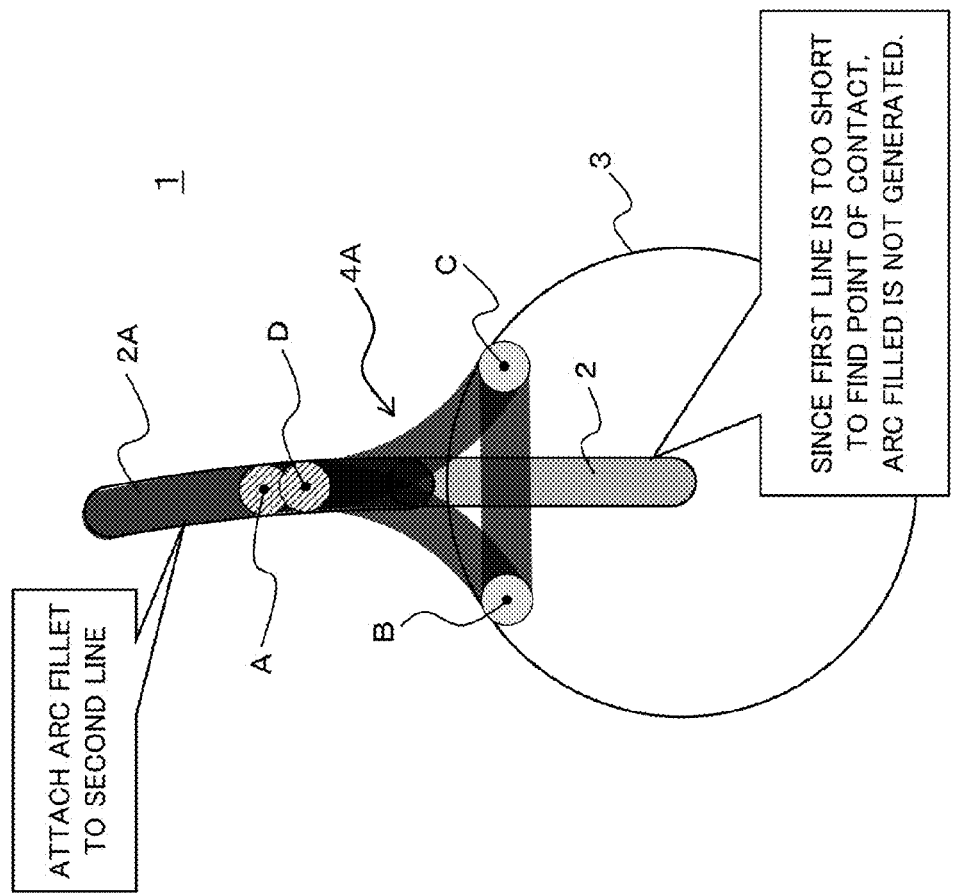

In an example of FIG. 31, the first line 2(2A) connected to the round land 3 is too short to find a point of contact between the round line 3 and the first line 2(2A). Then the fourth calculator 24 reads the second line 2 subsequent to the first line 2(2A) and uses the second line and the round land 3 to calculate the first point A through the fourth point D of connection on the fillet circles 5A and 5B, so that the arc fillet 4 is successfully generated. In cases where the first line is short likewise in this case, the fourth calculator 24 uses the second line, the third line, . . . , the n-th line in succession to search for the first point A through the fourth point D of contact on the fillet circles 5A and 5B. Thereby, even in cases where the first line connected to the round land 3 is too short to calculate and generate the region of an arc fillet 4A by the first calculator 21, the fourth calculator 24 can calculate and generate the region of the arc fillet 4A.

Besides, in cases where the read subsequent line(s) and the first line partially protrude from an arc that defines the region of the arc fillet 4A calculated using the read subsequent line, the fourth calculator 24 does not adopt the arc fillet 4A, that is, does not generate the arc fillet 4A. In other words, when the arc fillet 4A is generated using the round land 3 and the n-th line and also when the first to (n−1)-th lines partially protrudes from the shape of the arc fillet 4A, the fourth calculator 24 does not generate the arc fillet 4A.

Figure 32:
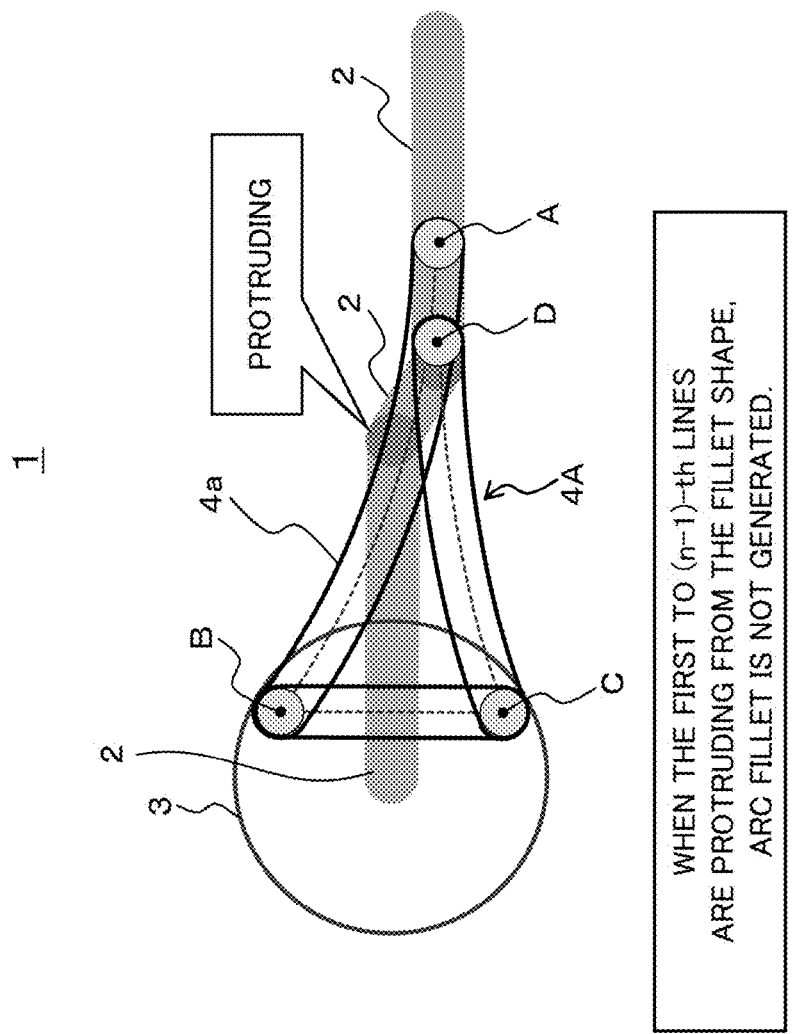

FIG. 32 illustrates an example that at least one of the read lines partially protrudes from an arc defining the arc fillet 4A calculated using the read subsequent line. Specifically, FIG. 32 illustrates an example that when an arc fillet 4A is generated using the round land 3 and the third line, the first line 2 and the second line 2 partially protrude from the arc side 4a of the arc fillet 4A. Under a state where a line 2 protrudes from the arc fillet 4A, the arc fillet 4A hardly prevents the via connecting conductor from peeling off, so that the reliability of the connection is not improved. For the above, the arc fillet 4A is not generated under a such state.

[3-5] Function and Specific Process of the Fifth Calculator:

Next, description will now be made in relation to the above function (5) of the fifth calculator 25 and the specific process performed by the fifth calculator 25 of the first embodiment with reference to FIGS. 33-38. The fifth calculator 25 calculates and generates the region (shape) of an arc fillet 4A of the default size for each connection on the basis of the design data 11.

Figure 33:
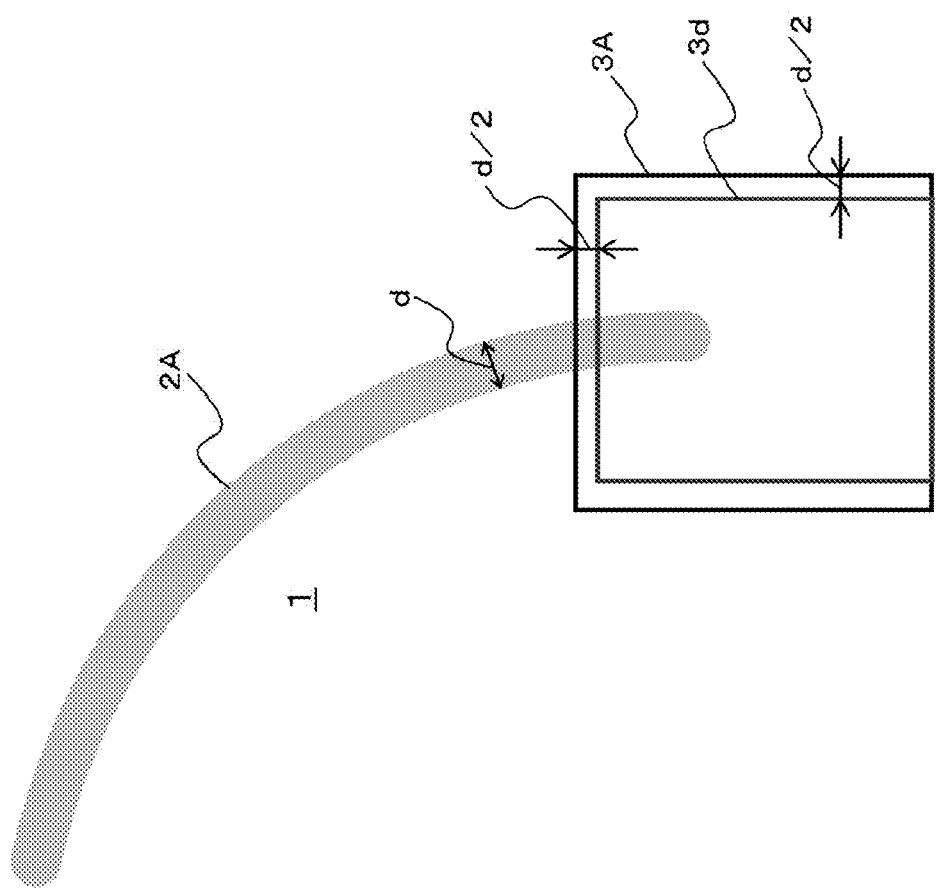
FIGS. 33 and 34 are diagrams denoting a function of generating an arc fillet at a connection between a rectangular land and an arc line to be connected to the rectangular land by a fifth calculator of the first embodiment.
Figure 34:
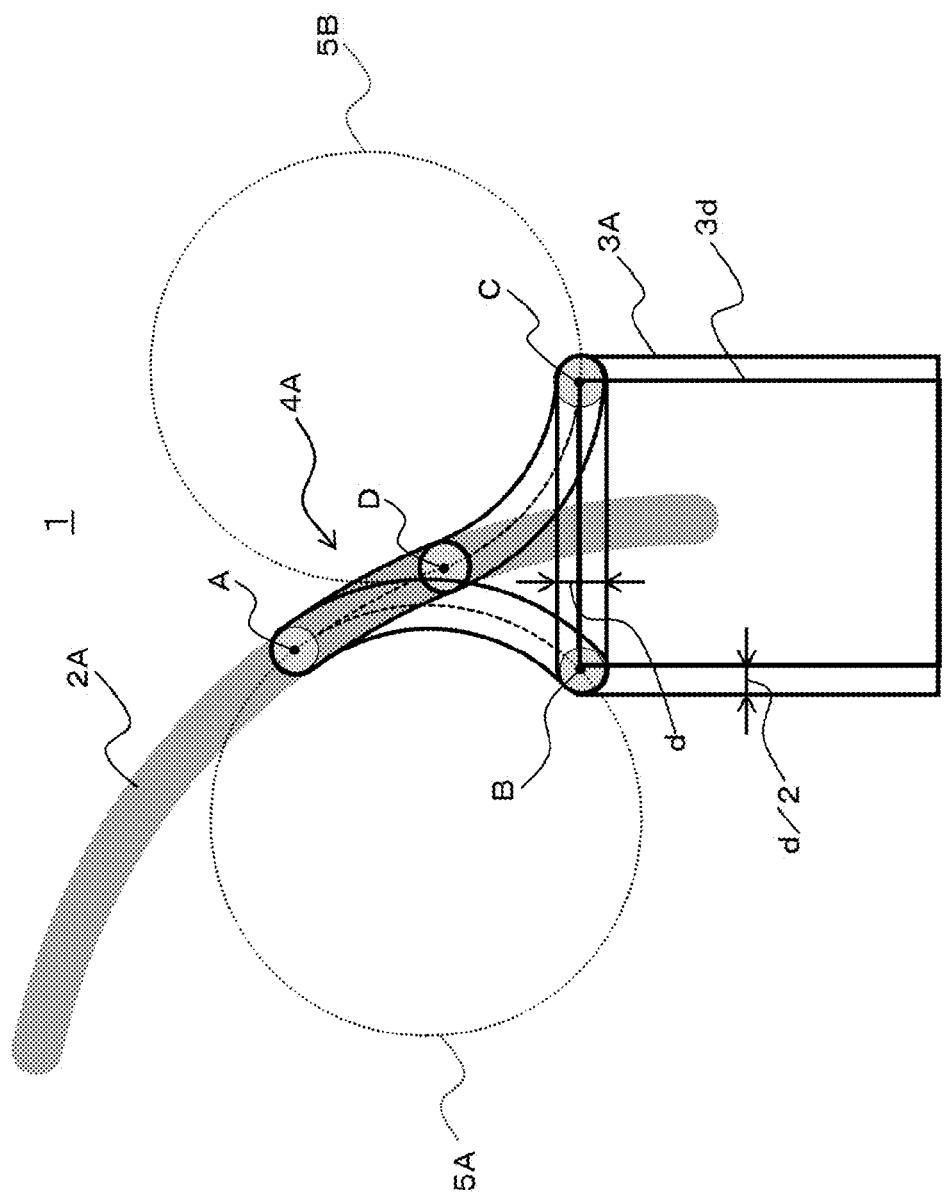

[3-5-1] Function for Generating an Arc Fillet at the Connection Between a Rectangular Land and an Arc Line:

FIGS. 33 and 34 denote the function (5) of generating an arc fillet 4A at the connection between a rectangular land 3A and an arc line (connecting line) 2A connected to the rectangular land 3A by the fifth calculator 25. Hereinafter, like reference numbers designate the same or the substantially same elements and parts detailed above, so repetitious description is omitted here.

The fifth calculator 25 calculates and generates an arc fillet 4A (see FIG. 34) at the connection (see FIG. 33) between a rectangular land 3A and an arc line 2A connected to the rectangular land 3A as follows. An example of the rectangular land 3A is a part pin in FIGS. 33 and 34. The offset rectangular 3d is a rectangular obtained by offsetting the outer circumference of the rectangular land 3A by the (d/2), half the width d of the line 2, 2A and is treated as the substantial outer circumference of the rectangular land 3A.

First of all, the fifth calculator 25 calculates the first point A of contact and the second point B of contact on the fillet circle 5A having a radius R0 and being in contact with both the rectangular land 3A and the arc line 2A. The first point A of contact is the point of contact between the center line of the arc line 2A and the fillet circle 5A while the second point B of contact is the point of contact between the offset rectangular 3d of the rectangular land 3A and the fillet circle 5A.

Likewise, the fifth calculator 25 calculates the third point C of contact and the fourth point D of contact of the fillet circle 5B having a radius R0 and being in contact with a rectangular land 3A and an arc line 2A at the opposite side of the fillet circle 5A. The third point C of contact is the point of contact between the offset rectangular 3d of the rectangular land 3A and the fillet circle 5B while the fourth point D of contact is the point of contact between the center line of the arc line 2A and the fillet circle 5B.

Then the fifth calculator 25 calculates, as the arc fillet 4A, a region surrounded by the first arc AB, the second arc CD, the third arc DA, and the line segment BC, so that the arc fillet 4A can be generated also at the connection between the rectangular land 3A and the arc line 2A as illustrated in FIG. 34.

Figure 35:
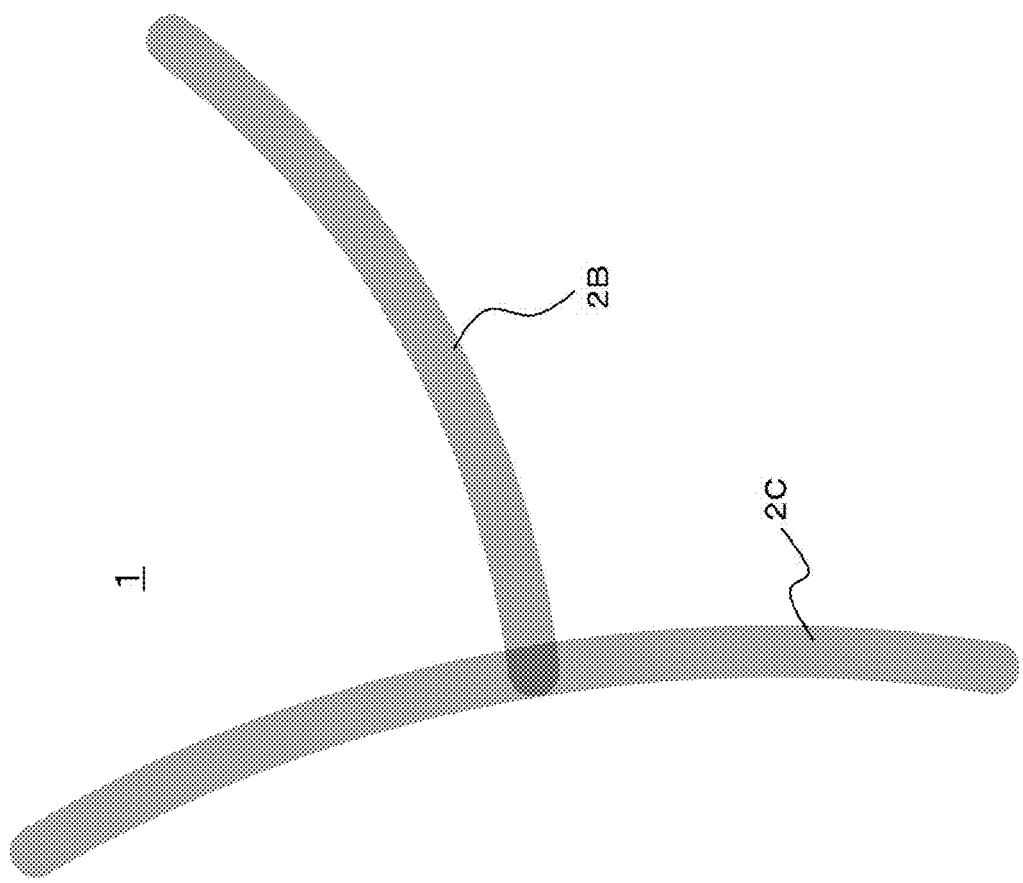
FIGS. 35 and 36 are diagrams illustrating a function of generating an arc fillet at a T-shape connection between two arc lines by a fifth calculator of the first embodiment.
Figure 36:
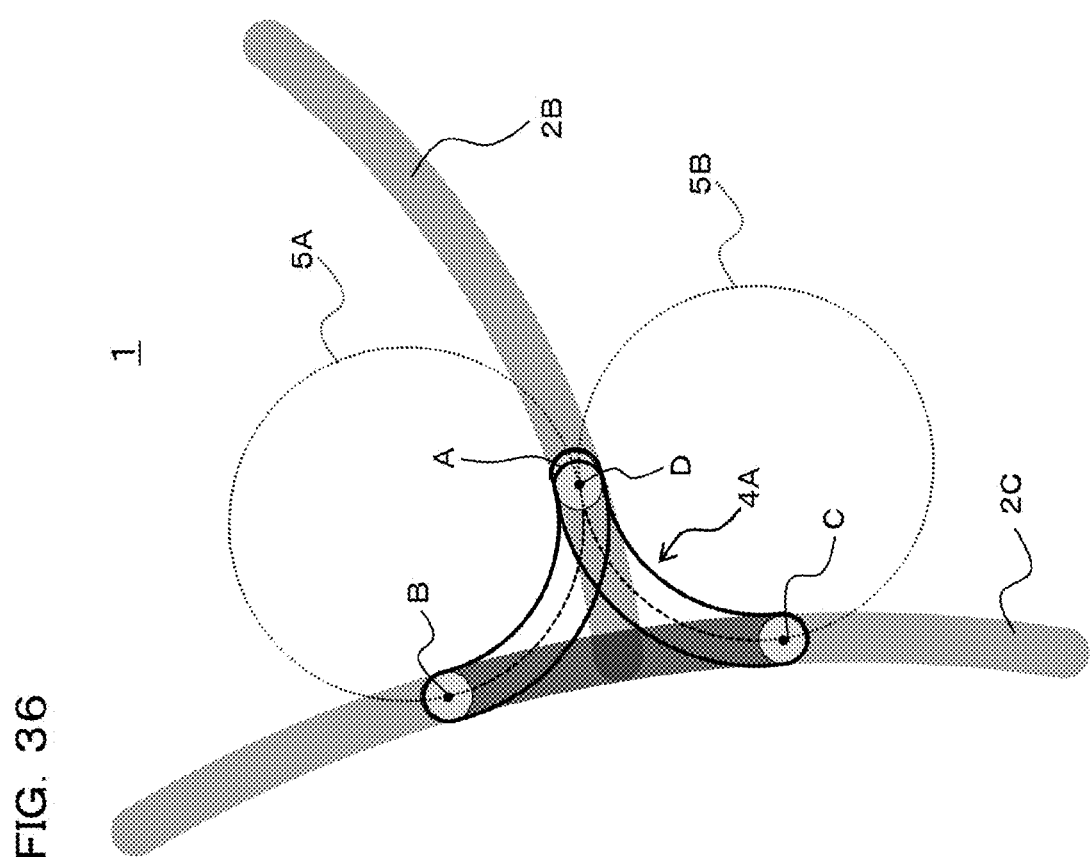

[3-5-2] Function of Generating an Arc Fillet at a T-Shape Connection Between Arc Lines:

FIGS. 35 and 36 denote the function (5) of generating an arc fillet 4A at a T-shape connection between the arc lines 2B and 2C by the fifth calculator 25 of the first embodiment. Hereinafter, like reference numbers designate the same or the substantially same elements and parts detailed above, so repetitious description is omitted here.

The fifth calculator 25 calculates and generates, as illustrated in FIG. 36, the region of the arc fillet 4A at the T-shape connection (see FIG. 35) between the arc lines 2B and 2C. First of all, the fifth calculator 25 calculates the first point A of contact and the second point B of contact on the fillet circle 5A having a radius R0 and being in contact with both the arc lines 2B and 2C. The first point A of contact is the point of contact between the center line of the arc line 2B and the fillet circle 5A while the second point B of contact is the point of contact between the center line of the arc line 2C and the fillet circle 5A.

Likewise, the fifth calculator 25 calculates the third point C of contact and the fourth point D of contact of the fillet circle 5B having a radius R0 and being in contact with both arc lines 2B and 2C at the opposite side of the fillet circle 5A. The third point C of contact is the point of contact between the center line of the arc line 2C and the fillet circle 5B while the fourth point D of contact is the point of contact between the center line of the arc line 2B and the fillet circle 5B.

Then the fifth calculator 25 calculates, as the arc fillet 4A, a region surrounded by the first arc AB, the second arc CD, the third arc DA, and the line segment BC, so that the arc fillet 4A can be generated at the connection between the arc lines 2B and 2C as illustrated in FIG. 36.

Figure 37:
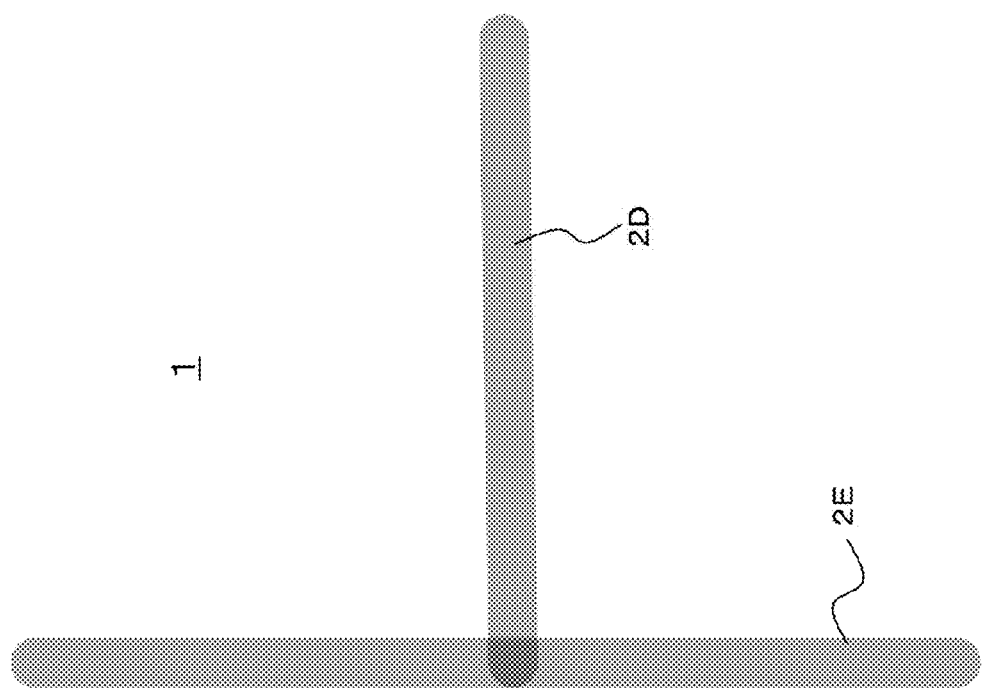
FIGS. 37 and 38 are diagrams illustrating a function of generating an arc fillet with respect to a T-shape connection between two straight lines by a fifth calculator of the first embodiment.
Figure 38:
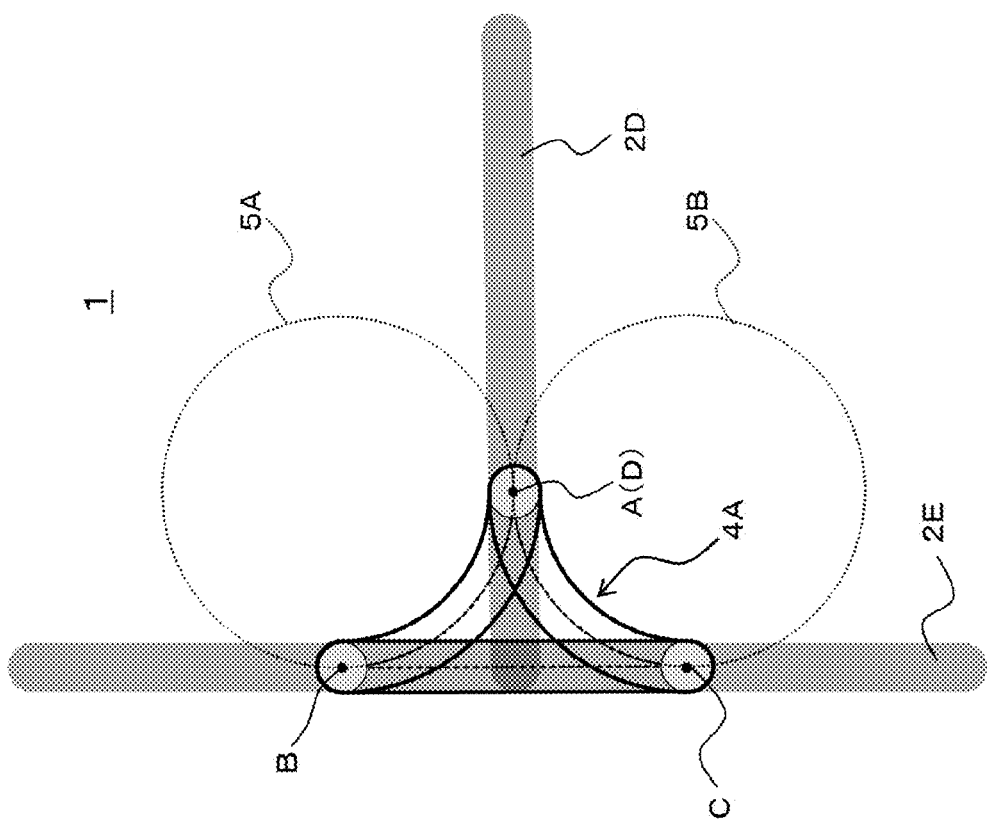

[3-5-3] Function of Generating an Arc Fillet at a T-Shape Connection Between Straight Lines:

FIGS. 37 and 38 denote the function (5) of generating an arc fillet 4A at a T-shape connection between the straight lines 2D and 2E by the fifth calculator 25 of the first embodiment. Hereinafter, like reference numbers designate the same or the substantially same elements and parts detailed above, so repetitious description is omitted here.

The fifth calculator 25 calculates and generates, as illustrated in FIG. 38, the region of the arc fillet 4A at the T-shape connection (see FIG. 37) between the straight lines 2D and 2E. First of all, the fifth calculator 25 calculates the first point A of contact and the second point B of contact on the fillet circle 5A having a radius R0 and being in contact with both the straight lines 2D and 2E. The first point A of contact is the point of contact between the center line of the straight line 2D and the fillet circle 5A while the second point B of contact is the point of contact between the center line of the straight line 2E and the fillet circle 5A.

Likewise, the fifth calculator 25 calculates the third point C of contact and the fourth point D of contact on the fillet circle 5B having a radius R0 and being in contact with both straight lines 2D and 2E at the opposite side from the fillet circle 5A. The third point C of contact is the point of contact between the center line of the straight line 2E and the fillet circle 5B while the fourth point D of contact is the point of contact between the center line of the straight line 2D and the fillet circle 5B. Since the shape of the arc fillet 4A is symmetrical with respect to the straight line 2D in this case, the point A coincides with the point D. Accordingly, FIG. 38 treats the point D of contact as the first point A of contact.

Then the fifth calculator 25 calculates, as the arc fillet 4A, a region surrounded by the first arc AB, the second arc CA, and the line segment BC, so that the arc fillet 4A can be generated also at the T-shape connection between the straight lines 2D and 2E as illustrated in FIG. 38.

[3-6] Function and Specific Process of the Sixth Calculator:

Next, description will now be made in relation to the function (6) of the sixth calculator 26 and the specific process by the sixth calculator 26 with reference to FIGS. 39-44. FIGS. 39-44 denote the function (6) of selecting a target obstacle by the sixth calculator 26 of the first embodiment. Hereinafter, like reference numbers designate the same or the substantially same elements and parts detailed above, so repetitious description is omitted here.

Figure 39:
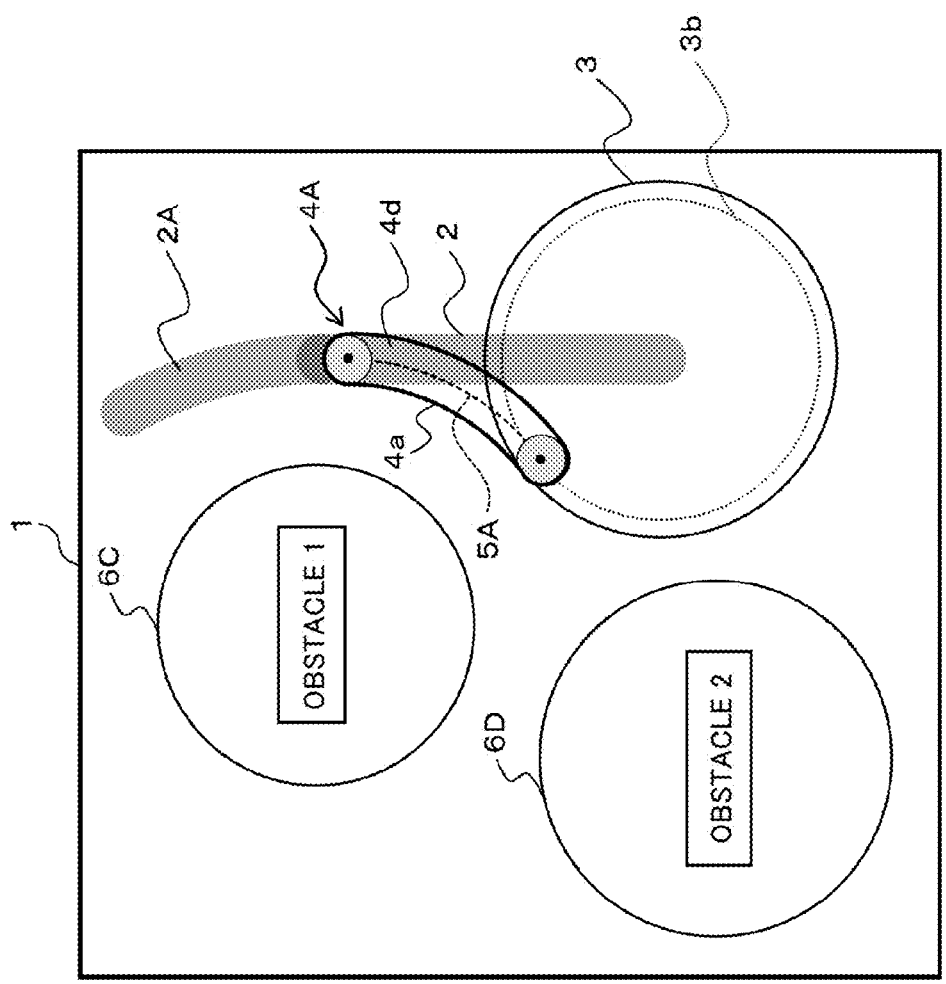
FIGS. 39-44 are diagrams illustrating a function of selecting a target obstacle by a sixth calculator of the first embodiment.

The function (6) of the sixth calculator 26 is a function of calculating and selecting, when multiple round lands are arranged as round obstacles in the vicinity of the connection between the round land 3 and the connecting lines 2, 2A in automatically adjusting by the second calculator 22, a target obstacle from the multiple round obstacles. Hereinafter, the steps 1-6 to achieve the function (6) of selecting will now be described with reference to an example of FIG. 39. In FIG. 39, two round obstacles (round land) 6C, 6D are arranged on the side of the arc side 4a of the arc fillet 4A generated at the connection between the round land 3 and the straight line 2. One of the round obstacles 6C and 6D is calculated and selected as a target obstacle to be used for adjusting the radius of the fillet circles 5A and 5B (see FIGS. 13-16 and 20-23) through the following steps 1-6. In the following description and the relevant drawings, the round obstacles 6C and 6D are sometimes referred to as an obstacle 1 and an obstacle 2, respectively.

Figure 40:
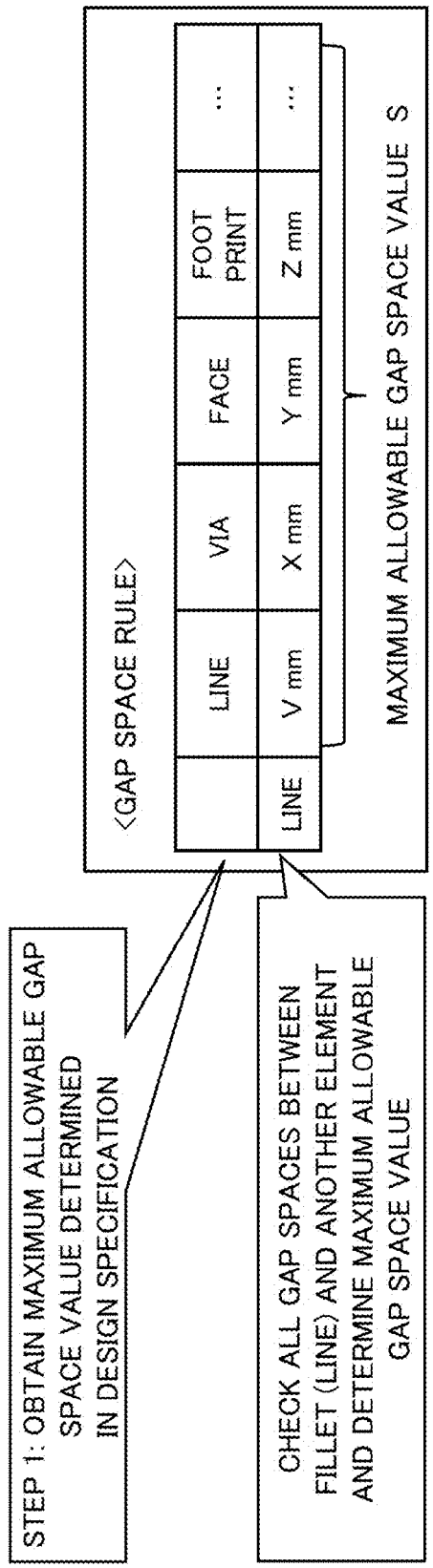

As illustrated in FIG. 40, the sixth calculator 26 firstly obtains the maximum allowable gap space S of the design specification by referring to the design data 11 (step 1). The sixth calculator 26 refers to a gap space rule of the design specification, checks all the gap space settings (allowable gap spaces) between a fillet 4A (line 2, 2A) and other elements, and obtains the maximum gap space S. The gap space rule of FIG. 40 sets V mm for the allowable gap space between a line (fillet) and a line; X mm for the allowable gap space between a line and a via (land); and Y mm for the allowable gap space between a line and a face; and Z mm for the allowable gap space between a line and a footprint. The sixth calculator 26 obtains the maximum value among these allowable gap spaces V, X, Y, and Z as the maximum allowable gap space S.

Figure 41:
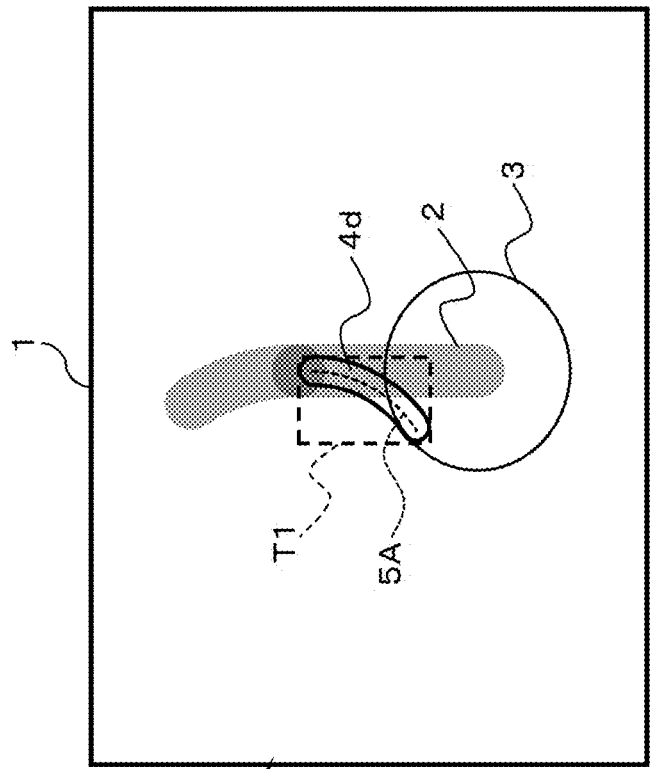

As illustrated in FIG. 41, the sixth calculator 26 obtains a rectangular T1 accommodating an arc line 4d (fillet arc line) being part of an arc fillet 4A (step 2). Here, the arc line 4d coincides with part of a fillet circle 5A, namely an arc having a center line coinciding with part of the fillet circle 5A. The arc line 4d is opposed to the obstacle 1 and the obstacle 2. Determination is made whether the arc line 4d satisfies the above predetermined gap space condition in combination with the obstacle 1 or the obstacle 2. In this example, one of the obstacle 1 and the obstacle 2 is selected as a target obstacle and determination is made as to whether the arc line 4d and the target obstacle satisfy the predetermined gap space condition as will be detailed below.

Figure 42:
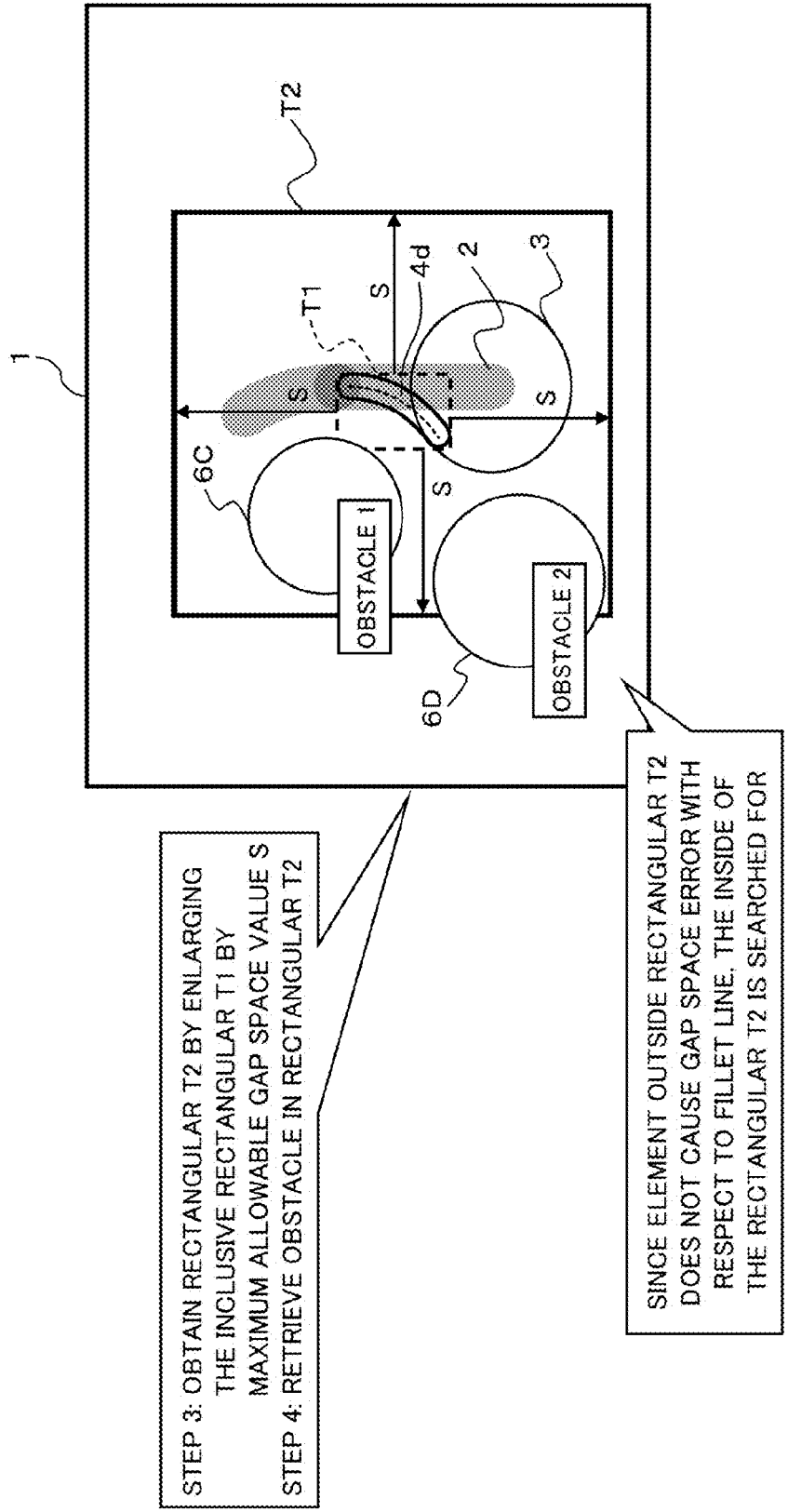

As illustrated in FIG. 42, the sixth calculator 26 further obtains a rectangular T2 obtained by enlarging the accommodating rectangular T1 obtained in step 2 by the maximum allowable gap space S obtained in step 1 (step 3). Then the sixth calculator 26 retrieves an obstacle within the rectangular T2 obtained in step 3 (step 4). In the example of FIG. 42, the obstacle 1 and the obstacle 2 are retrieved in step 4. Since the element outside the range of the rectangular T2 does not cause a gap space error with the fillet line 4d, an obstacle is retrieved in the rectangular T2.

Figure 43:
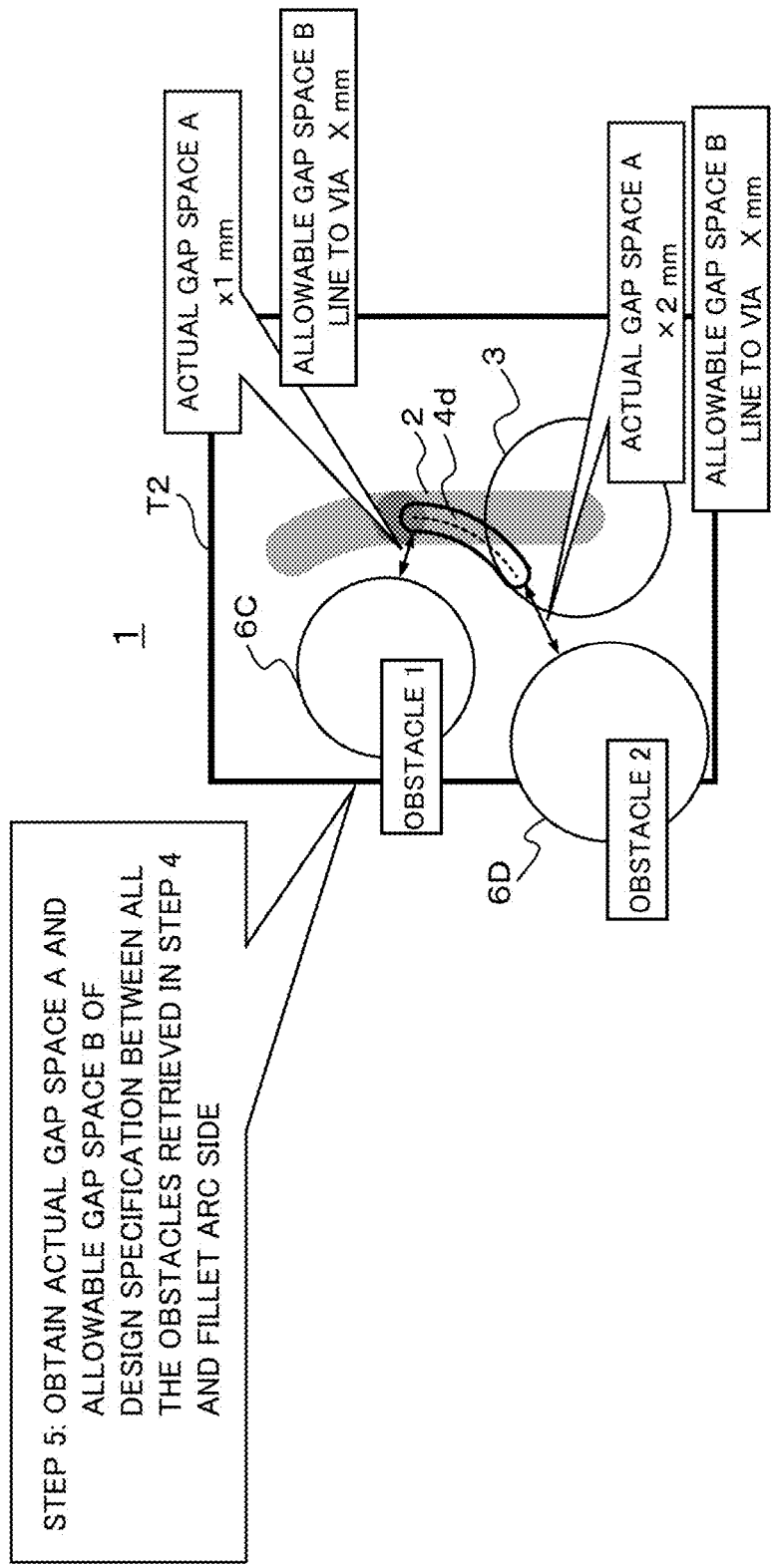

As illustrated in FIG. 43, the sixth calculator 26 obtains an actual gap space (A) between the fillet arc side 4d and each of the obstacles retrieved in step 4 and also allowable gap space (B) of the design specification between the fillet arc side 4d and each retrieved obstacle (step 5). In the example of FIG. 43, a value of x1 mm is obtained as the actual gap space (A) between the obstacle 1 and the fillet arc side 4d, and a value of X mm (see the gap space rule of FIG. 40) corresponding to the space between a line and a via is obtained as the allowable gap space (B) between the obstacle 1 and the fillet arc side 4d. Likewise, a value of x2 mm is obtained as the actual gap space (A) between the obstacle 2 and the fillet arc side 4d and a value of X mm (see the gap space rule of FIG. 40) corresponding to the space between a line and a via is obtained as the allowable gap space (B) between the obstacle 2 and the fillet arc side 4d.

Figure 44:
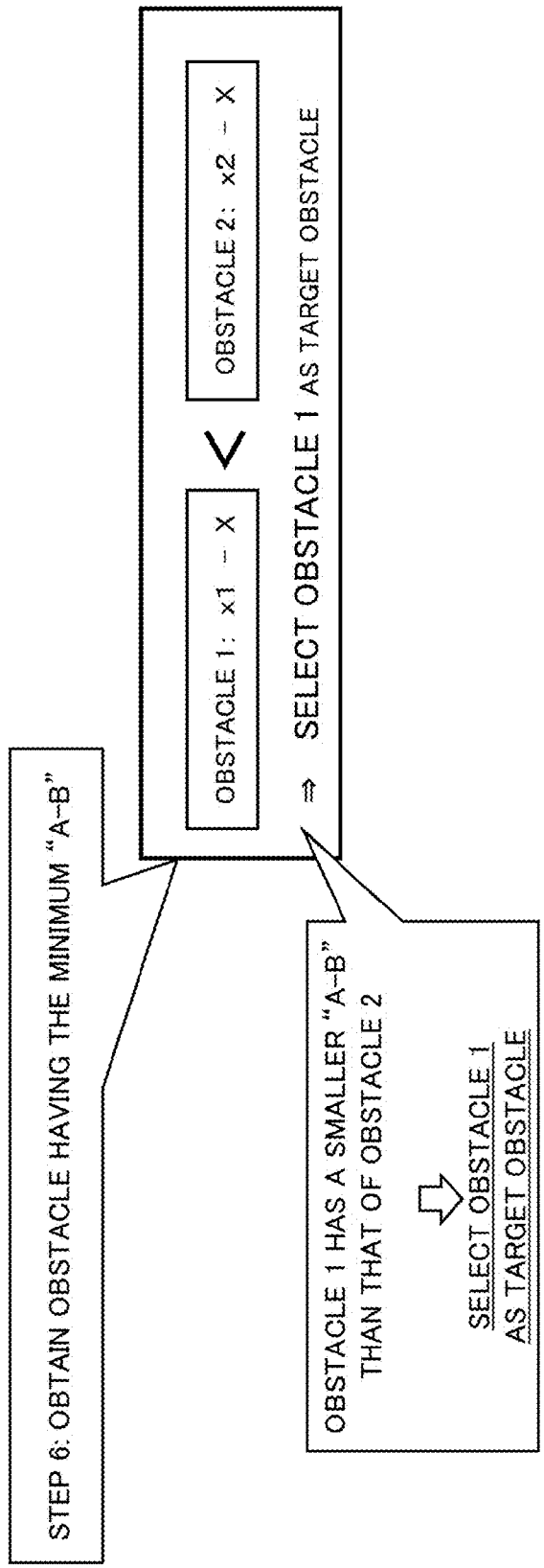

As illustrated in FIG. 44, the sixth calculator 26 calculates a difference "A-B" between the actual gap space (A) and the allowable gap space (B) obtained in step 5 for each obstacle retrieved in step 4 and selects an obstacle having the least difference "A-B" as a target obstacle (step 6). In the example of FIG. 44, the differences A-B=x1-X and A-B=x2-X are obtained for the obstacles 1 and 2, respectively. In this case, providing that the difference x1-X is smaller than the difference x2-X, the sixth calculator 26 selects the obstacle 1 as the target obstacle.

Thereby, even when a gap space error occurs between the arc fillet 4A and multiple obstacles, the obstacle that affects the gap space error the most is selected as the target obstacle.

Figure 45:
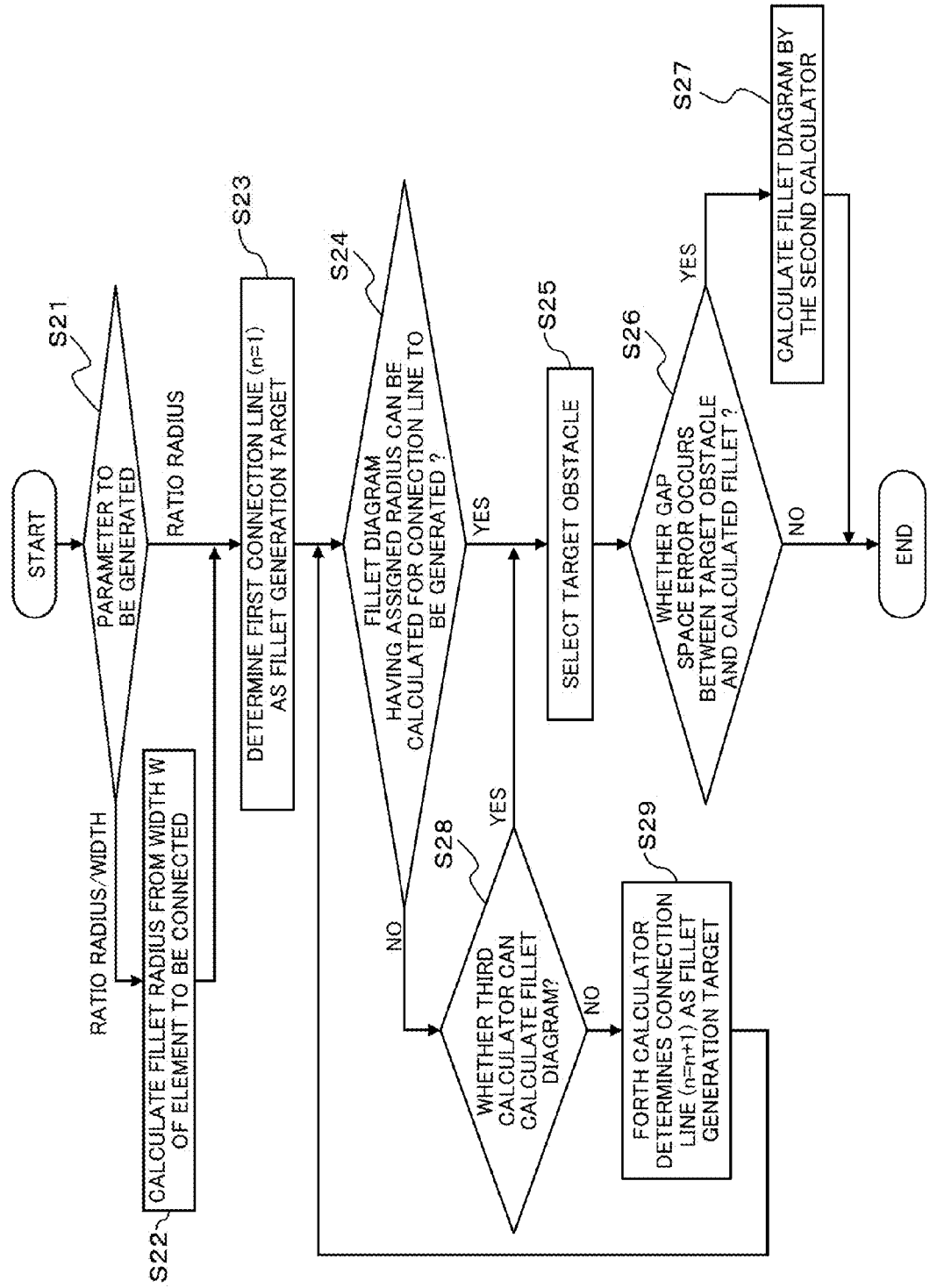
FIG. 45 is a diagram schematically illustrating an example of an entire process including generating an arc fillet, automatically adjusting an arc fillet, and selecting a target obstacles performed in an information processing apparatus of the first embodiment.
Figure 46:
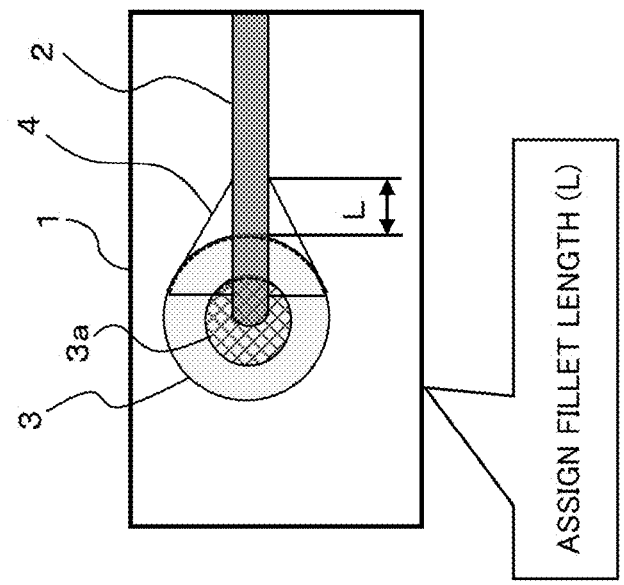
FIG. 46 is a diagram illustrating a first example of a shape of a fillet and a parameter to assign the shape.
Figure 47:
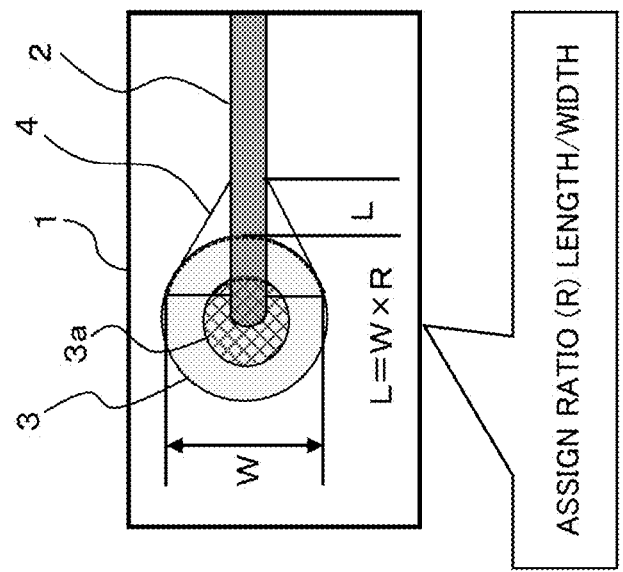
FIG. 47 is a diagram illustrating a second example of a shape of a fillet and a parameter to assign the shape.
Figure 48:
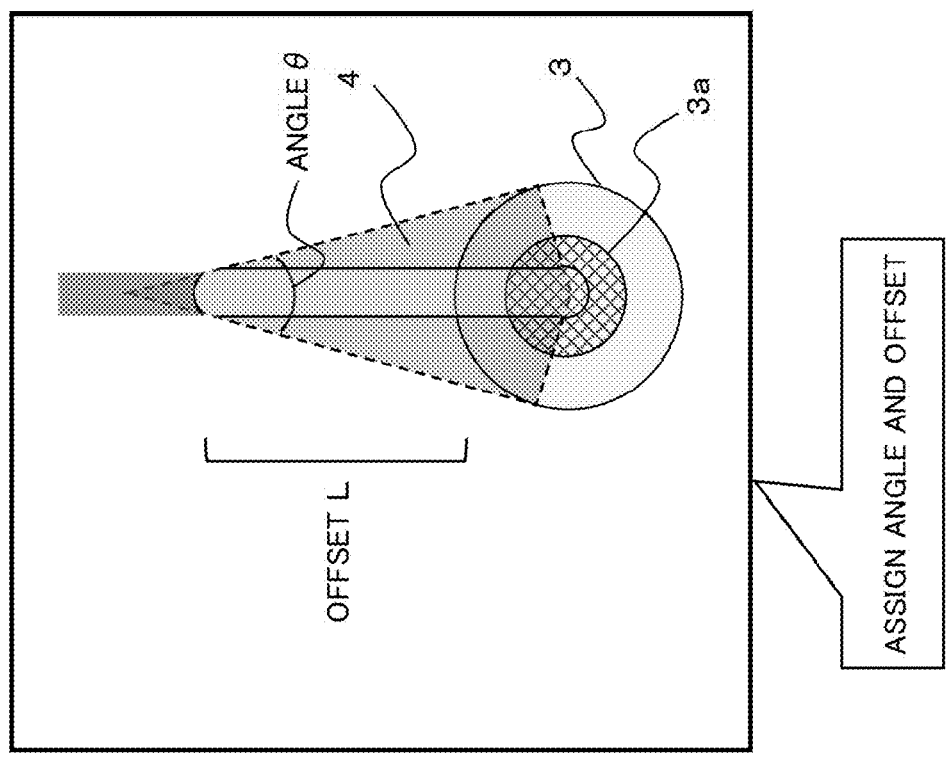
FIG. 48 is a diagram illustrating a third example of a shape of a fillet and a parameter to assign the shape.
Figure 49:
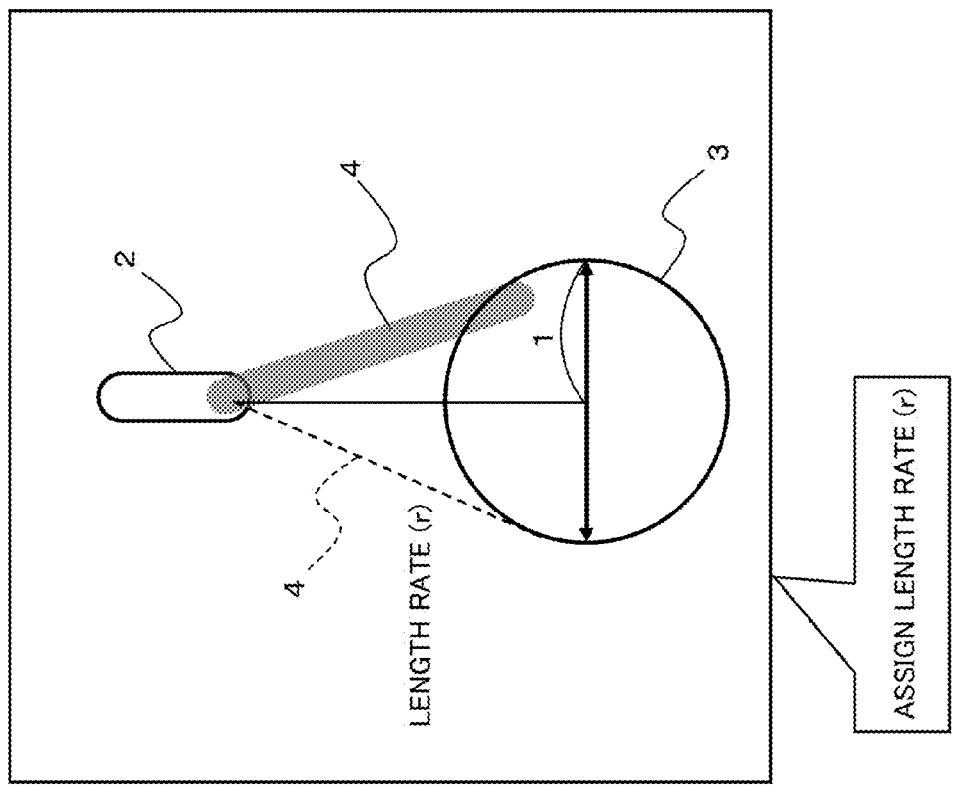
FIG. 49 is a diagram illustrating a fourth example of a shape of a fillet and a parameter to assign the shape.

[4] Example of the Entire Procedure of a Process Performed by the Information Processing Apparatus of the First Embodiment:

Next, description will now be schematically made in relation to an example of the entire procedure of the process performed by the information processing apparatus 100 (processor 20) of the first embodiment including: generating an arc fillet 4A; automatically adjusting the arc fillet 4A; and selecting a target obstacle with reference to the flow diagram of FIG. 45 (steps S21-S29).

In the start of processing, the processor 20 firstly determines a parameter to be generated (step S21). Specifically, the processor 20 checks which of radio button 41a or 41b is checked on the setting window 41. When the radio button 41a is checked to assign the value R0 of the radius ("radius" route in step S21), the value R0 of the radius is calculated as the radius (fillet radius) of the fillet circles 5A and 5B. In contrast, the radio button 41b is checked and thereby the value of the radius/width ratio R is set ("radius/width ratio" route in step S21), the value of the fillet radius R is calculated as R0=R×w (step S22).

After that, the processor 20 determines the connection line of n=1 (see the first line in FIG. 30) as a generation object of the arc fillet 4A (step S23). The processor 20 then determines whether the first calculator 21 can generate a region (diagram of the fillet) of the arc fillet 4A having the assigned radius R0 for the connection line of the generation object (step S24).

When the first calculator 21 can calculate the fillet diagram (YES route in step S24), the processor 20 causes the first calculator 21 to calculate a fillet diagram as described above with reference to FIGS. 4-8. After that, the processor 20 causes the sixth calculator 26 to select a target obstacle from multiple round obstacles in the manner described above with reference to FIGS. 39-44 (step S25). The processor 20 determines whether a gap space error occurs between the target obstacle selected by the sixth calculator 26 and the fillet calculated by the first calculator 21 (step S26).

In cases where a gap space error does not occur or a target obstacle is absent (i.e., not selected), step S26 makes a NO determination and the processor 20 ends the process. In contrast, in cases where a gap space error occurs (YES route in step S26), the processor 20 causes the second calculator 22 to carry out the automatic adjusting in the manner as described above by referring to FIGS. 9-23 to calculate the fillet diagram (step S27) and ends the process.

When the first calculator 21 fails to calculate a fillet diagram having an assigned radius R0 for the connecting line of the generation object (No route in step S24), the processor 20 determines whether the third calculator 23 can calculate the fillet diagram (step S28).

If the third calculator 23 also fails to calculate a fillet diagram (NO route of step S28), the processor 20 determines a (n=n+1)-th connecting line to be the generation object for the arc fillet 4A by the fourth calculator 24 (step S29) as detailed above by referring to FIGS. 29-32 and moves to step S24.

In contrast, when the third calculator 23 can calculate the fillet diagram (YES route of step S28), the processor 20 causes the third calculator 23 to calculate the fillet diagram in the manner described above by referring to FIGS. 24-28. Then the processor 20 moves to step S25.

[5] Effects of the Information Processing Apparatus of the First Embodiment:

The information processing apparatus 100 of the first embodiment can calculate the region of the arc fillet 4A at the connection between a round land 3 and a connecting line 2, 2A.

When the shape of a fillet is either bilaterally symmetrical or bilaterally asymmetrical with respect to the connecting line, an arc fillet 4A is successfully generated. For example, even when the connecting line connected to a round land 3 is a straight line 2 or an arc line 2A, the arc fillet 4A can be generated at the connection between the round land 3 and the connecting line. In particular, as illustrated in FIG. 5, the capability of generating an arc fillet 4A for an arc line 2A can largely improve the signal characteristic.

Further, as illustrated in FIGS. 12-23, even in cases where a round obstacle arranged in the vicinity of the connection causes, for example, a Design Rule Check (DRC) error, the parameters such as a fillet radius is automatically adjusted so as to deal with the round obstacle. This can ensure the insulation space s and automatically adjust the shape of the arc fillet 4A such that the DRC error or other inconvenience can be overcome.

Figure 50:
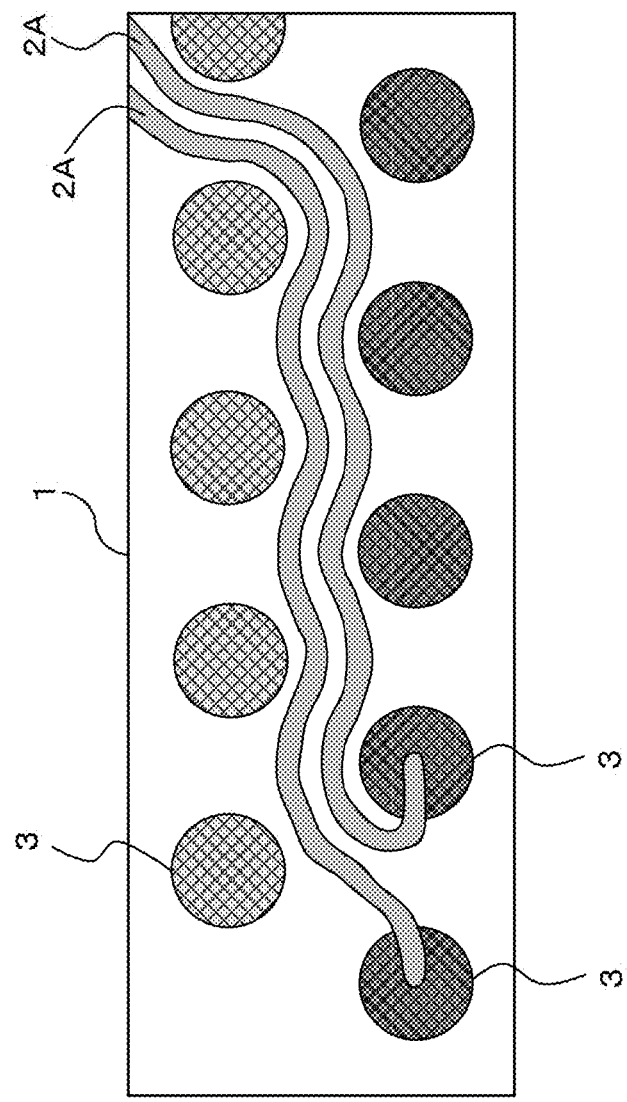
FIG. 50 is a diagram illustrating an example of connecting an arc line to a round land.
Figure 51:
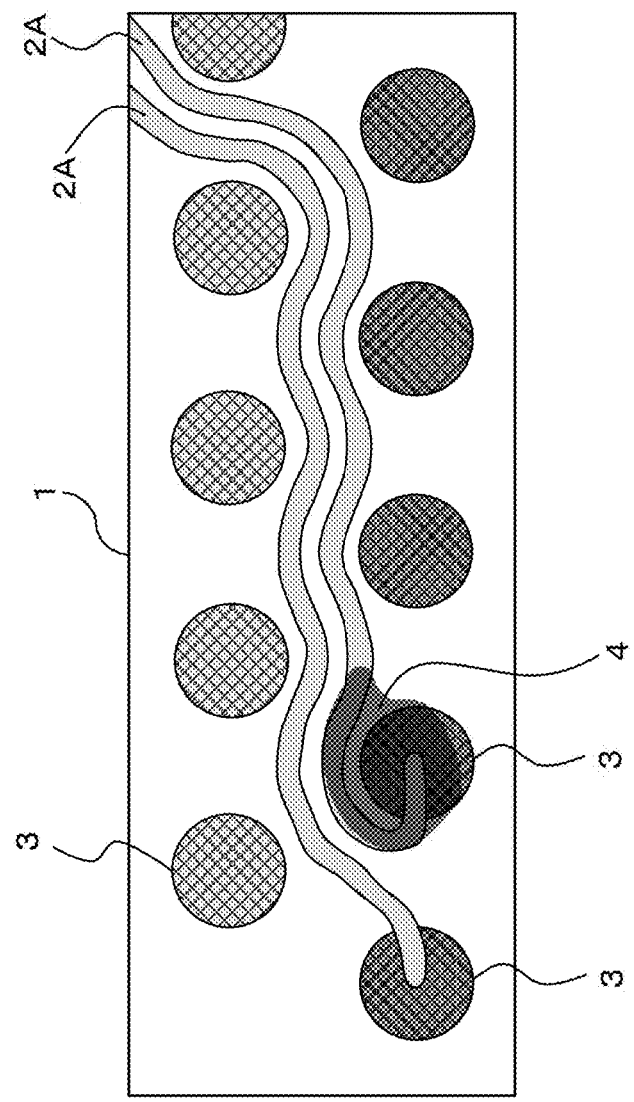
FIG. 51 is a diagram illustrating an example of forming a fillet at the connection between the round land and an arc line of FIG. 50.

As illustrated in FIGS. 25-28, even when the radius of an arc line 2A connected to a round land 3 is smaller than the fillet radius and therefore an arc fillet is not generated, and an arc fillet 4A can be generated, ensuring the allowable gap space s1 in the same net. This can generate an arc fillet 4A at the connection between the arc line 2A and a round land 3, avoiding excessively shortening the wiring length as illustrated in FIGS. 50 and 51, and advantageously a rapid signal transmission can be ensured to be avoided.

Further as illustrated in FIGS. 30 and 31, even when the first calculator 21 fails to calculate and generate the region of the arc fillet 4A because the first line connected to the round land 3 is short, the fourth calculator 24 successfully calculates and generates the region of the arc fillet 4A.

Under this state, an arc fillet 4A having the region from which the connecting line or a subsequent line thereof extrudes as illustrated in FIG. 32 is inhibited from being generated. Accordingly, an arc fillet 4A that would not contribute to the effects of preventing the via connecting conductor from peeling off is not adopted, so that the reliability of the connection can be prevented from lowering.

As illustrated in FIG. 33-38, an arc fillet 4A can be generated for a connection between a rectangular land 3A and an arc line 2A, a T-shaped connection between arc lines 2B and 2C, and a T-shaped connection between straight lines 2D and 2E. Accordingly, an arc fillet 4A can be automatically generated for various connections, so that the signal characteristic can be largely enhanced.

Furthermore, as illustrated in FIGS. 39-44, in cases where a gap space error occurs between multiple obstacles and an arc fillet 4A, an obstacle that affects the gap space error the most is selected as the target obstacle among the multiple obstacles. This makes it possible to automatically adjust the shape of the arc fillet 4A such that to resolve a DRC error or other inconvenience.

[6] Others:

A preferred embodiment of the present invention is described as the above. The present invention should by no means be limited to the first embodiment, and various changes and modifications can be suggested without departing from the spirit of the present invention.

The first embodiment assumes that the first radius of the first fillet circle 5A coincides with the second radius of the second fillet circle 5B, but the present invention is not limited to this. Alternatively, the first radius of the first fillet circle 5A may be set to a different value from that of the second radius of the second fillet circle 5B. This alternative can also obtain the same effects and advantages as those of the first embodiment.

As illustrated in, for example, FIGS. 3, 7, and 8, in connecting a straight line 2 to a round land 3, the straight line 2 is connected along the direction of the radius of the round land 3. With this arrangement, the shape of the arc fillet 4A at the connection including the straight line 2 is symmetrical with respect to the straight line 2 and therefore the point A coincides with the point D. However, the present invention is not limited to this. Alternatively, the straight line may be connected along a direction different from the radius direction of the round land 3.

In this alternative, the shape of the arc fillet 4A at the connection including the straight line 2 is asymmetrical with respect to the straight line 2, and therefore the point A does not coincide with the point D. Consequently, an arc fillet 4A defined in terms of four points A-D of contact is generated as illustrated in FIG. 5. Also this alternative can also obtain the same effects and advantages as those of the first embodiment.

Furthermore, part or the entire of the function of the information processing apparatus 100 of the first embodiment including the first to sixth calculator 21-26 is achieved by a computer (including a CPU, an information processing apparatus, and various terminals) executing a predetermined application program (design program).

The program is provided in the form of being stored in a computer-readable recording medium such as a flexible disk, a CD (e.g., CD-ROM, CD-R, CD-RW), a DVD (e.g., DVD-ROM, DVD-RAM, DVD-R, DVD-RW, DVD+R, and DVD+RW), and a Blu-ray disk. In this case, the computer reads the program from the recording medium and forwards and stores the read program to and into an internal or external storage device for storing future use.

According to the first embodiment, a region of the fillet at the connection between a round land and a connecting line can be calculated.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A non-transitory computer-readable recording medium having stored therein a design program for causing a computer to execute a process for generating an arc fillet at a connection between a round land and a connecting line to be connected to the round land, the process comprising:
    calculating a first point of contact between a center line of the connecting line and a first circle and a second point of contact between a offset circle of the round land and the first circle, the first circle having a first radius and being in contact with the round land and the connecting line;
    calculating a third point of contact between the offset circle of the round land and a second circle and a fourth point of contact between the center line of the connecting line and the second circle, the second circle having a second radius and being in contact with the round land and the connecting line at the opposite side of the first circle;
    calculating the arc fillet defined as a region surrounded by a first arc between the first point of contact and the second point of contact on the first circle, a second arc between the third point of contact and the fourth point of contact on the second circle, a third arc between the fourth point of contact and the first point of contact on the connecting line, and a line segment between the second point of contact and the third point of contact, the calculated arc fillet being formed on a print wiring board; and
    storing the calculated arc fillet to a memory.

2. The non-transitory computer-readable recording medium according to claim 1, wherein the process further comprising:
    calculating, when a gap space between the first arc and a round obstacle does not satisfy a gap space condition, a sum of a radius of the round obstacle, an allowable gap space value serving as the gap space condition, and the half the width of the connecting line;
    calculating an intersection of a line, being obtained by translating a center line of the connecting line by the sum towards the round obstacle, and a circle, having a radius of a total value of a radius of the round land and the sum and having a center at a center of the round land;
    calculating a corrected first point of contact between a third circle, having a center at the intersection and a radius of the sum, and the connecting line, and a corrected second point of contact between the round land and the third circle; and
    calculating the arc fillet using the corrected first point of contact and the corrected second point of contact in place of the first point of contact and the second point of contact.

3. The non-transitory computer-readable recording medium according to claim 2, wherein the process further comprising:
    selecting, when a plurality of the round obstacles are present, one round obstacle as target obstacle from the plurality of round obstacles; and
    calculating the sum using a radius of the selected target obstacle as the radius of the round obstacle.

4. The non-transitory computer-readable recording medium according to claim 1, wherein the process further comprising:
    when a radius of an arc line serving as the connecting line is smaller than the first radius or the second radius, so that the first point of contact and the second point of contact are not calculated or the third point of contact and the fourth point of contact are not calculated, calculating the first to the fourth points of contact and the arc fillet using a same net allowable gap space value predetermined for a net to which the round land and the connecting line pertain in place of the first radius or the second radius.

5. The non-transitory computer-readable recording medium according to claim 1, wherein the process further comprising:
    reading, when the length of the connecting line is too short to calculate the first point of contact and the second point of contact of the first circle or the third point of contact and the fourth point of contact of the second circle, a line connected to the connecting line in a unit of a single segment from the design information; and
    calculating the first to the fourth points of contact and the arc fillet using the read line.

6. The non-transitory computer-readable recording medium according to claim 5, wherein the process further comprising:
    when the read line and the connecting line partially protrude from the arcs that define the region of the arc fillet calculated using the read line, not adopting the arc fillet.

7. An information processing apparatus comprising:
a memory that stores design information; and
a processor that generates an arc fillet at a connection between a round land and a connecting line to be connected to the round land using the design information stored in the memory,
wherein the processor
calculates a first point of contact between a center line of the connecting line and a first circle and a second point of contact between a offset circle of the round land and the first circle, the first circle having a first radius and being in contact with the round land and the connecting line;
calculates a third point of contact between the offset circle of the round land and a second circle and a fourth point of contact between the center line of the connecting line and the second circle, the second circle having a second radius and being in contact with the round land and the connecting line at the opposite side of the first circle;
calculates the arc fillet defined as a region surrounded by a first arc between the first point of contact and the second point of contact on the first circle, a second arc between the third point of contact and the fourth point of contact on the second circle, a third arc between the fourth point of contact and the first point of contact on the connecting line, and a line segment between the second point of contact and the third point of contact, the calculated arc fillet being formed on a print wiring board; and
stores the calculated arc fillet to the memory.

8. The information processing apparatus according to claim 7, wherein the processor
calculates, when a gap space between the first arc and a round obstacle does not satisfy a gap space condition, a sum of a radius of the round obstacle, an allowable gap space value serving as the gap space condition, and the half the width of the connecting line;
calculates an intersection of a line, being obtained by translating a center line of the connecting line by the sum towards the round obstacle, and a circle, having a radius of a total value of a radius of the round land and the sum and having a center at a center of the round land;
calculates a corrected first point of contact between a third circle, having a center at the intersection and a radius of the sum, and the connecting line, and a corrected second point of contact between the round land and the third circle; and
calculates the arc fillet using the corrected first point of contact and the corrected second point of contact in place of the first point of contact and the second point of contact.

9. The information processing apparatus according to claim 8, wherein the processor
selects, when a plurality of the round obstacles are present, one round obstacle as target obstacle from the plurality of round obstacles; and
calculates the sum using a radius of the selected target obstacle as the radius of the round obstacle.

10. The information processing apparatus according to claim 7, wherein, when a radius of an arc line serving as the connecting line is smaller than the first radius or the second radius, so that the first point of contact and the second point of contact are not calculated or the third point of contact and the fourth point of contact are not calculated, the processor calculates the first to the fourth points of contact and the arc fillet using a same net allowable gap space value predetermined for a net to which the round land and the connecting line pertain in place of the first radius or the second radius.

11. The information processing apparatus according to claim 7, wherein the processor
reads, when the length of the connecting line is too short to calculate the first point of contact and the second point of contact of the first circle or the third point of contact and the fourth point of contact of the second circle, a line connected to the connecting line in a unit of a single segment from the design information; and
calculates the first to the fourth points of contact and the arc fillet using the read line.

12. The information processing apparatus according to claim 11, wherein when the read line and the connecting line partially protrude from the arcs that define the region of the arc fillet calculated using the read line, the processor does not adopt the arc fillet.

13. A computer-implemented method for designing in a computer that generates an arc fillet at a connection between a round land and a connecting line to be connected to the round land, the method comprising:
calculating a first point of contact between a center line of the connecting line and a first circle and a second point of contact between a offset circle of the round land and the first circle, the first circle having a first radius and being in contact with the round land and the connecting line;
calculating a third point of contact between the offset circle of the round land and a second circle and a fourth point of contact between the center line of the connecting line and the second circle, the second circle having a second radius and being in contact with the round land and the connecting line at the opposite side of the first circle;
calculating the arc fillet defined as a region surrounded by a first arc between the first point of contact and the second point of contact on the first circle, a second arc between the third point of contact and the fourth point of contact on the second circle, a third arc between the fourth point of contact and the first point of contact on the connecting line, and a line segment between the second point of contact and the third point of contact, the calculated arc fillet being formed on a print wiring board; and
storing the calculated arc fillet to a memory.

14. The computer-implemented method according to claim 13, further comprising:
calculating, when a gap space between the first arc and a round obstacle does not satisfy a gap space condition, a sum of a radius of the round obstacle, an allowable gap space value serving as the gap space condition, and the half the width of the connecting line;
calculating an intersection of a line, being obtained by translating a center line of the connecting line by the sum towards the round obstacle, and a circle, having a radius of a total value of a radius of the round land and the sum and having a center at a center of the round land;
calculating a corrected first point of contact between a third circle, having a center at the intersection and a radius of the sum, and the connecting line, and a corrected second point of contact between the round land and the third circle; and
calculating the arc fillet using the corrected first point of contact and the corrected second point of contact in place of the first point of contact and the second point of contact.

15. The computer-implemented method according to claim 14, further comprising:
- selecting, when a plurality of the round obstacles are present, one round obstacle as target obstacle from the plurality of round obstacles; and
- calculating the sum using a radius of the selected target obstacle as the radius of the round obstacle.

16. The computer-implemented method according to claim 13, further comprising:
- when a radius of an arc line serving as the connecting line is smaller than the first radius or the second radius, so that the first point of contact and the second point of contact are not calculated or the third point of contact and the fourth point of contact are not calculated, calculating the first to the fourth points of contact and the arc fillet using a same net allowable gap space value predetermined for a net to which the round land and the connecting line pertain in place of the first radius or the second radius.

17. The computer-implemented method according to claim 13, further comprising:
- reading, when the length of the connecting line is too short to calculate the first point of contact and the second point of contact of the first circle or the third point of contact and the fourth point of contact of the second circle, a line connected to the connecting line in a unit of a single segment from the design information; and
- calculating the first to the fourth points of contact and the arc fillet using the read line.

18. The computer-implemented method according to claim 17, further comprising:
- when the read line and the connecting line partially protrude from the arcs that define the region of the arc fillet calculated using the read line, not adopting the arc fillet.

* * * * *